(12) United States Patent
Hatakeyama et al.

(10) Patent No.: US 8,828,641 B2
(45) Date of Patent: Sep. 9, 2014

(54) CHEMICALLY AMPLIFIED RESIST COMPOSITION AND PATTERNING PROCESS

(75) Inventors: Jun Hatakeyama, Joetsu (JP); Takeru Watanabe, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 591 days.

(21) Appl. No.: 12/957,785

(22) Filed: Dec. 1, 2010

(65) Prior Publication Data
US 2011/0129777 A1 Jun. 2, 2011

(30) Foreign Application Priority Data
Dec. 2, 2009 (JP) ................... 2009-274162

(51) Int. Cl.
G03F 7/004 (2006.01)
G03F 7/039 (2006.01)
G03F 7/26 (2006.01)
G03F 7/038 (2006.01)

(52) U.S. Cl.
CPC ............ *G03F 7/0045* (2013.01); *G03F 7/0392* (2013.01); *G03F 7/0382* (2013.01); *G03F 7/0397* (2013.01)
USPC ........................................ 430/270.1; 430/326

(58) Field of Classification Search
USPC ............................. 430/270.1, 325, 281.1, 326
See application file for complete search history.

(56) References Cited

U.S. PATENT DOCUMENTS

| | | | |
|---|---|---|---|
| 5,491,054 A | 2/1996 | Jain et al. | |
| 5,494,777 A * | 2/1996 | Shiraki et al. | 430/270.1 |
| 6,448,420 B1 | 9/2002 | Kinsho et al. | |
| 6,476,092 B1 * | 11/2002 | Kunita | 522/31 |
| 6,743,564 B2 | 6/2004 | Hatakeyama et al. | |
| 6,749,988 B2 | 6/2004 | Hatakeyama et al. | |
| 6,916,593 B2 | 7/2005 | Hatakeyama et al. | |
| 7,482,108 B2 | 1/2009 | Matsumaru et al. | |
| 7,537,880 B2 | 5/2009 | Harada et al. | |
| 7,598,016 B2 | 10/2009 | Kobayashi et al. | |
| 2008/0076044 A1 * | 3/2008 | Mizukawa et al. | 430/7 |
| 2008/0090172 A1 | 4/2008 | Hatakeyama et al. | |
| 2008/0153030 A1 | 6/2008 | Kobayashi et al. | |
| 2009/0251643 A1 * | 10/2009 | Yamada et al. | 349/96 |
| 2009/0274978 A1 * | 11/2009 | Ohashi et al. | 430/285.1 |

FOREIGN PATENT DOCUMENTS

| | | |
|---|---|---|
| EP | 0473547 A1 | 3/1992 |
| JP | 4-230645 A | 8/1992 |
| JP | 8-234387 A | 9/1996 |
| JP | 2000-327633 A | 11/2000 |
| JP | 2001-194776 A | 7/2001 |
| JP | 2002-226470 A | 8/2002 |
| JP | 2002-249478 A | 9/2002 |
| JP | 2002-363146 A | 12/2002 |
| JP | 2002-363148 A | 12/2002 |
| JP | 2002-363152 A | 12/2002 |
| JP | 2004-139050 * | 5/2004 |
| JP | 2005-084365 A | 3/2005 |
| JP | 2006-045311 A | 2/2006 |
| JP | 2006-178317 A | 7/2006 |
| JP | 2008-111103 A | 5/2008 |
| JP | 2008-122932 A | 5/2008 |
| JP | 2008-158339 A | 7/2008 |
| JP | 2008-239918 A | 10/2008 |
| JP | 2008-249951 A | 10/2008 |

OTHER PUBLICATIONS

Machine translation of JP 2004-139050, published on May 13, 2004.*
Hinsberg, William et al. "Extendibility of Chemically Amplified Resists: Another Brick Wall?" Advances in Resist Technology and Processing XX, Proceedings of SPIE, 2003, vol. 5039, pp. 1-14.
Kishikawa, Yasuhiro et al. "Assessment of trade-off between resist resolution and sensitivity for optimization of hyper-NA immersion lithography," Optical Microlithography XX, Proc of SPIE, 2007, vol. 6520, pp. 1-9.

* cited by examiner

*Primary Examiner* — Anca Eoff
(74) *Attorney, Agent, or Firm* — Westerman, Hattori, Daniels & Adrian, LLP

(57) ABSTRACT

A chemically amplified resist composition comprising a base polymer, an acid generator, and a basic compound of thiomorpholine dioxide structure has many advantages including a high contrast of alkaline dissolution rate before and after exposure, a good pattern profile after exposure, minimized roughness, and a wide focus margin. The resist composition which may be positive or negative is useful for the fabrication of VLSI and photomasks.

6 Claims, No Drawings

CHEMICALLY AMPLIFIED RESIST COMPOSITION AND PATTERNING PROCESS

CROSS-REFERENCE TO RELATED APPLICATION

This non-provisional application claims priority under 35 U.S.C. §119(a) on Patent Application No. 2009-274162 filed in Japan on Dec. 2, 2009, the entire contents of which are hereby incorporated by reference.

TECHNICAL FIELD

This invention relates to a chemically amplified resist composition comprising a specific basic compound, and more particularly, to a chemically amplified positive or negative resist composition suited for use in the photolithography with KrF excimer laser, ArF excimer laser, EB or EUV radiation, and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the future generation 32-nm node include ultra-high NA lens immersion lithography using a liquid having a higher refractive index than water in combination with a high refractive index lens and a high refractive index resist film, EUV lithography of 13.5 nm wavelength, and double patterning version of the ArF lithography, on which active research efforts have been made.

With respect to high-energy radiation of very short wavelength such as EB or x-ray, hydrocarbons and similar light elements used in resist materials have little absorption. Then polyhydroxystyrene base resist materials are under consideration. Resist materials for EB lithography are practically used in the mask image writing application. Recently, the mask manufacturing technology becomes of greater interest. Reduction projection exposure systems or steppers have been used since the time when the exposure light was g-line. While their demagnification factor was 1/5, a factor of 1/4 is now used as a result of chip size enlargement and projection lens diameter increase. It becomes of concern that a dimensional error of a mask has an impact on the dimensional variation of a pattern on wafer. It is pointed out that as the pattern feature is reduced, the value of a dimensional variation on the wafer becomes greater than the value of a dimensional error of the mask. This is evaluated by a mask error enhancement factor (MEEF) which is a dimensional variation on wafer divided by a dimensional error of mask. Patterns on the order of 45 nm often show an MEEF in excess of 4. In a situation including a demagnification factor of 1/4 and a MEEF of 4, the mask manufacture needs an accuracy substantially equivalent to that for equi-magnification masks.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 keV to 30 keV and reached 50 keV in the current mainstream system, with a voltage of 100 keV being under investigation.

Chemically amplified resist compositions comprising an acid generator capable of generating an acid upon exposure to light or EB include chemically amplified positive resist compositions wherein deprotection reaction takes place under the action of acid and chemically amplified negative resist compositions wherein crosslinking reaction takes place under the action of acid. Quenchers are often added to these resist compositions for the purpose of controlling the diffusion of the acid to unexposed areas to improve the contrast. The addition effect of quenchers is significant. A number of amine quenchers were proposed as disclosed in Patent Documents 1 to 6.

Since EUV and EB exposure is carried out in vacuum, a phenomenon arises that the sensitivity increases during the exposure step due to evaporation of quenchers. It would be desirable to have quenchers which are unlikely to evaporate. In general, the boiling point of a substance is increased by introducing a sulfone group. For example, in contrast with acetone having a boiling point of 56° C., dimethyl sulfoxide (DMSO) has a boiling point of 189° C. and is unlikely to evaporate.

Patent Document 7 describes a silver halide photosensitive composition comprising a thiomorpholine dioxide compound having an alkoxy-substituted aryl group on the ring nitrogen. A silver halide photosensitive composition comprising a 2-equivalent pyrazolone magenta coupler, the thiomorpholine dioxide compound, an alkoxyaniline compound, and a hydroquinone compound has advantages of low thermal discoloration and enhanced color reproduction.

CITATION LIST

Patent Document 1: JP-A 2001-194776
Patent Document 2: JP-A 2002-226470
Patent Document 3: JP-A 2002-249478
Patent Document 4: JP-A 2002-363146
Patent Document 5: JP-A 2002-363148
Patent Document 6: JP-A 2002-363152
Patent Document 7: U.S. Pat. No. 5,491,054 (JP-A H08-234387)
Non-Patent Document 1: SPIE Vol. 5039 µl (2003)
Non-Patent Document 2: SPIE Vol. 6520 p65203L-1 (2007)

DISCLOSURE OF INVENTION

An object of the invention is to provide a positive or negative resist composition, typically a chemically amplified positive or negative resist composition, which has a high resolution surpassing prior art positive resist compositions, is well adapted for the lithographic process, and forms a pattern with high rectangularity and minimized roughness (LWR or LER) after exposure; and a pattern forming process using the same.

Seeking for the currently demanded high-resolution resist, the inventors have found that a chemically amplified positive or negative resist composition comprising an amine quencher of thiomorpholine structure and an acid generator forms a pattern at a high contrast, resolution and rectangularity after development while it obviates evaporation in vacuum. The composition is thus best suited for EB and EUV lithography.

Quite unexpectedly from Patent Document 7, the inventors have found that when a thiomorpholine dioxide compound is added to a chemically amplified resist composition comprising an acid generator, it effectively functions to control the diffusion of the acid in the resist film and to enhance the contrast. The invention is predicated on this finding.

The chemically amplified positive or negative resist composition has many advantages including a high dissolution contrast of resist film, a high resolution, exposure latitude, process adaptability, a good pattern profile after exposure, minimized roughness (LWR or LER), and dimensional stability in vacuum. Owing to these advantages, the composition is readily applicable in the industry and very useful as the VLSI-forming resist material and mask pattern-forming material.

In one aspect, the invention provides a chemically amplified resist composition comprising a base polymer, an acid generator, and a basic compound of the general formula (1).

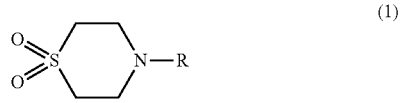
(1)

Herein R is hydrogen, or a straight, branched or cyclic $C_1$-$C_{30}$ alkyl, $C_6$-$C_{30}$ aryl, $C_2$-$C_{30}$ alkenyl or $C_2$-$C_{10}$ alkynyl group, which may have a hydroxyl, carboxyl, ether, thioether, ester, sulfonic acid ester, lactone, carbonyl, amino, cyano, nitro or halogen radical, or R is a $C_1$-$C_8$ alkoxycarbonyl group.

In one embodiment wherein the resist composition is positive, the composition may further comprise an organic solvent and preferably a dissolution inhibitor. In another embodiment wherein the resist composition is negative, the composition may further comprise an organic solvent and preferably a crosslinker. In either embodiment, the resist composition may further comprise a surfactant.

In another aspect, the invention provides a process for forming a pattern comprising the steps of applying the resist composition defined above onto a substrate to form a resist coating, baking the coating, exposing the coating to high-energy radiation, and developing the exposed coating with a developer. Typically, the high-energy radiation is ArF excimer laser radiation of 193 nm wavelength, KrF excimer laser radiation of 248 nm wavelength, electron beam, or extreme ultraviolet radiation of 3 to 15 nm wavelength.

The chemically amplified positive or negative resist compositions are used not only in the lithography for semiconductor circuit formation, but also in the formation of mask circuit patterns, micro-machines, and thin-film magnetic head circuits.

ADVANTAGEOUS EFFECTS OF INVENTION

The resist compositions have many advantages including a high contrast of alkaline dissolution rate before and after exposure, a good pattern profile after exposure, minimized roughness, and a wide focus margin (DOF). There are provided chemically amplified positive or negative resist compositions which are very useful as the fine pattern-forming resist material for the fabrication of VLSI and photomasks, and the pattern-forming resist material in the KrF excimer laser, ArF excimer laser, EB and EUV lithography.

DESCRIPTION OF EMBODIMENTS

As used herein, the singular forms "a," "an" and "the" include plural referents unless the context clearly dictates otherwise. The terminology "$C_x$-$C_y$", as applied to a particular unit, such as, for example, a chemical compound or a chemical substituent group, means having a carbon atom content of from "x" carbon atoms to "y" carbon atoms per such unit. The abbreviation EB stands for electron beam, EUV for extreme ultraviolet, LWR for line width roughness, LER for line edge roughness, and DOF for depth of focus.

The basic compound used herein is an amine compound having thiomorpholine, represented by the general formula (1).

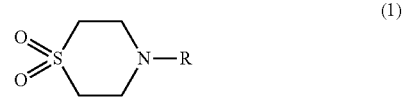
(1)

Herein R is hydrogen, or a straight, branched or cyclic $C_1$-$C_{30}$, preferably $C_2$-$C_{30}$ alkyl group, $C_6$-$C_{30}$ aryl group, $C_2$-$C_{30}$ alkenyl group or $C_2$-$C_{10}$ alkynyl group. Preferably group R has a hydroxyl radical (—OH), carboxyl radical (—COOH), ether radical (—O—), thioether radical (—S—), ester radical (—COO—), sulfonic acid ester radical (—SO$_2$OR'), lactone ring of the formula:

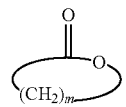

wherein m is an integer of 2 to 7, carbonyl radical (—CO—), amino radical (—NH$_2$), cyano radical (—CN), nitro radical (—NO$_2$) or halogen atom (-Hal). Alternatively, R is a $C_1$-$C_8$ alkoxycarbonyl group.

Since the thiomorpholine dioxide compounds have a very high boiling point and do not evaporate in vacuum of the EB and EUV exposure environment, any variation of sensitivity during vacuum holding can be minimized. Since the dioxide moiety is highly hydrophilic, it has an enhanced ability to trap a hydrophilic acid and hence to control acid diffusion. In the prior art, the resist film in unexposed areas is thinned or slimmed under the action of some acid generated in the unexposed areas whereby the line pattern of the resist film as developed takes a thinned profile with a rounded top. By contrast, the addition of the specific basic compound controls thinning of the patterned resist film and expands the focal margin because the acid generated in unexposed areas is efficiently trapped.

Examples of the compound having formula (1) are given below, but not limited thereto.

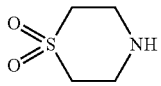  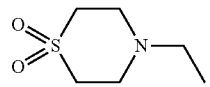 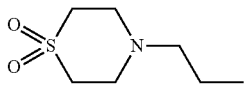 

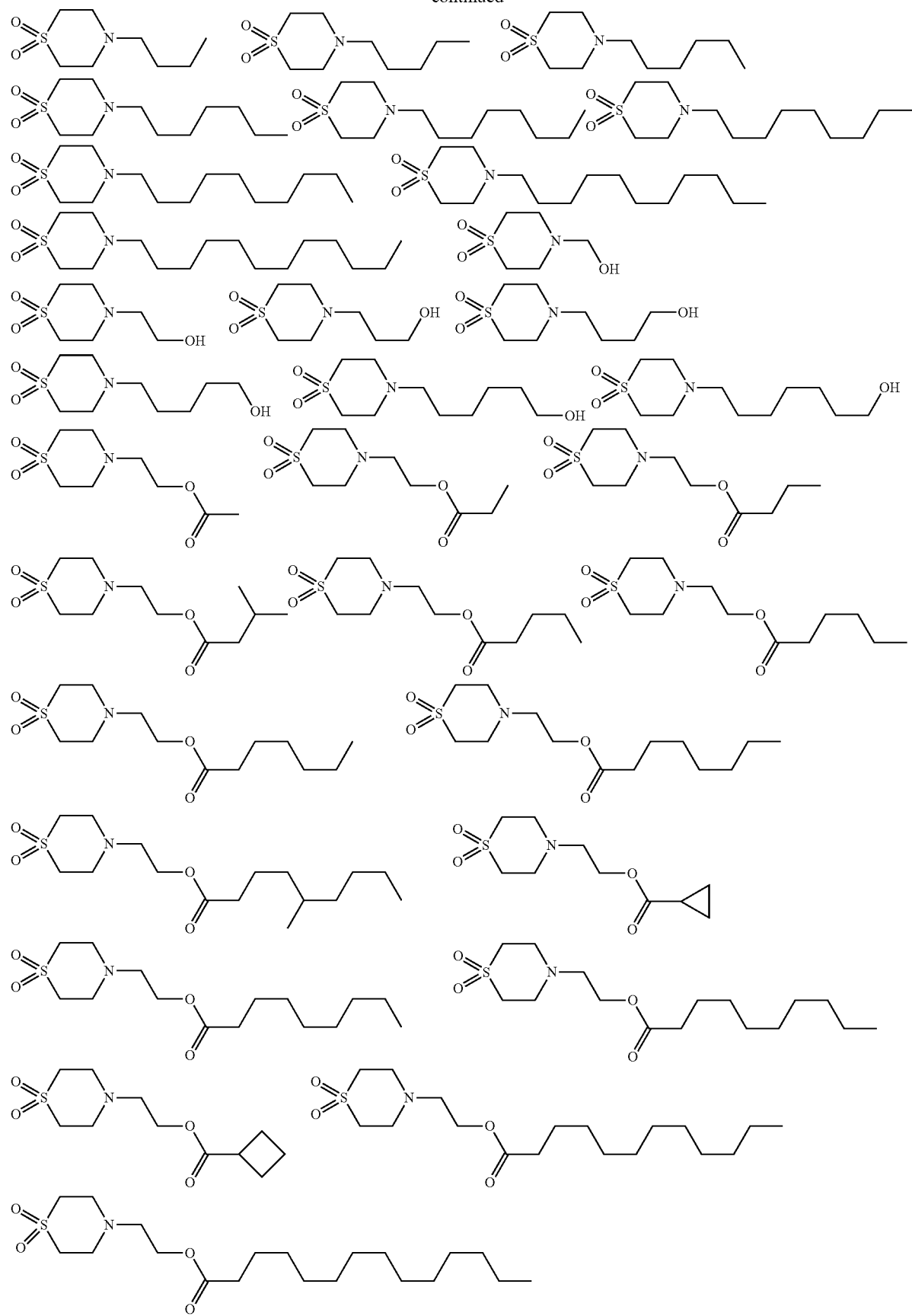

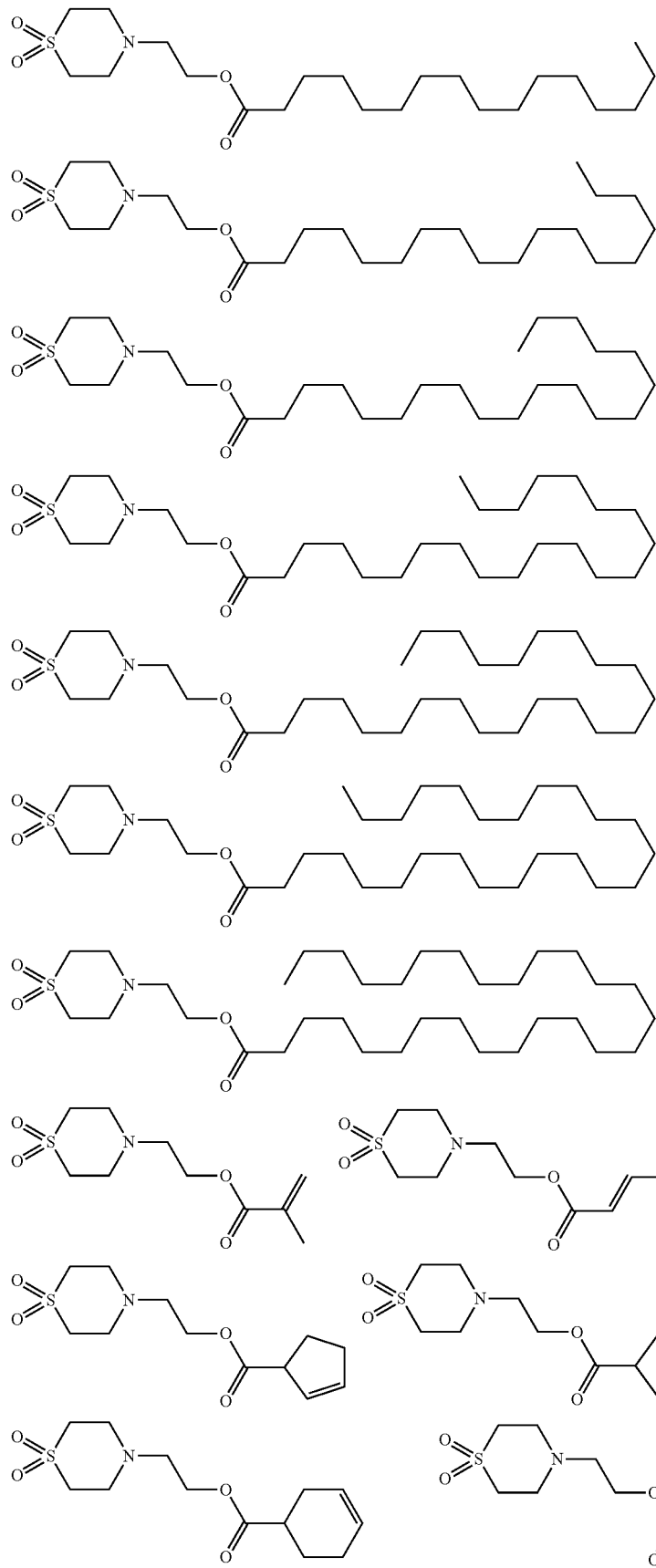

-continued
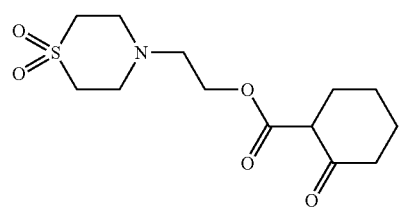
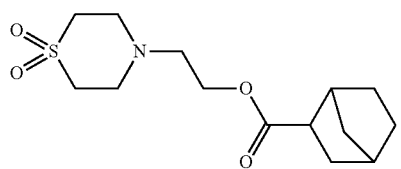
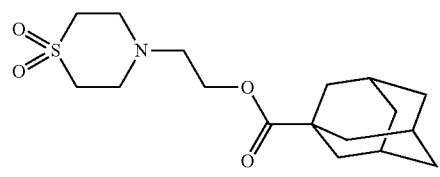
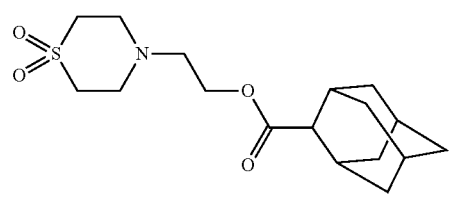
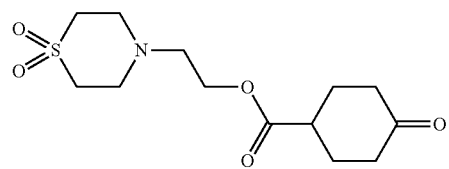
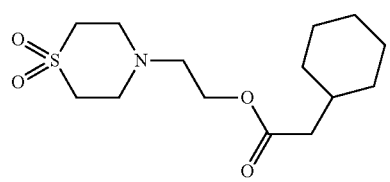
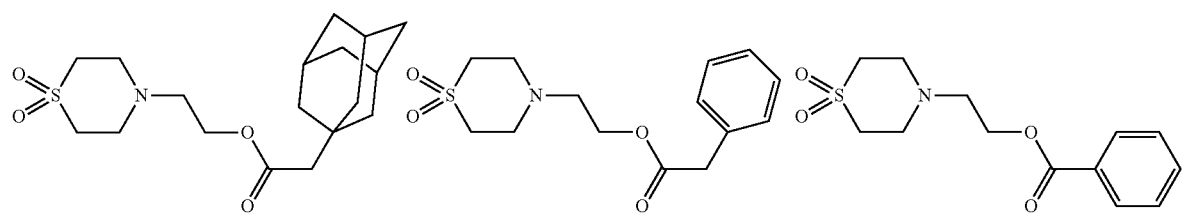
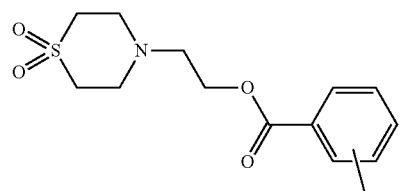
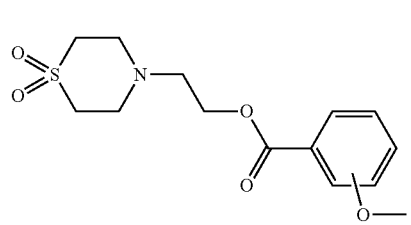
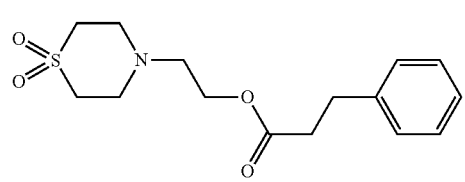
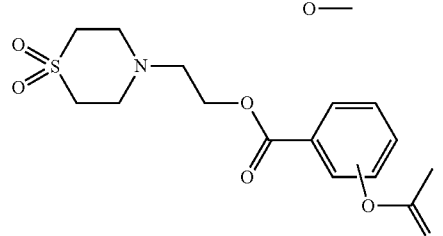
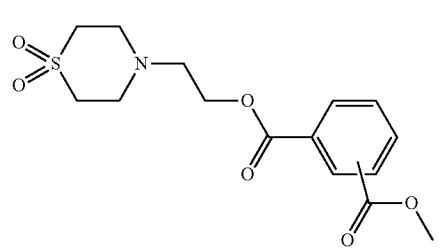
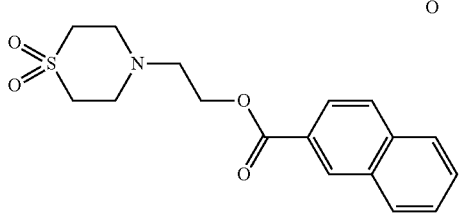

-continued
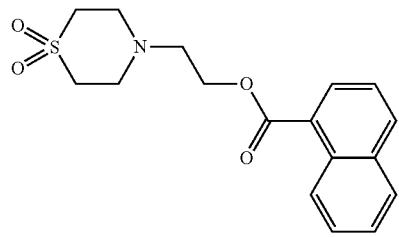
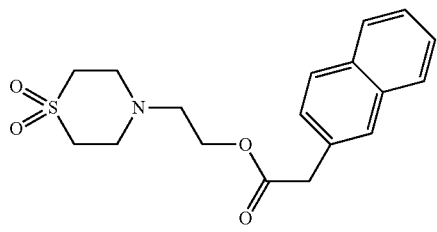
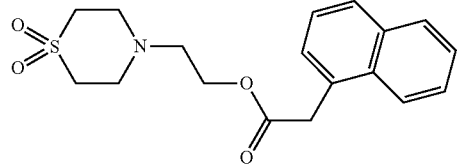
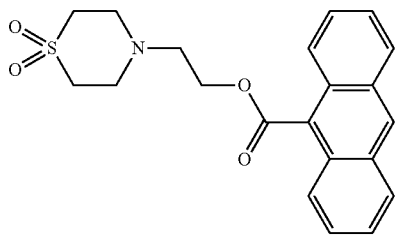
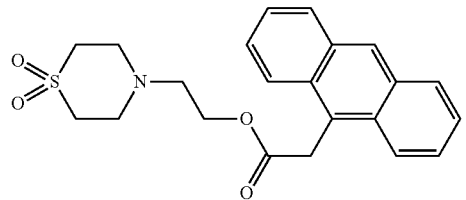
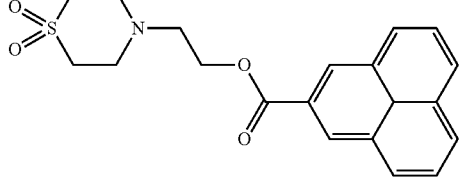
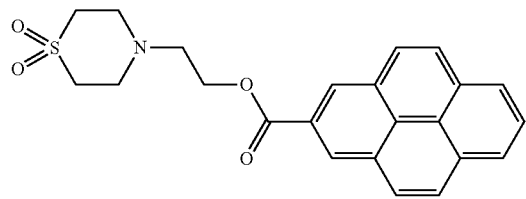
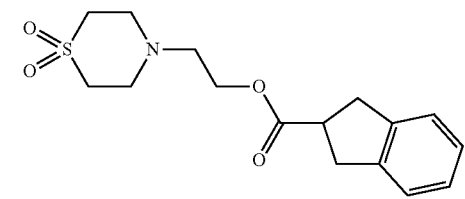
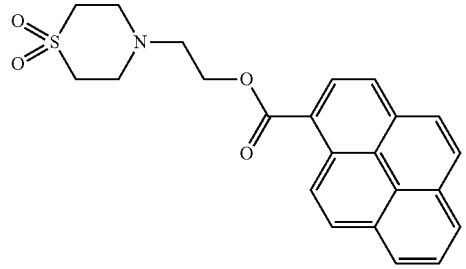
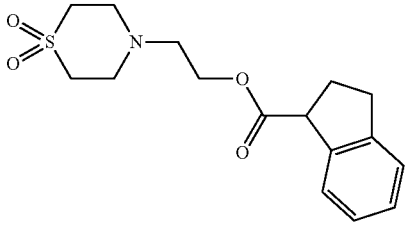
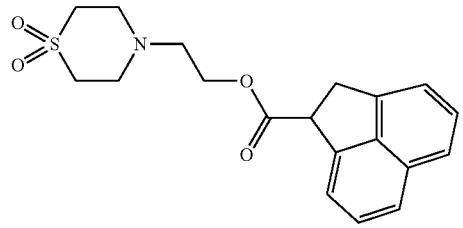
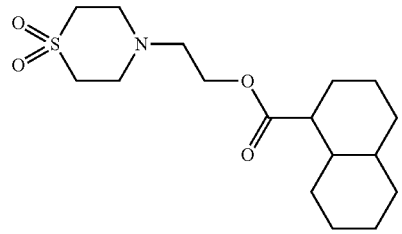
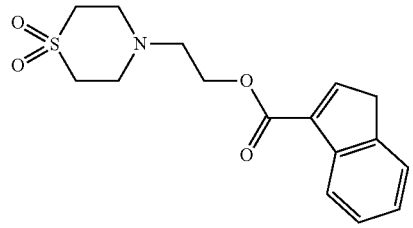
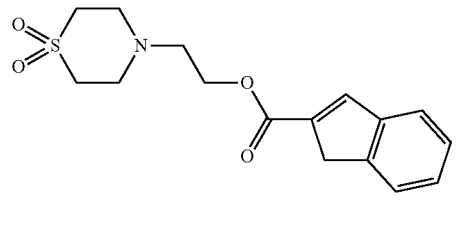

-continued
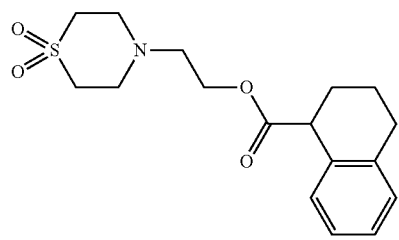
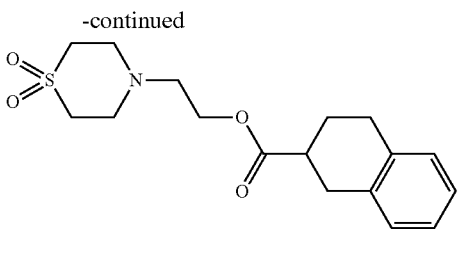
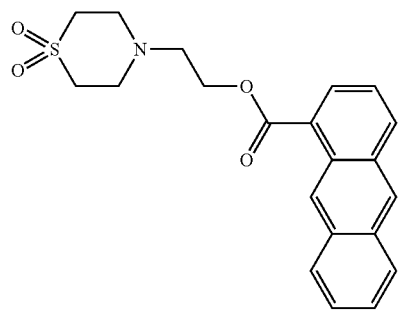
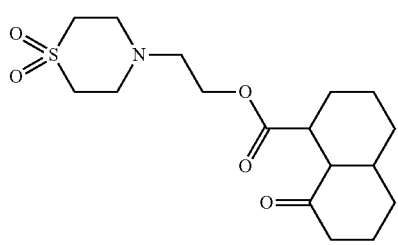
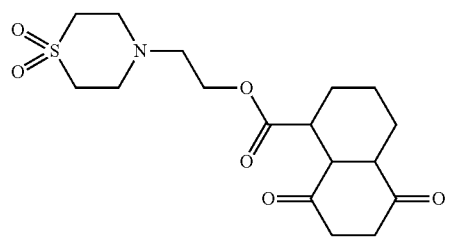
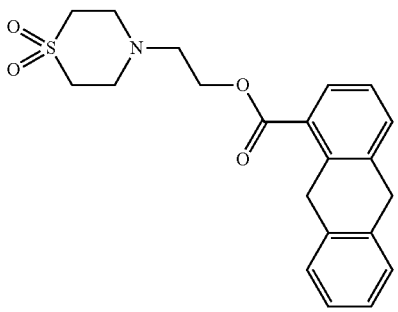
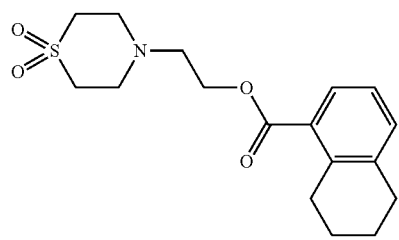
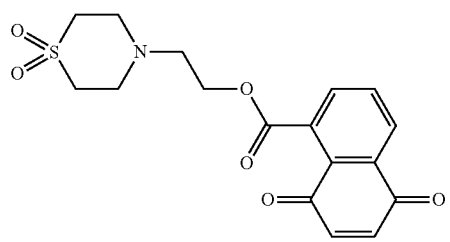
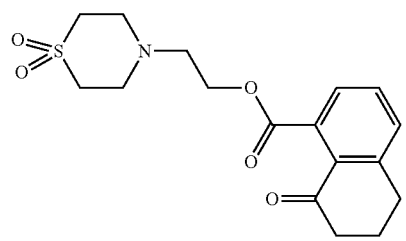
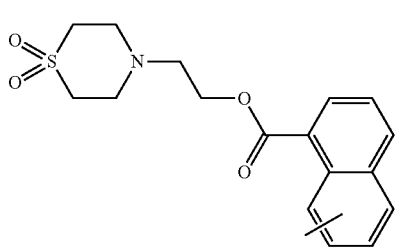

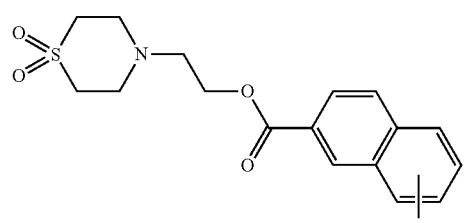
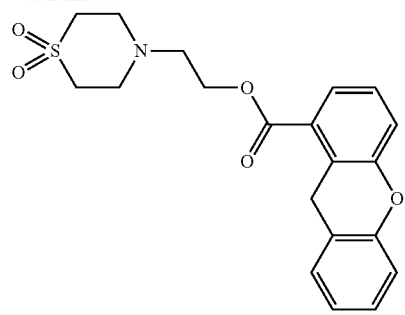
-continued
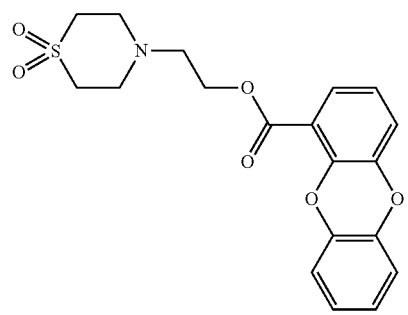
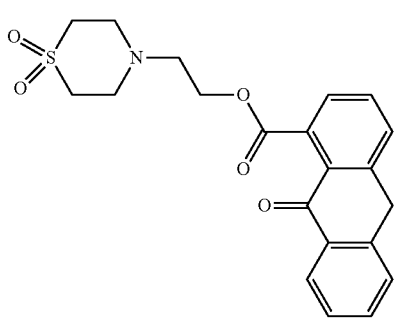
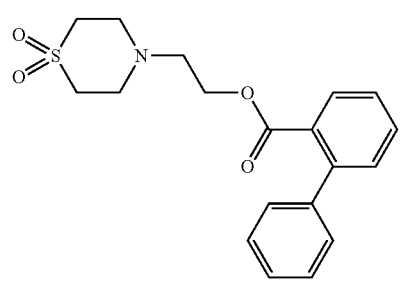
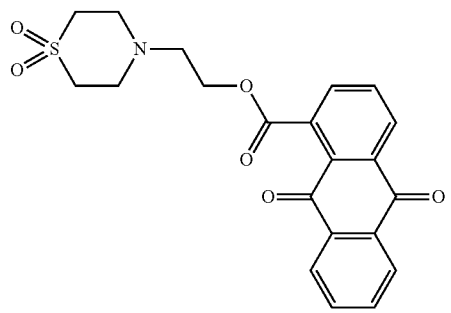
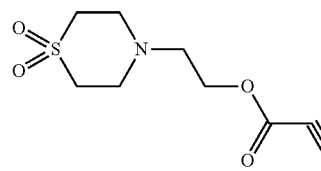 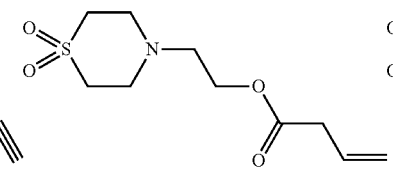 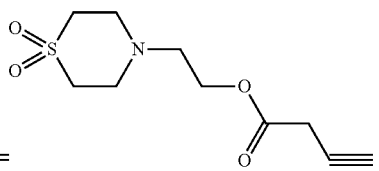
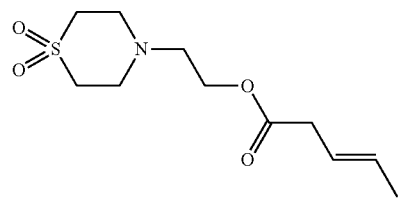
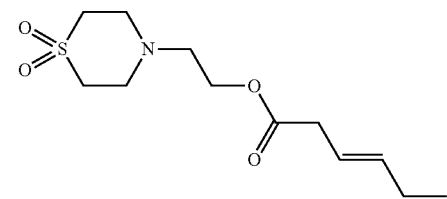
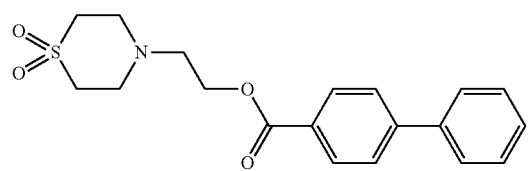
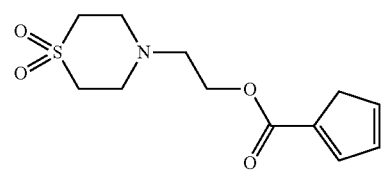
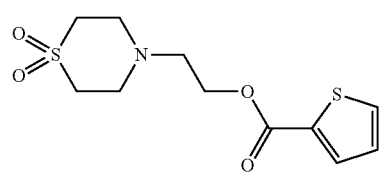
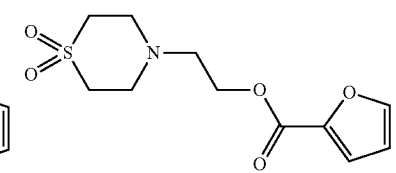
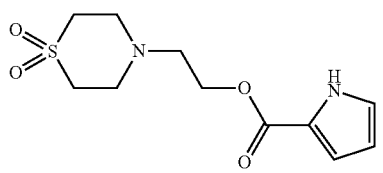

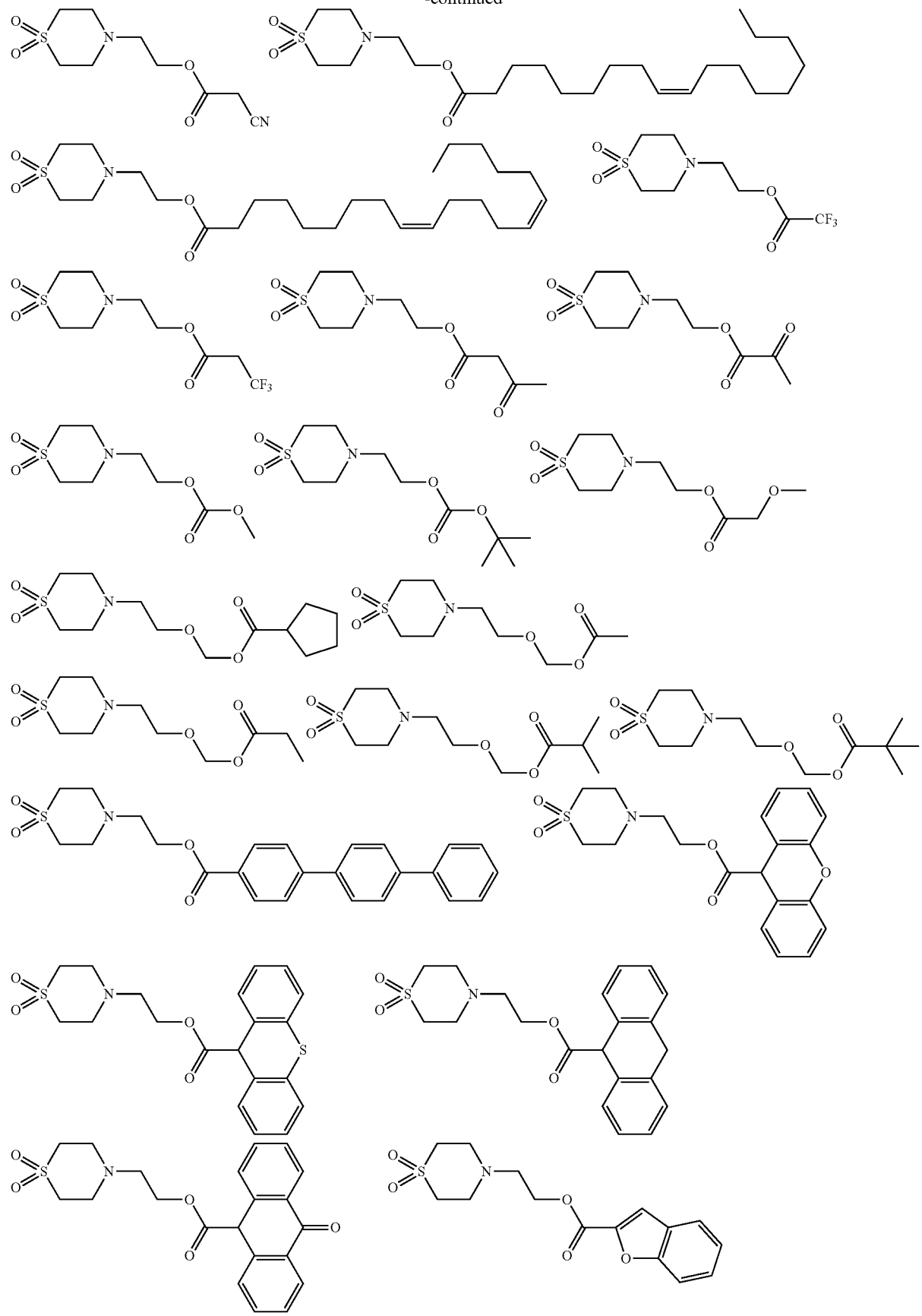

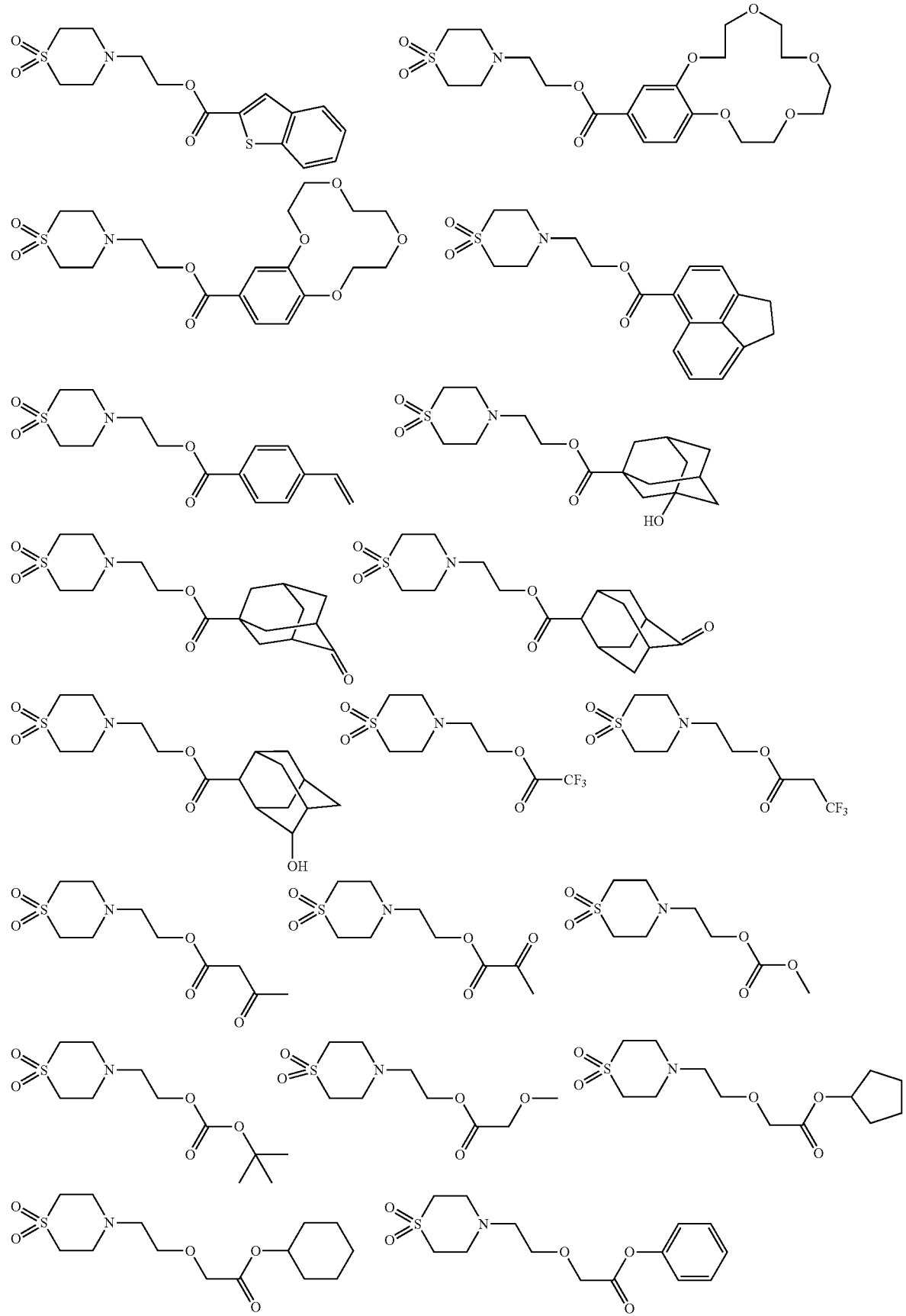

21
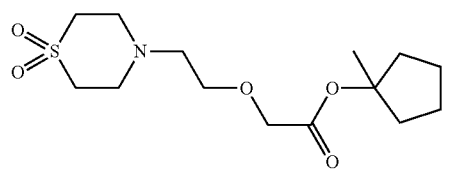
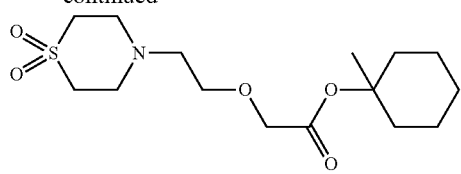
-continued
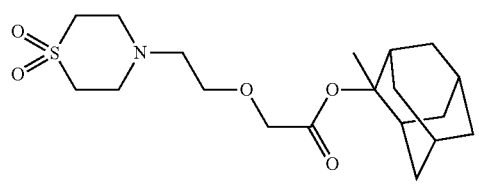
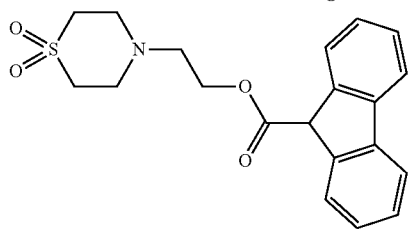
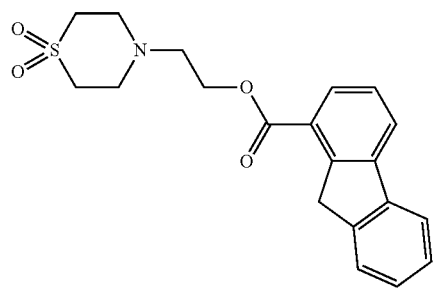
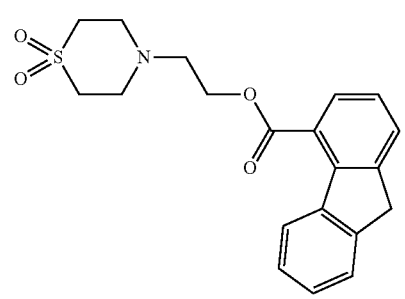
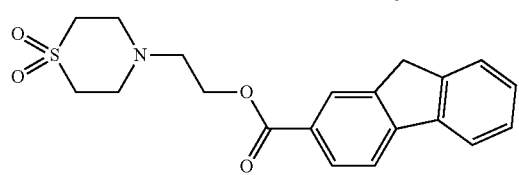
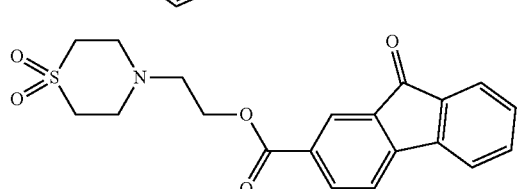
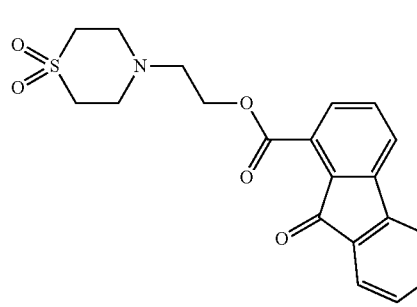
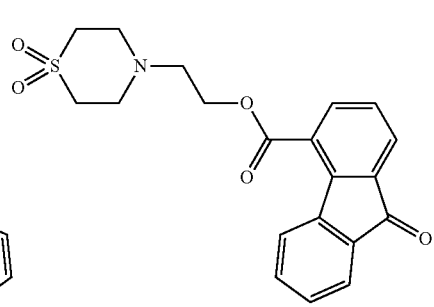
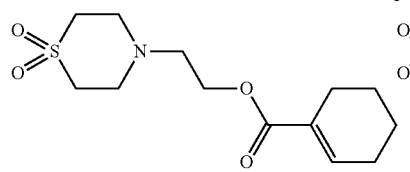
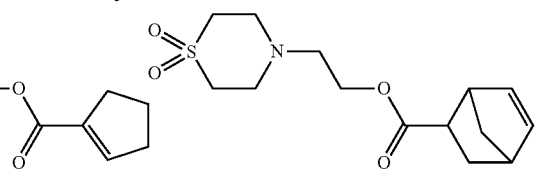
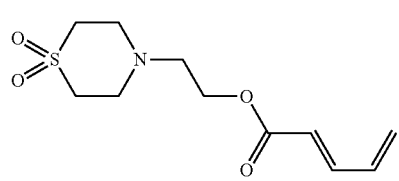
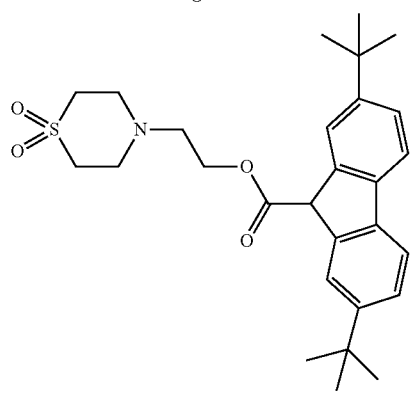

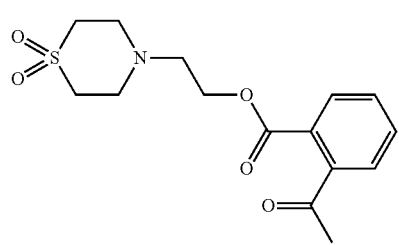
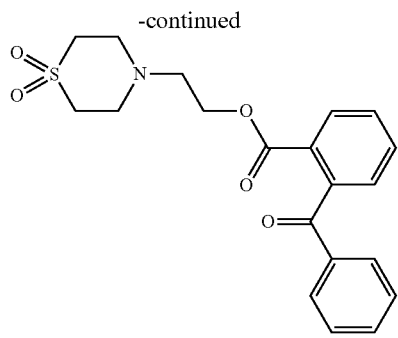
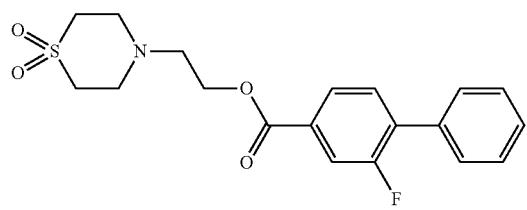
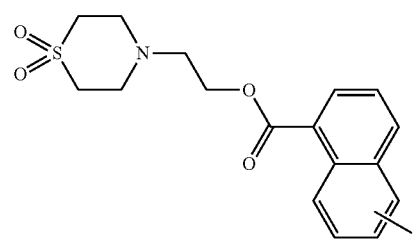
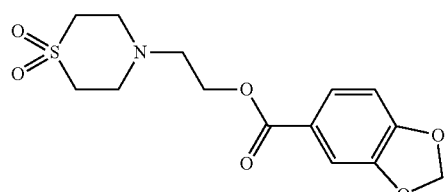
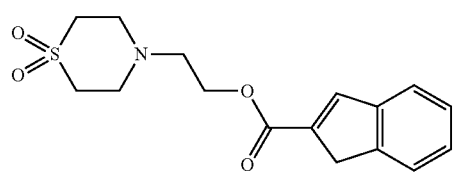
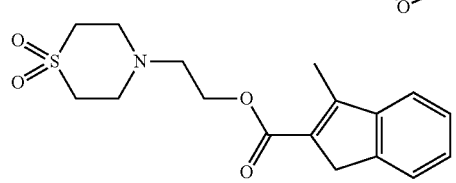
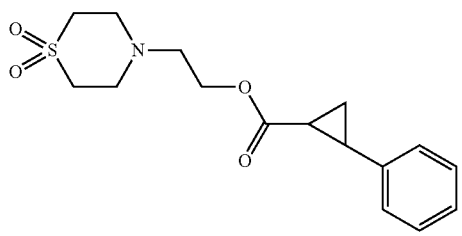
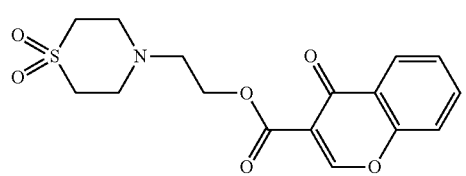
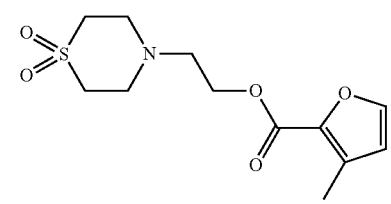
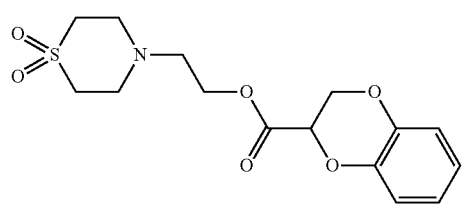
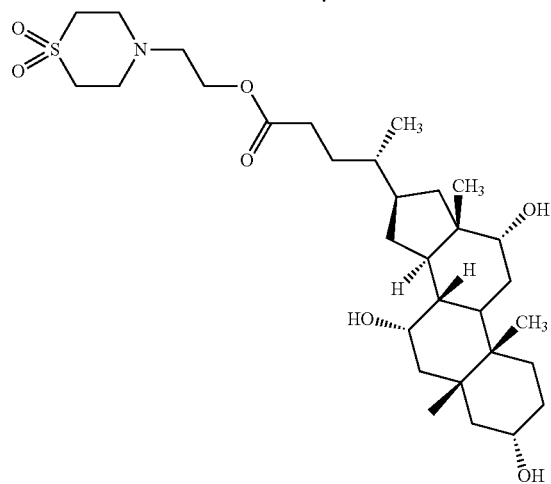

25
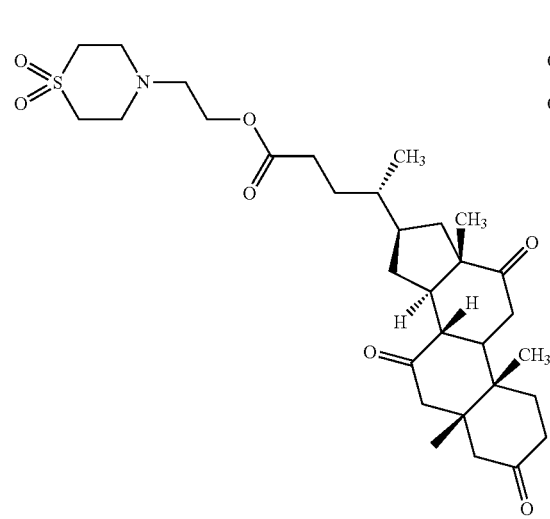
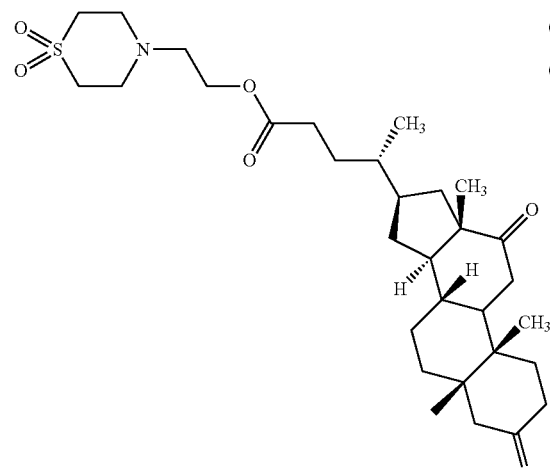
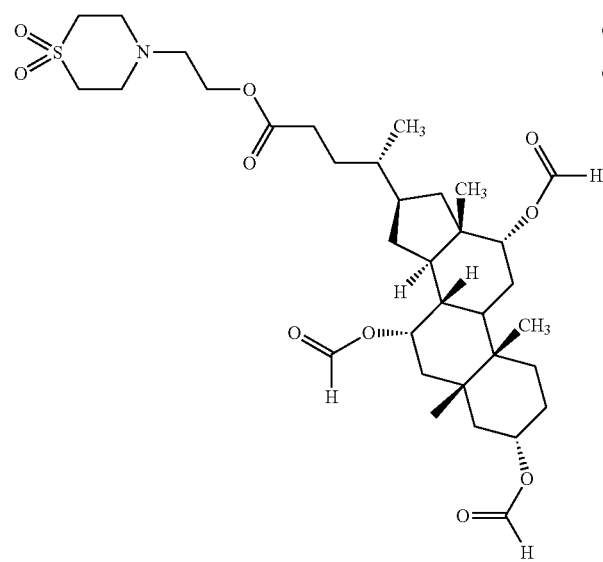
26
-continued
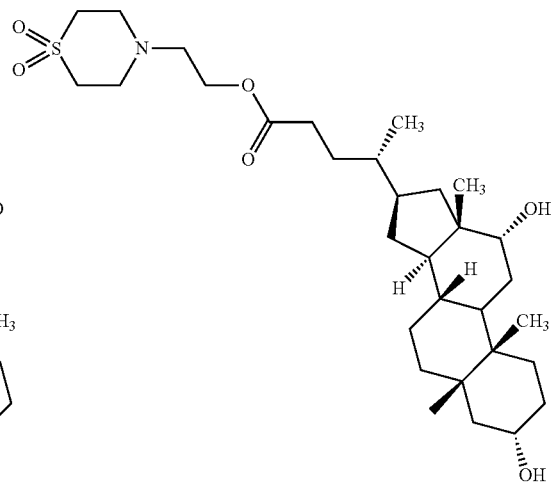
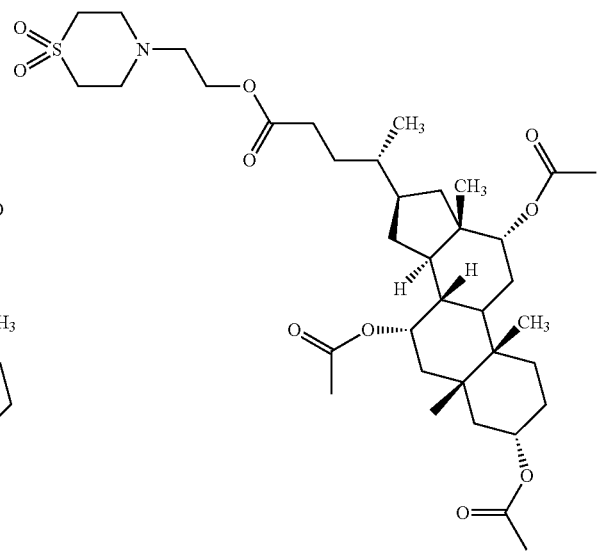
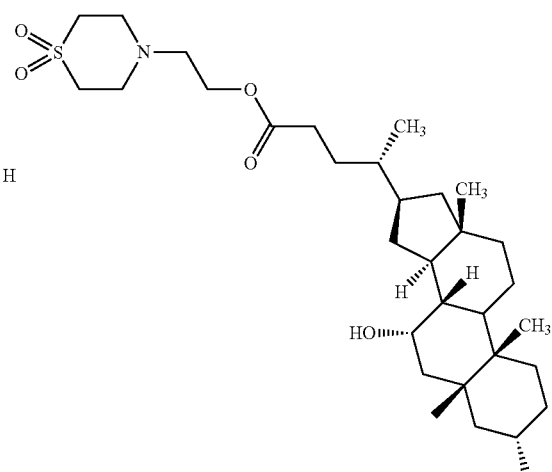

27
28
-continued
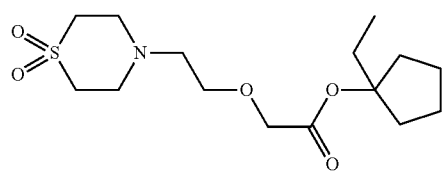
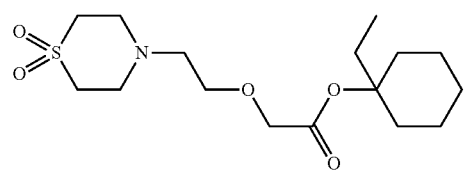
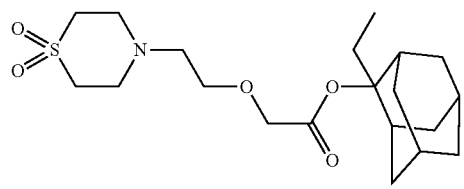
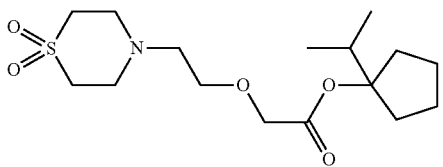
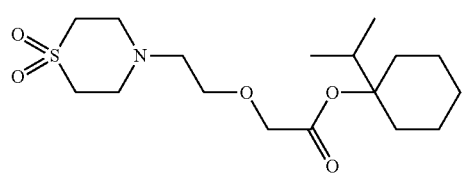
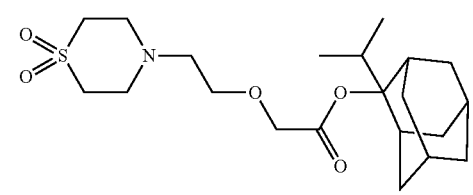
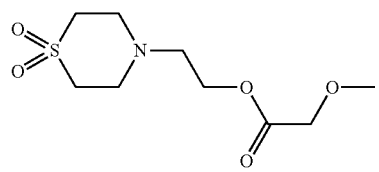
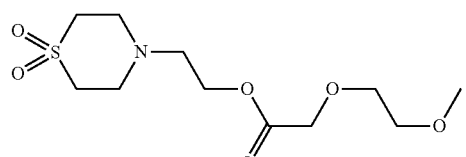
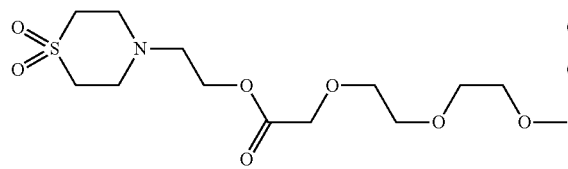
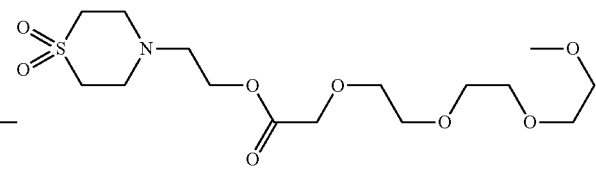
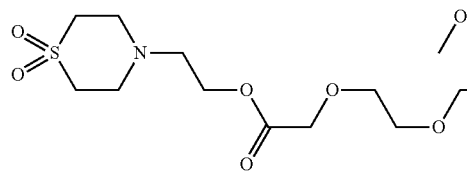
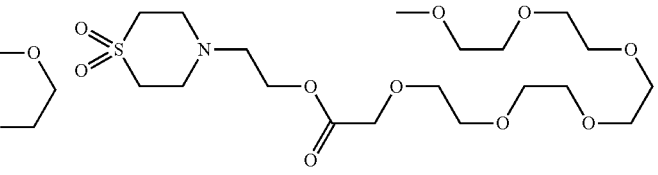
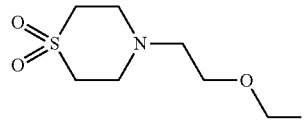
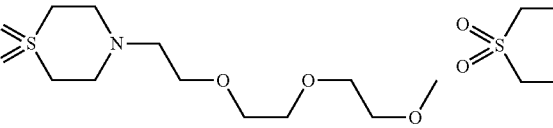
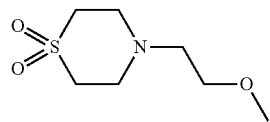
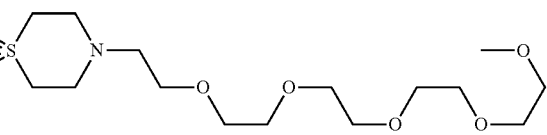
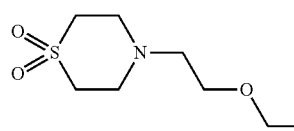
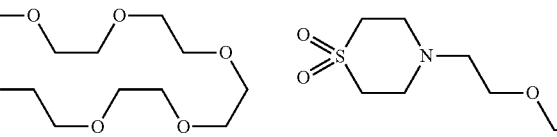
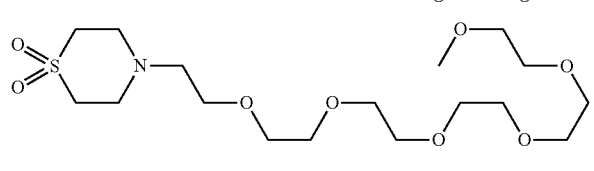
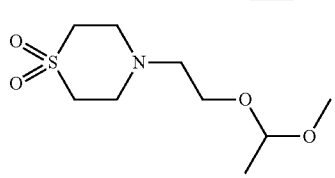

-continued
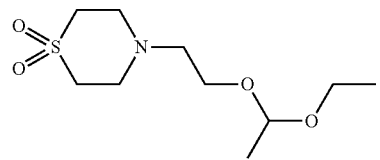 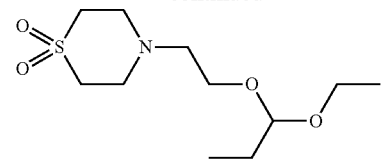 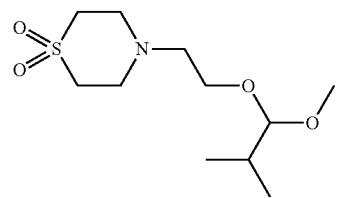
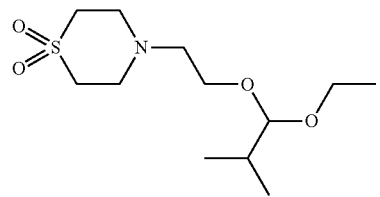 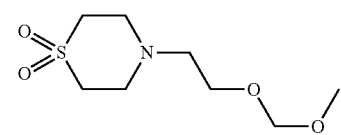 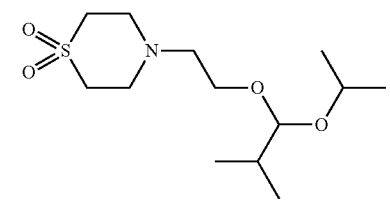
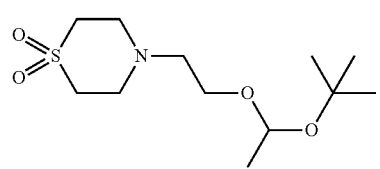 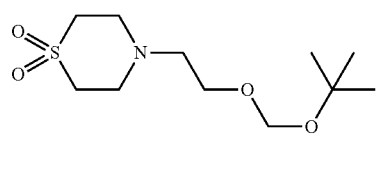 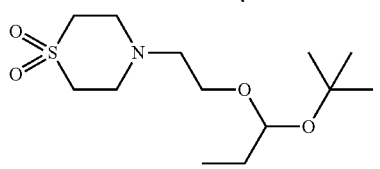
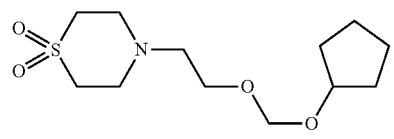 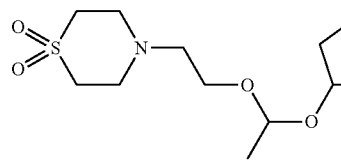 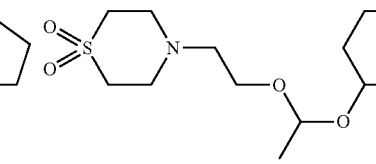
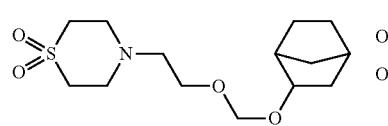 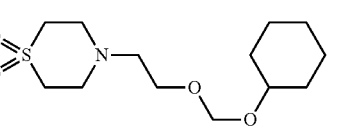 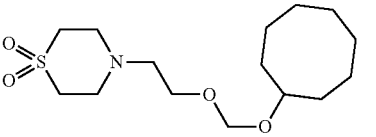
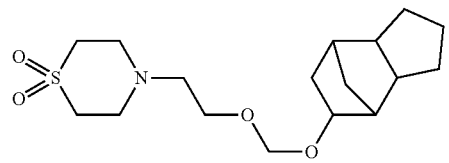 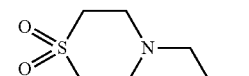 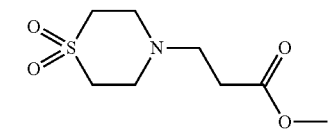
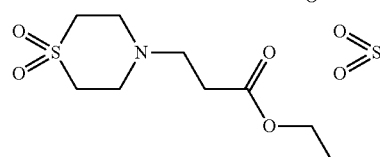 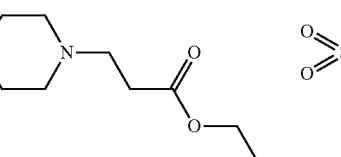 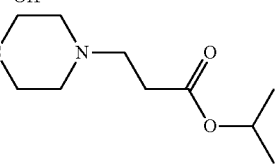
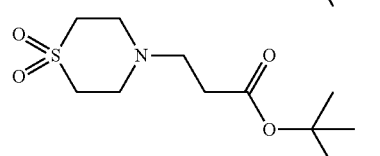 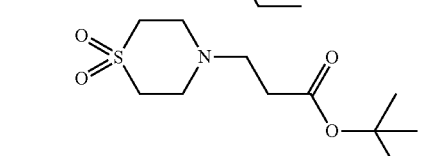
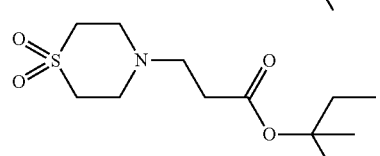 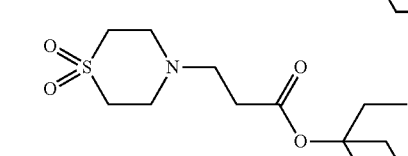
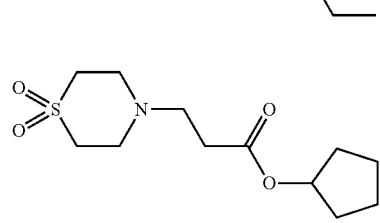 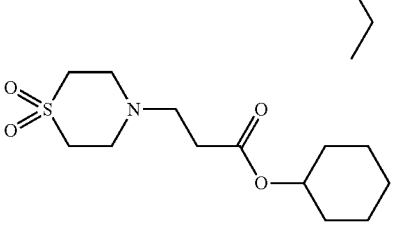 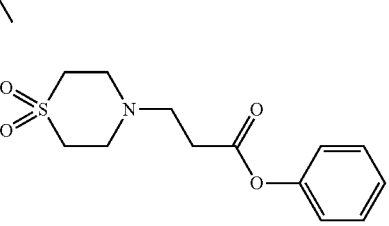

-continued
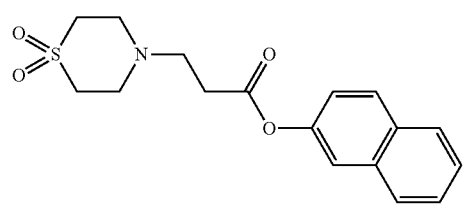
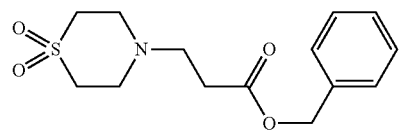
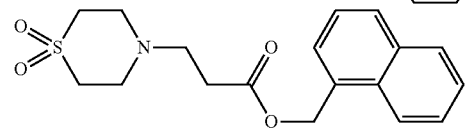
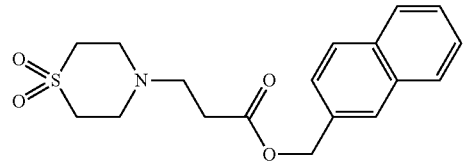
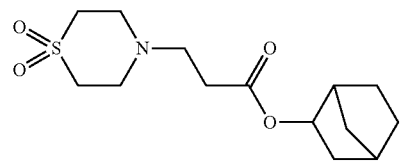
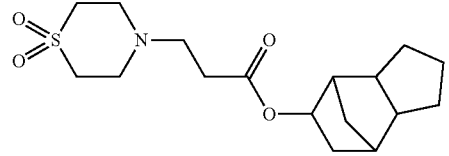
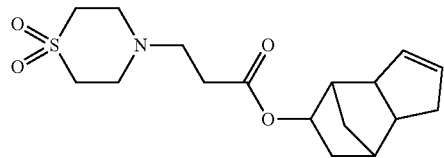
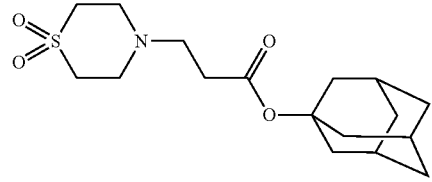
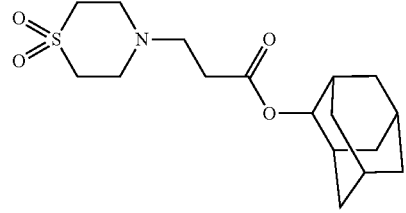
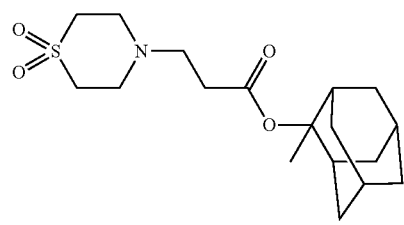
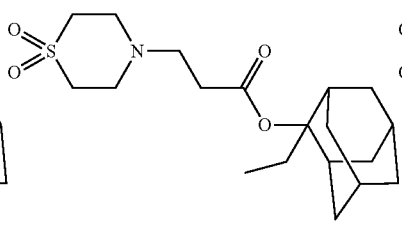
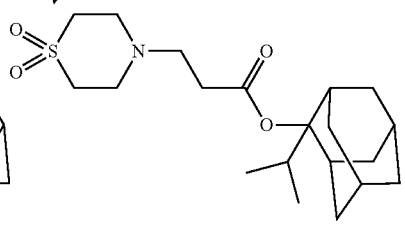
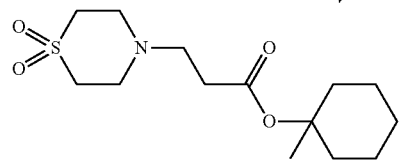
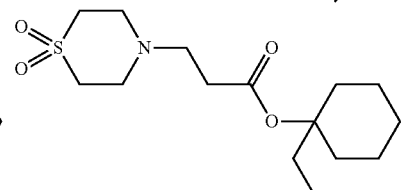
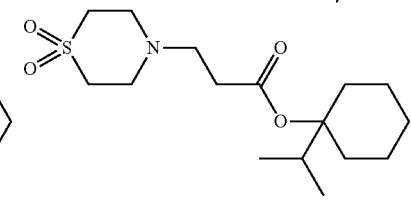
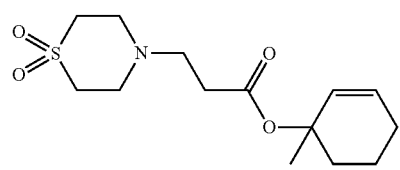
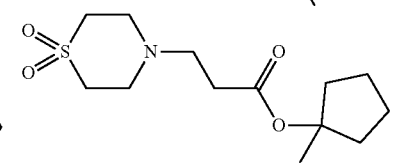
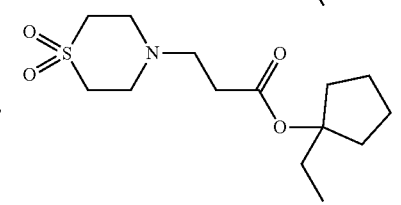
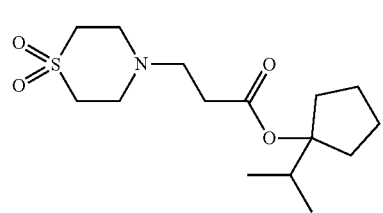
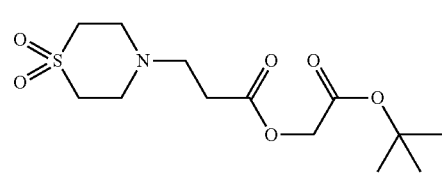

-continued
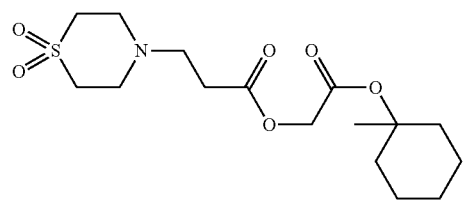
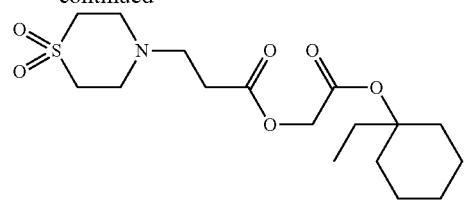
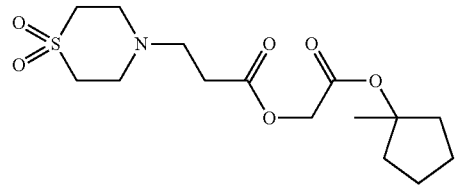
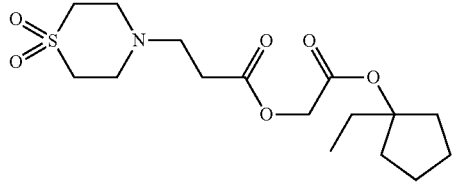
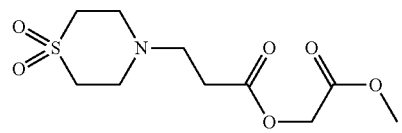
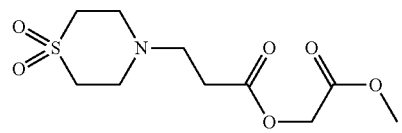
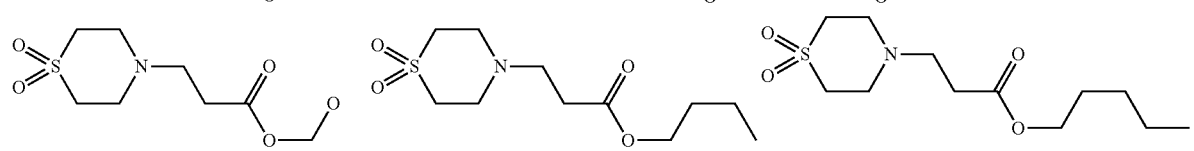
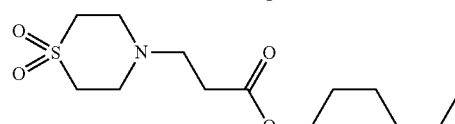
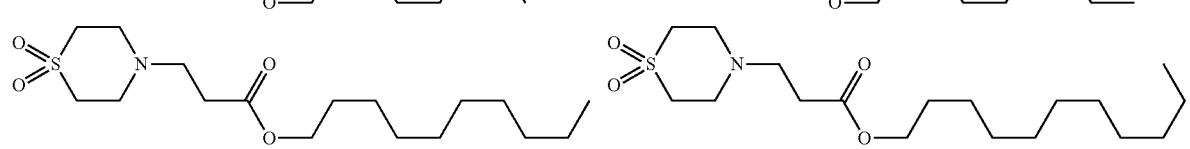
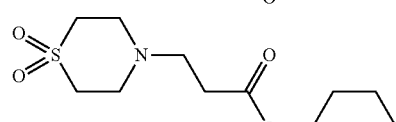
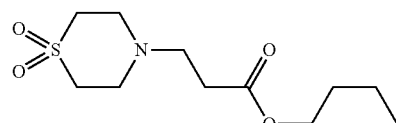
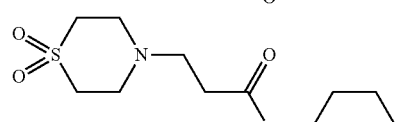
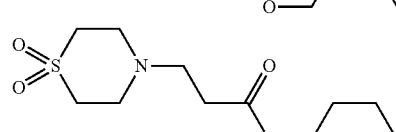
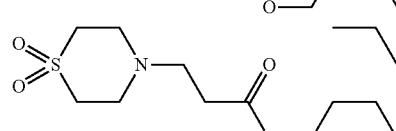
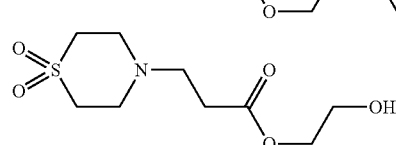

35
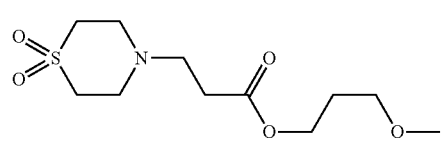
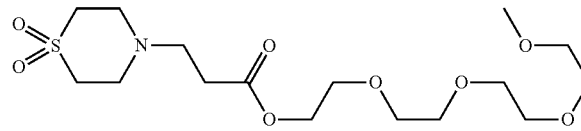
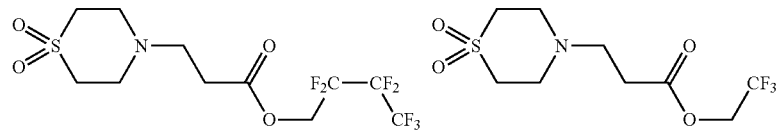
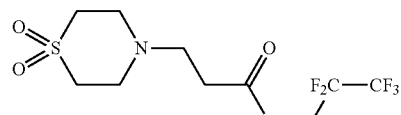
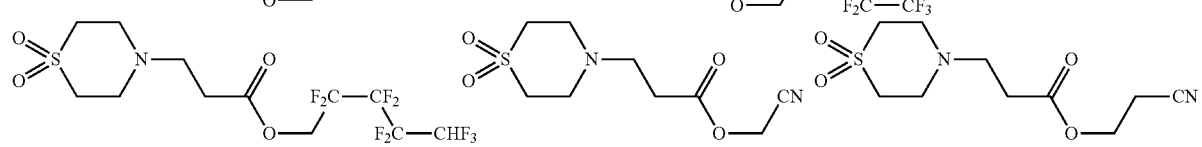
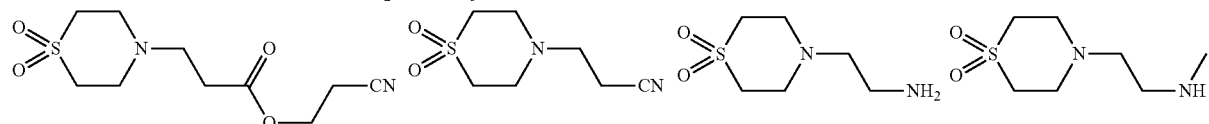
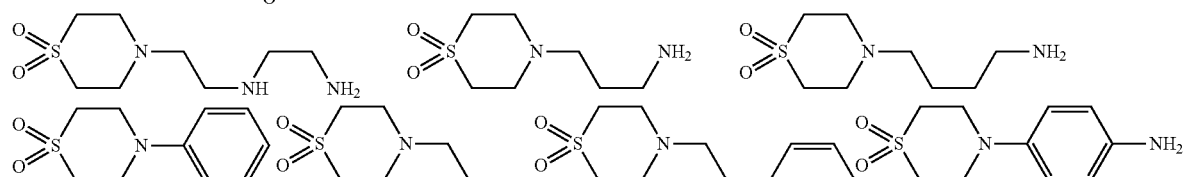
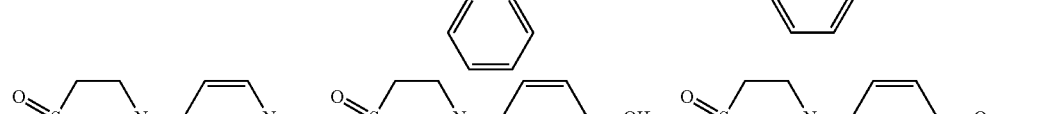
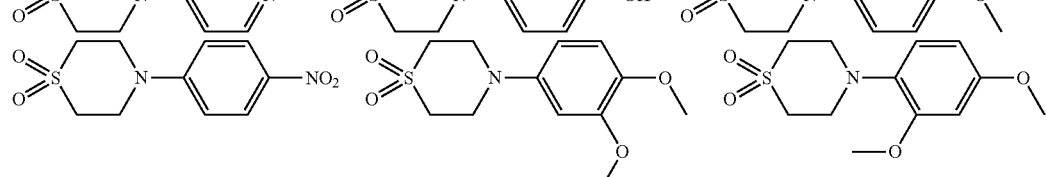
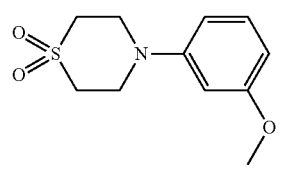
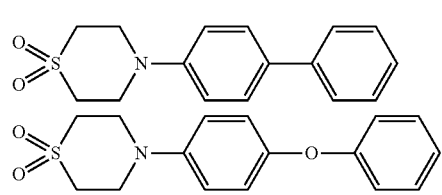
36
-continued
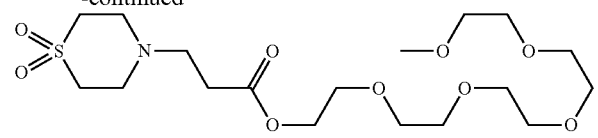
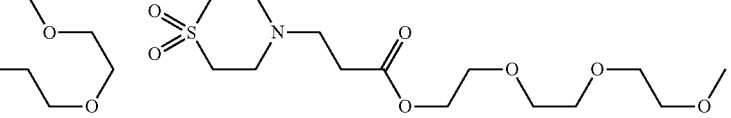
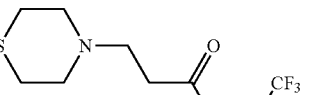
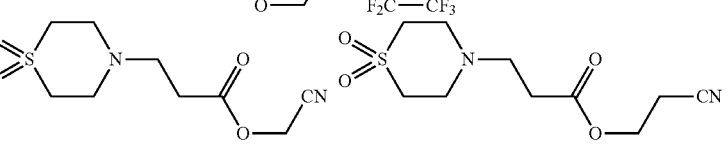
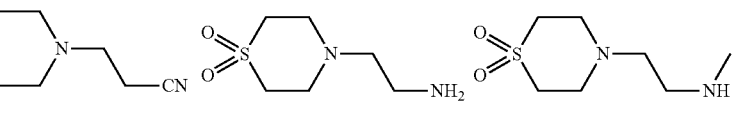
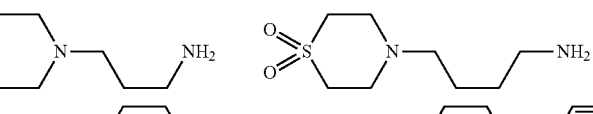
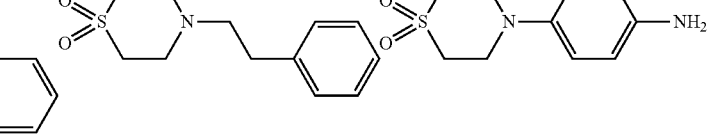
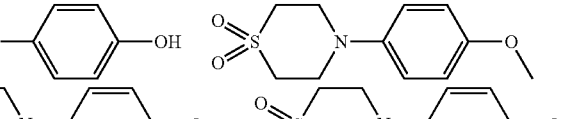
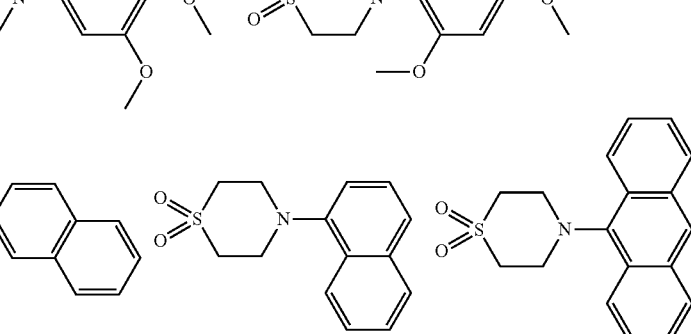
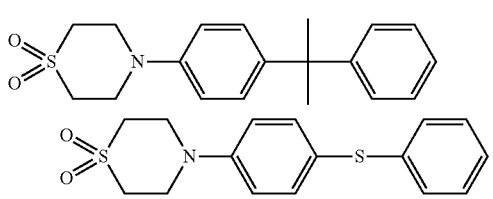

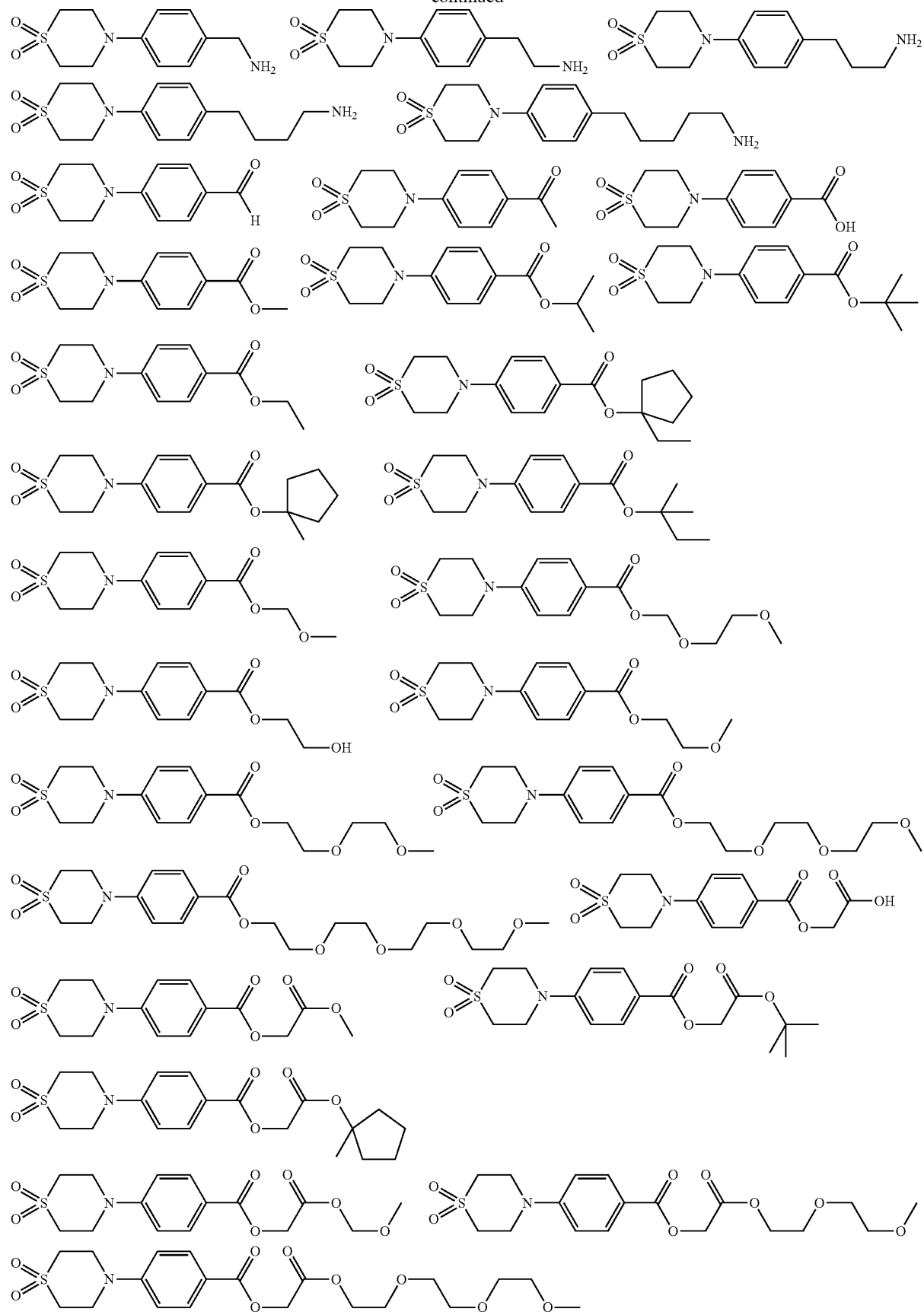

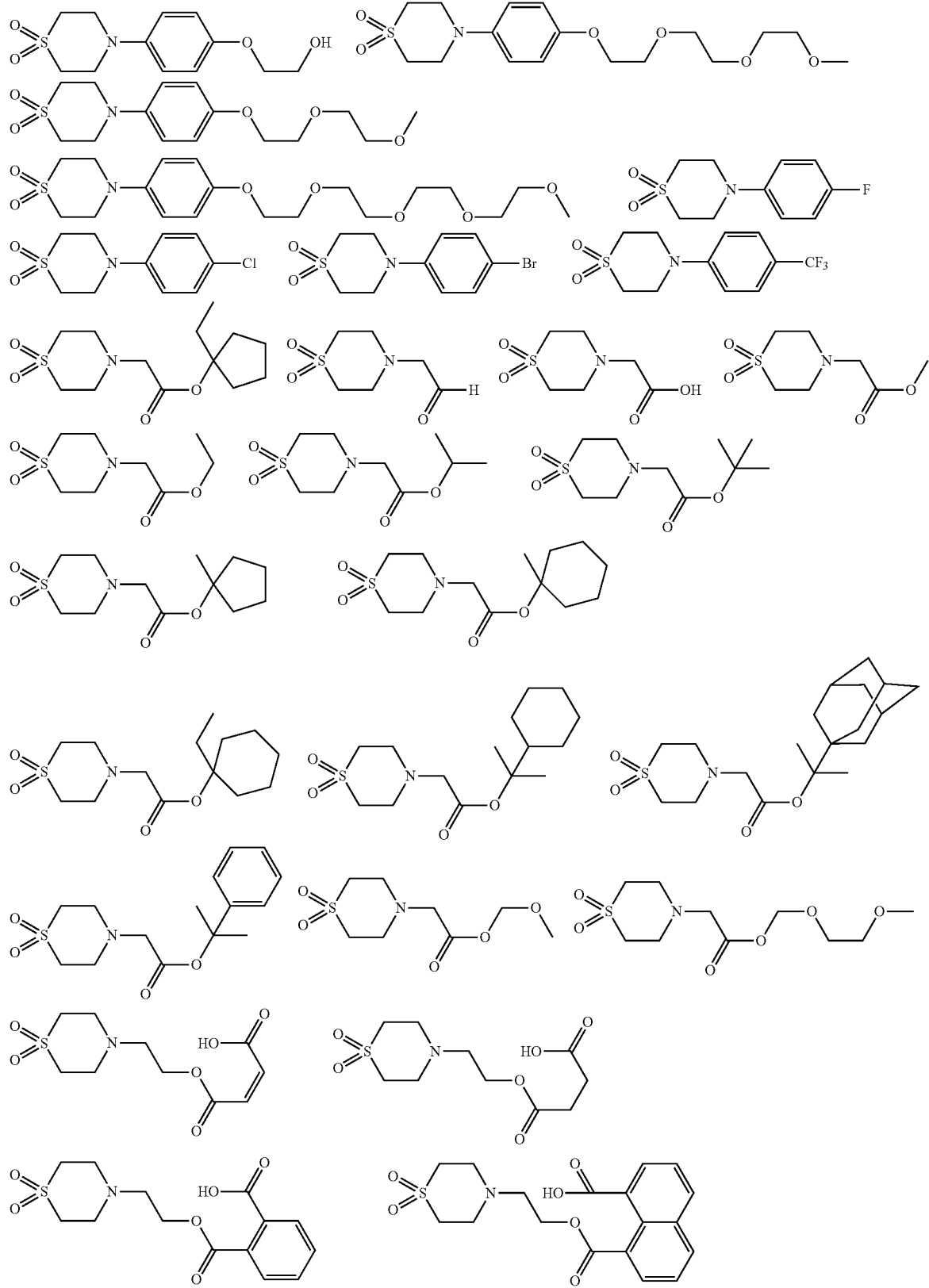

-continued
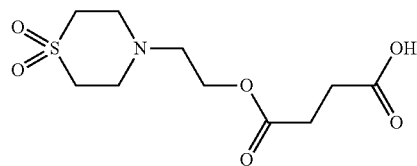
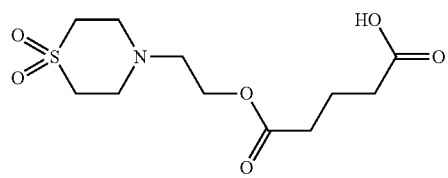
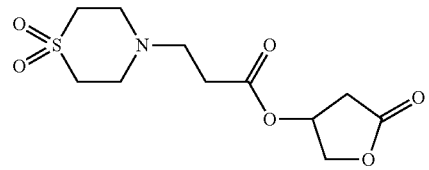
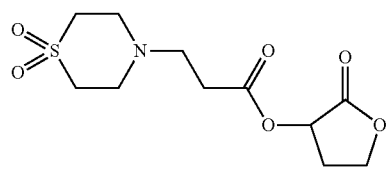
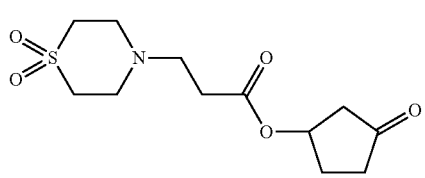
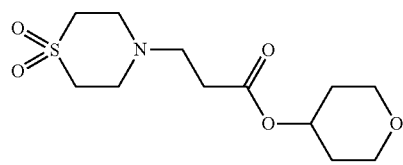
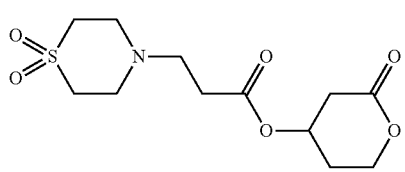
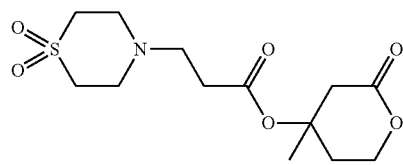
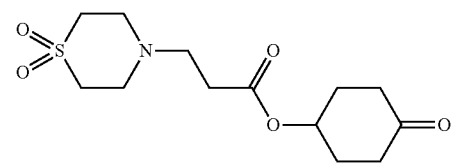
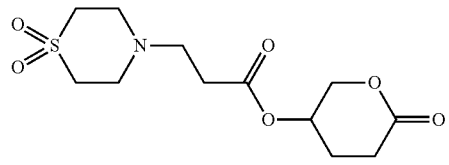
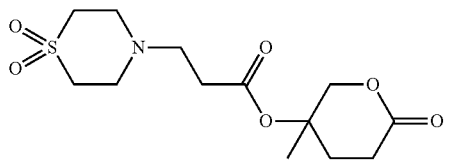
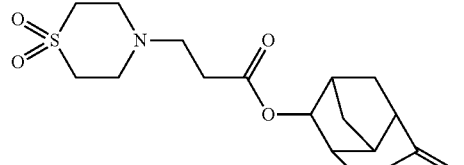
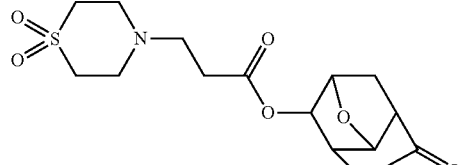
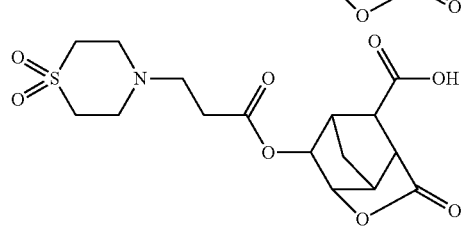
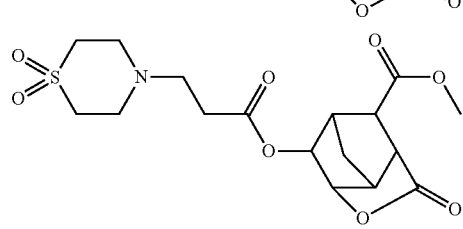
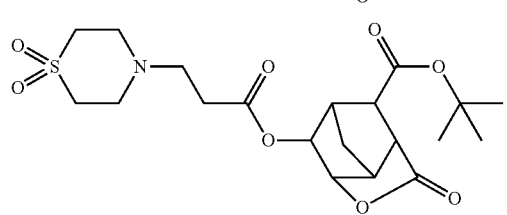
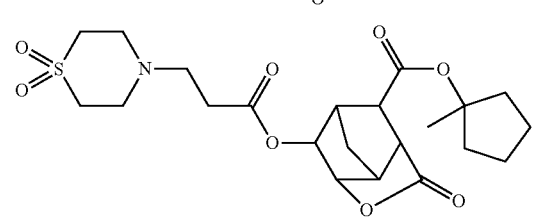

43
44
-continued
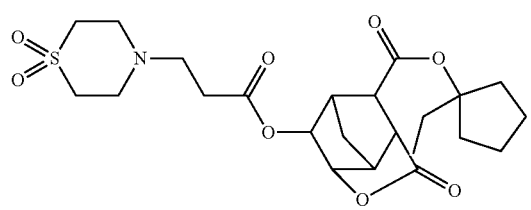
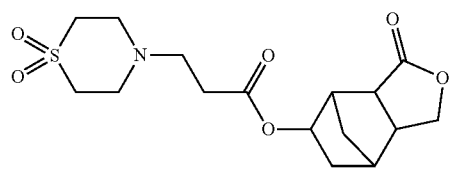
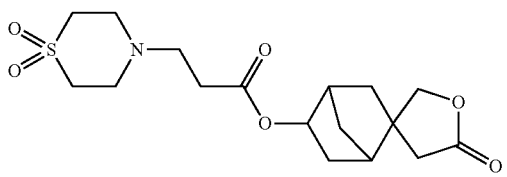
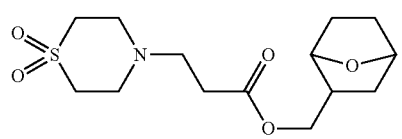
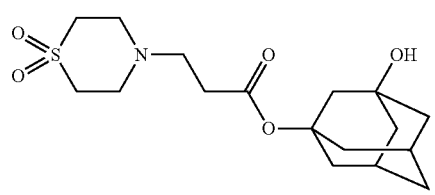
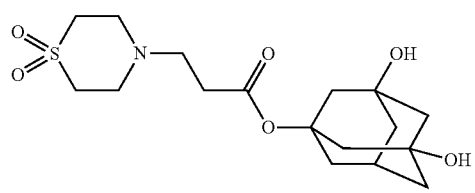
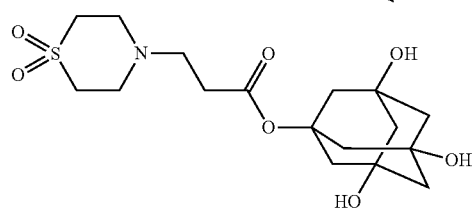
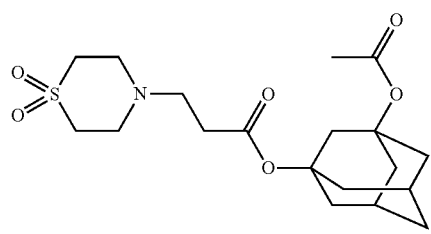
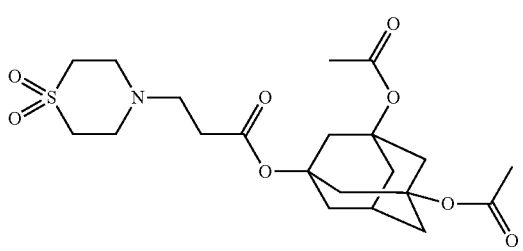
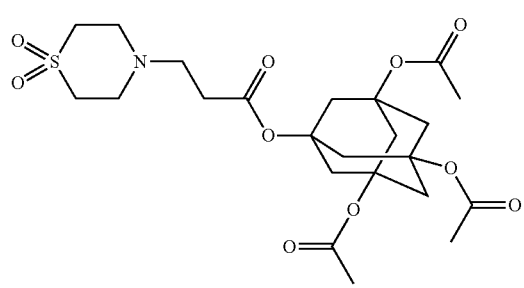
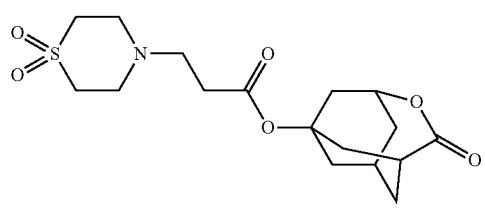
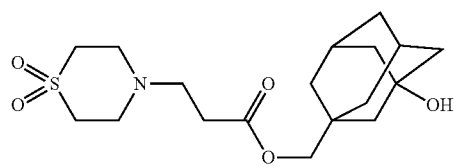
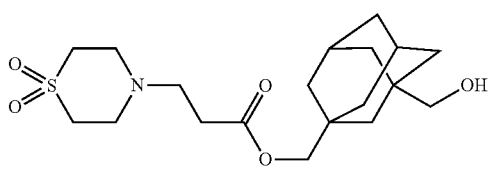
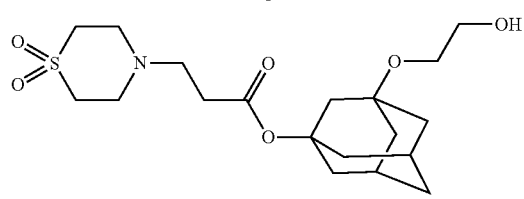
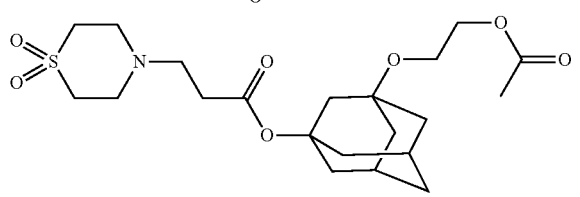

45
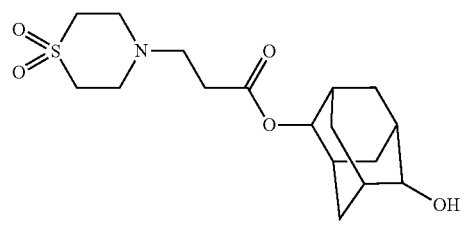
-continued
46
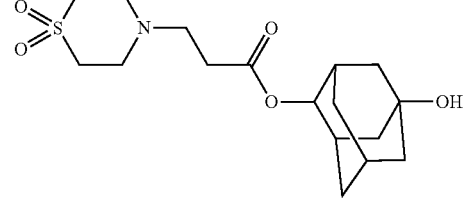
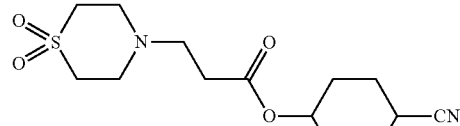
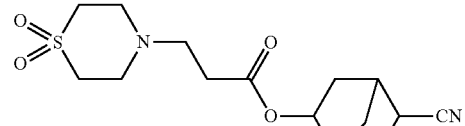
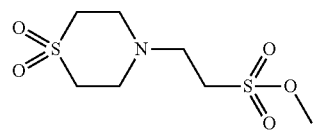 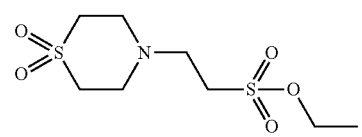 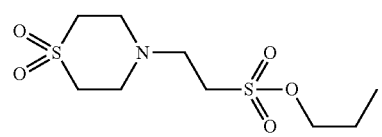
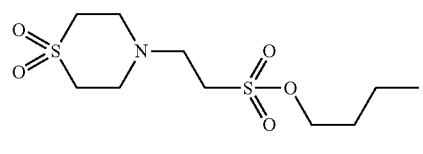 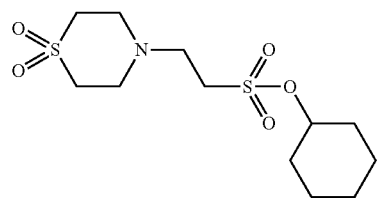
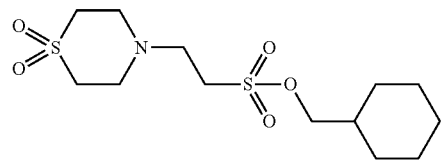 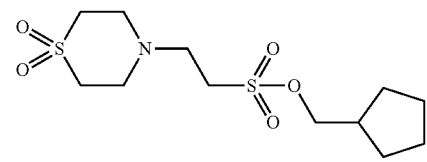
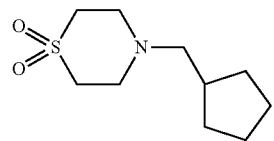 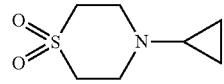 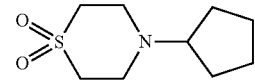
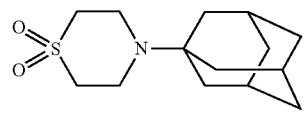 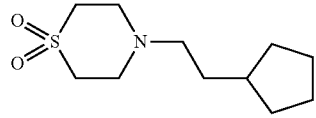 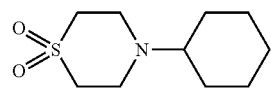
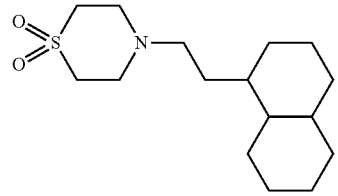 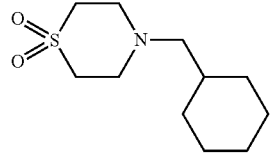 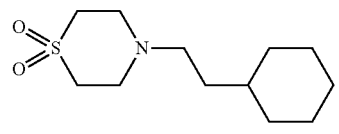
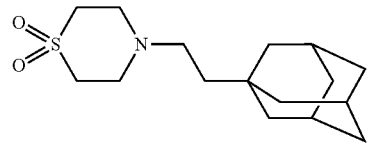 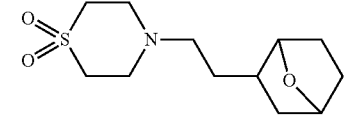 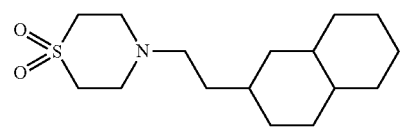
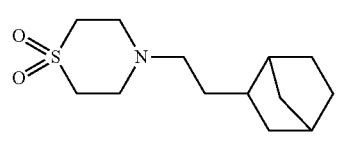 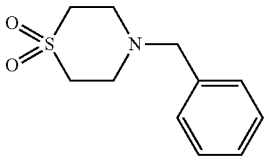

-continued
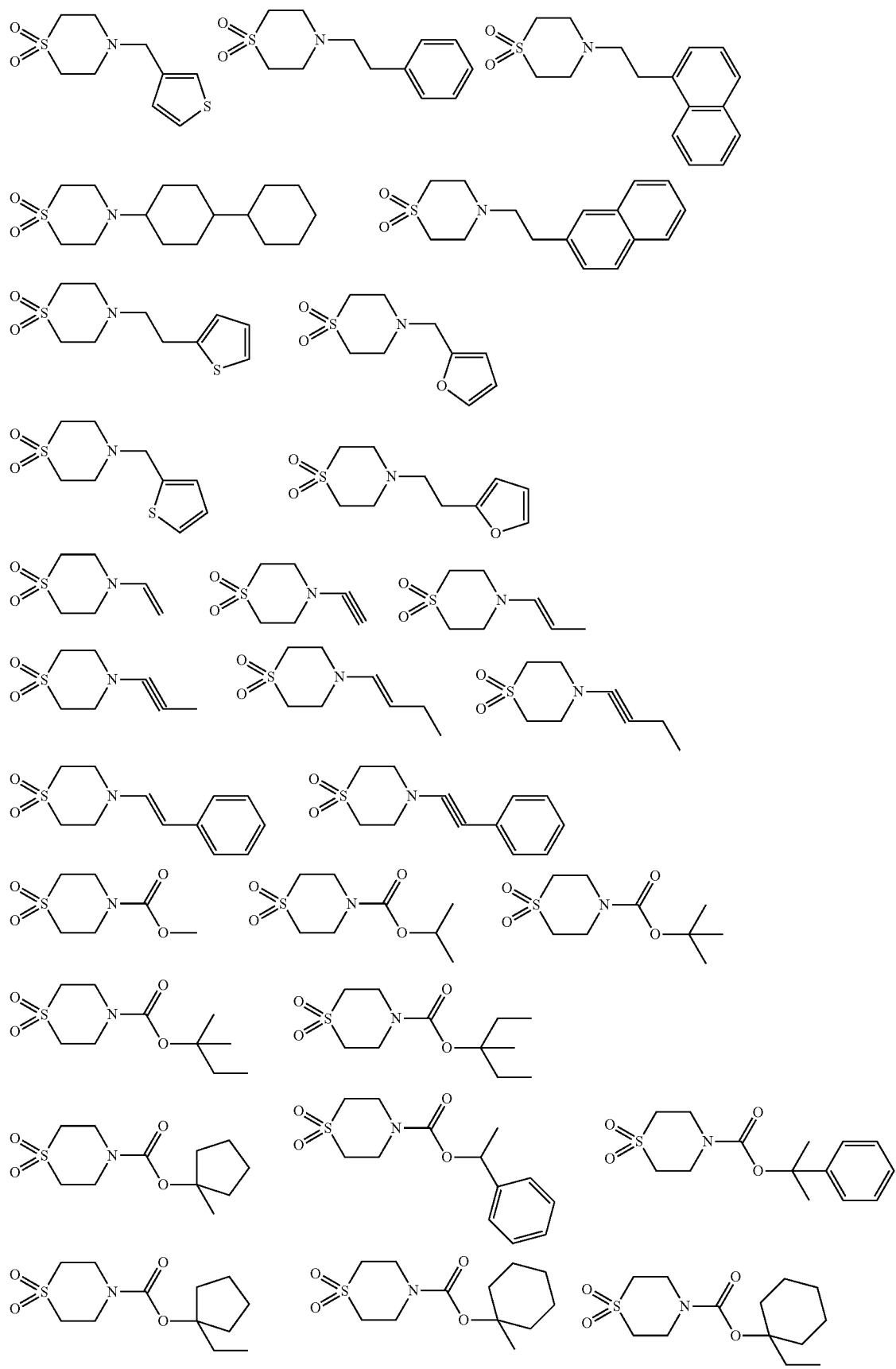

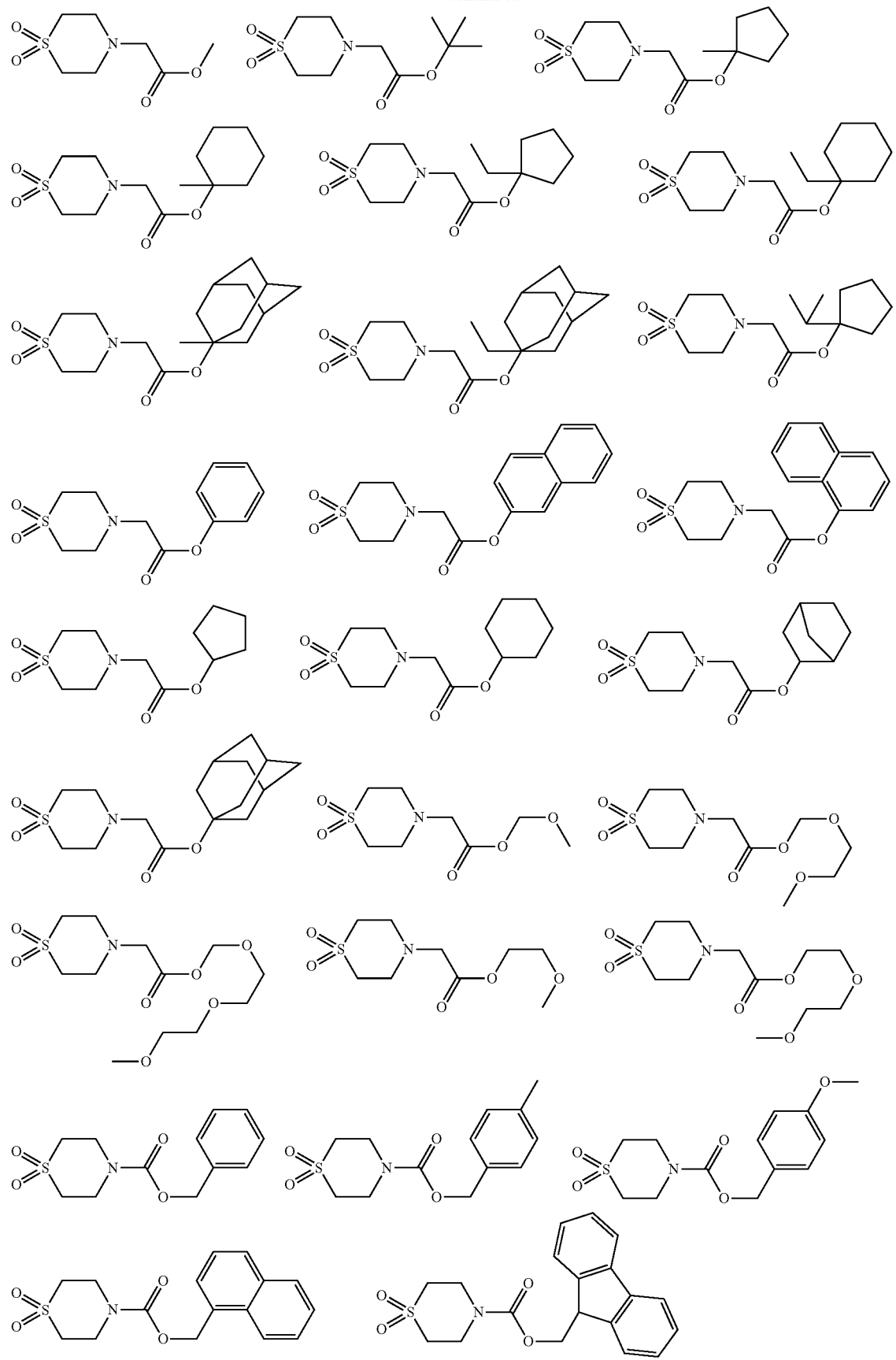

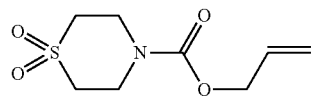 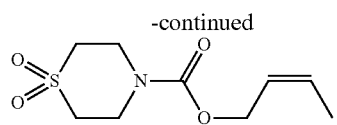

When group R in formula (1) contains an ether, ester or sulfonic acid ester radical, the compounds may be synthesized by Michael addition, alkylation, acylation of alkanolamine, or etherification, as described in JP-A 2001-194776, paragraph [0033]. The synthesis is not limited thereto.

A resist composition comprising a thiomorpholine dioxide compound as defined herein may be either positive or negative working although it should be a chemically amplified resist composition comprising an acid generator. Since the thiomorpholine dioxide compound serves to trap an acid for thereby controlling diffusion of the acid into unexposed areas and enhancing the contrast, it is advantageously applied to a chemically amplified resist composition utilizing an acid as a catalyst.

The chemically amplified resist composition is defined as comprising the basic compound of formula (1), a base polymer, and an acid generator, both to be described below. From the standpoints of sensitivity and acid diffusion control, the basic compound of formula (1) is preferably compounded in an amount of 0.001 to 20 parts by weight, more preferably 0.01 to 10 parts by weight per 100 parts by weight of the base polymer.

In the embodiment wherein chemically amplified resist compositions are positive, the base polymer comprises recurring units having an acid labile group. Suitable recurring units having an acid labile group include recurring units of (meth)acrylate, styrenecarboxylic acid and vinylnaphthalenecarboxylic acid having an acid labile group substituted thereon, as represented by unit (a1) in the general formula (2), and recurring units of hydroxystyrene having an acid labile group substituted thereon, as represented by unit (a2) in the general formula (2).

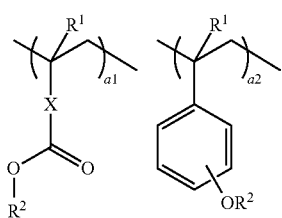 (2)

Herein, $R^1$ which may be the same or different is hydrogen or methyl. X is a single bond, ester group, linking group of 1 to 12 carbon atoms having a lactone ring, phenylene group, or naphthylene group. $R^2$ is an acid labile group.

The recurring units having an acid labile group as represented by units (a1) are preferably derived from (meth)acrylic acid, styrenecarboxylic acid and vinylnaphthalenecarboxylic acid by substituting an acid labile group for the hydrogen atom of carboxyl group. Illustrative, non-limiting, examples of recurring units (a1) are given below.

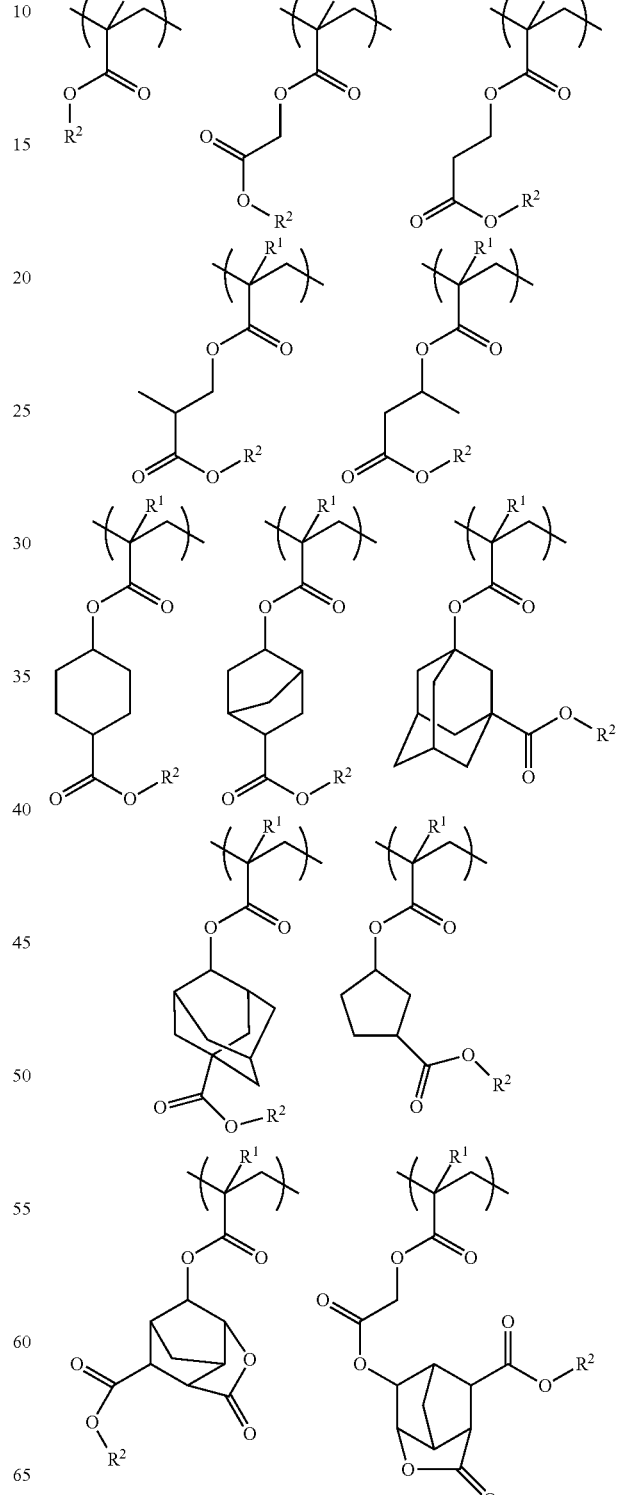

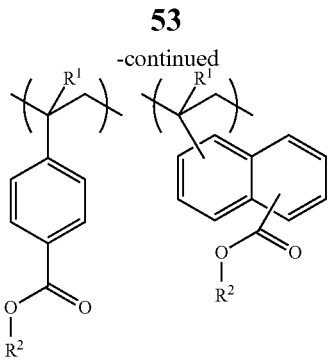

Herein R¹ and R² are as defined above.

The acid labile group represented by $R^2$ in the recurring units (a1) and (a2) may be selected from a variety of such groups. The acid labile groups may be the same or different and preferably include groups of the following formulae (A-1) to (A-3).

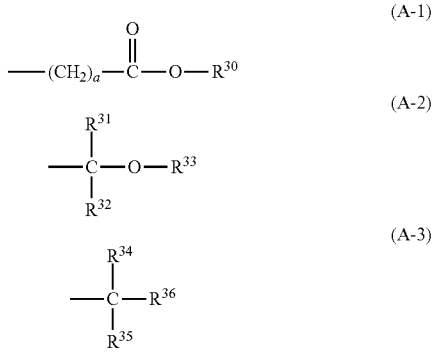

In formula (A-1), $R^{30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter "a" is an integer of 0 to 6.

In formula (A-2), $R^{31}$ and $R^{32}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

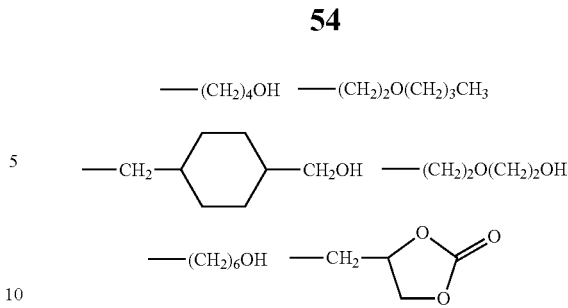

A pair of $R^{31}$ and $R^{32}$, $R^{31}$ and $R^{33}$, or $R^{32}$ and $R^{33}$ may bond together to form a ring with the carbon and oxygen atoms to which they are attached. Each of $R^{31}$, $R^{32}$ and $R^{33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethyl cyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

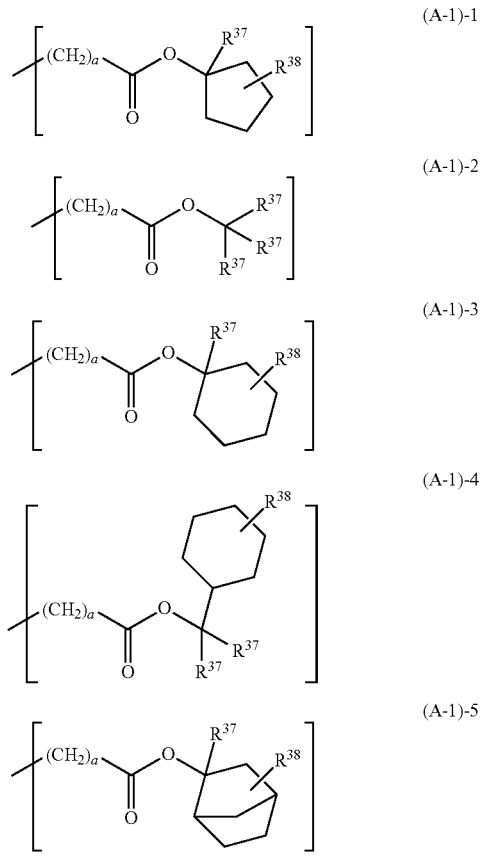

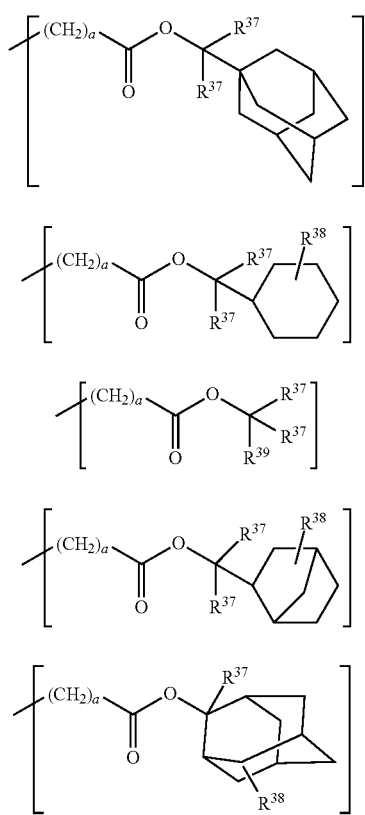

(A-1)-6

(A-1)-7

(A-1)-8

(A-1)-9

(A-1)-10

Herein $R^{37}$ is each independently a straight, branched or cyclic $C_1$-$C_{10}$ alkyl group or $C_6$-$C_{20}$ aryl group, $R^{38}$ is hydrogen or a straight, branched or cyclic $C_1$-$C_{10}$ alkyl group, $R^{39}$ is each independently a straight, branched or cyclic $C_2$-$C_{10}$ alkyl group or $C_6$-$C_{20}$ aryl group, and "a" is an integer of 0 to 6.

Of the acid labile groups of formula (A-2), the straight and branched ones are exemplified by the following groups having formulae (A-2)-1 to (A-2)-72.

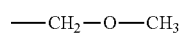 (A-2)-1

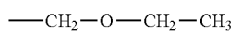 (A-2)-2

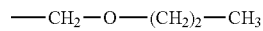 (A-2)-3

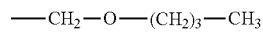 (A-2)-4

 (A-2)-5

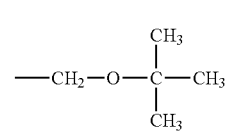 (A-2)-6

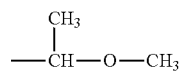 (A-2)-7

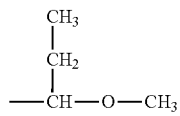 (A-2)-8

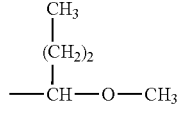 (A-2)-9

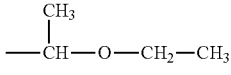 (A-2)-10

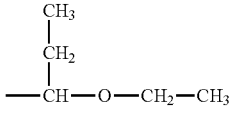 (A-2)-11

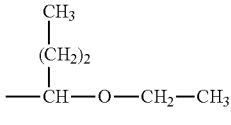 (A-2)-12

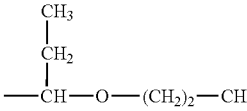 (A-2)-13

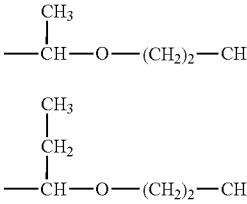 (A-2)-14

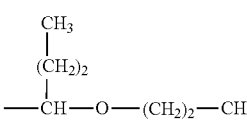 (A-2)-15

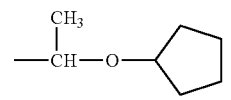 (A-2)-16

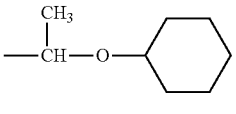 (A-2)-17

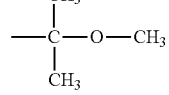 (A-2)-18

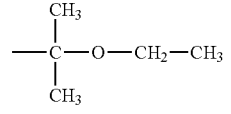 (A-2)-19

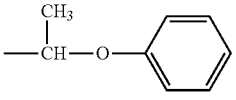 (A-2)-20

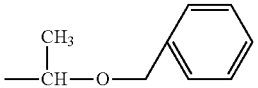 (A-2)-21

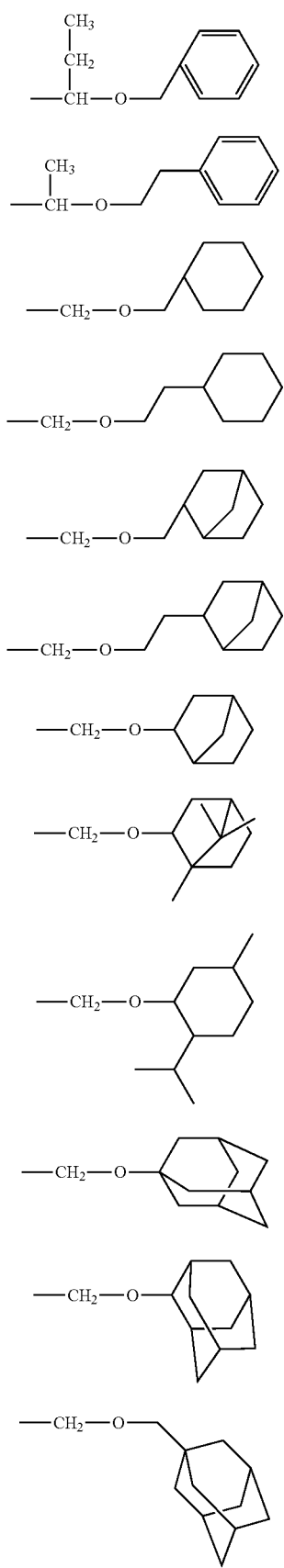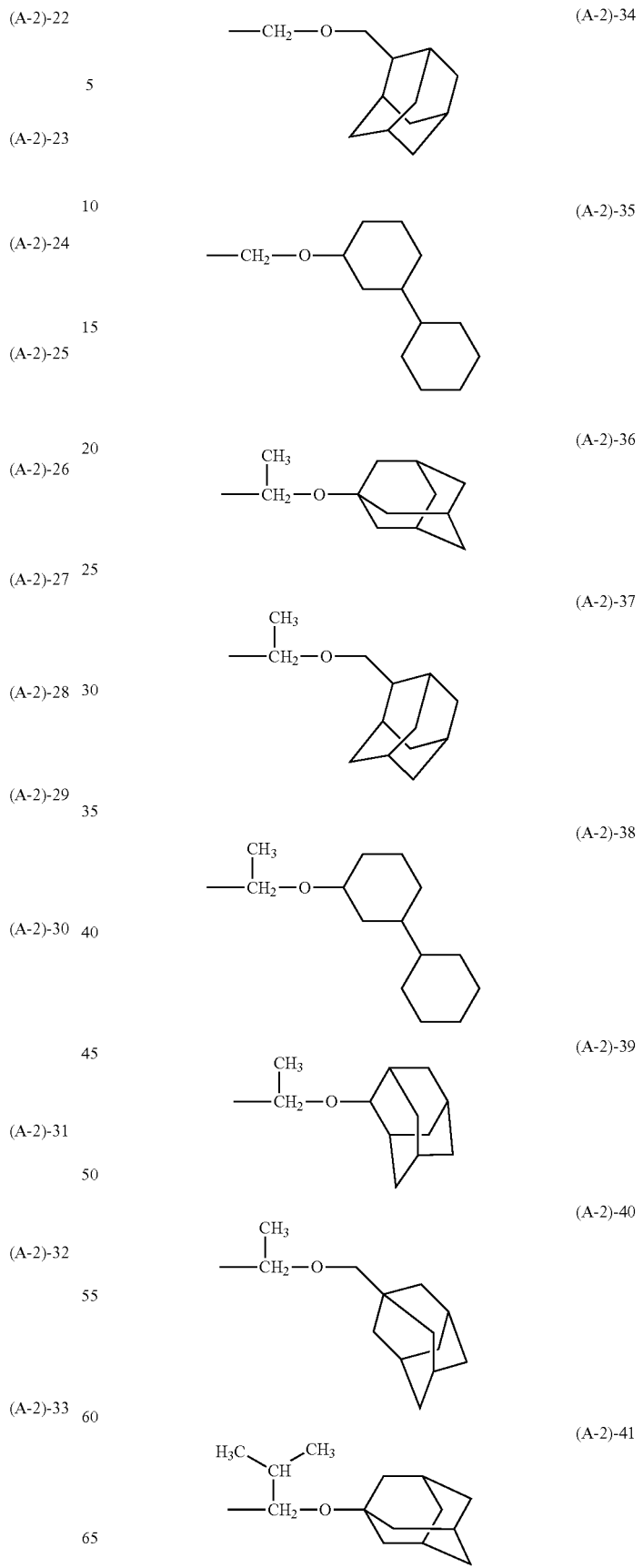

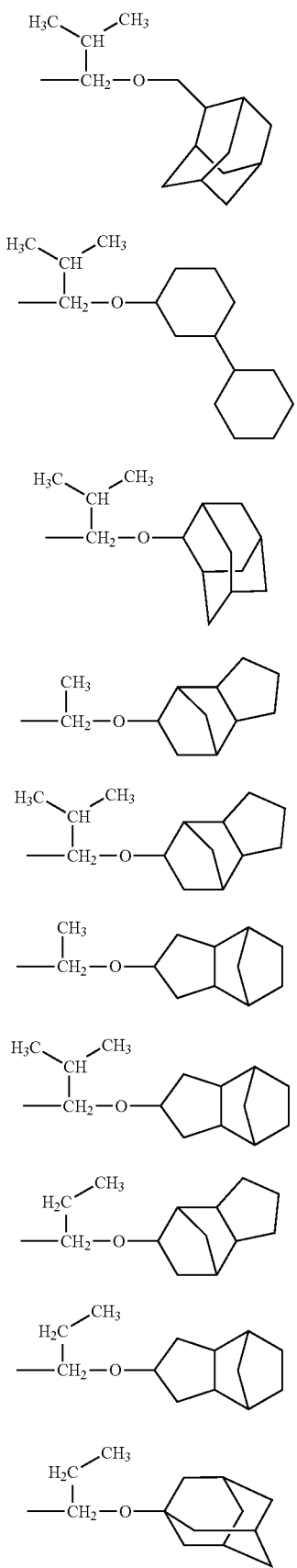

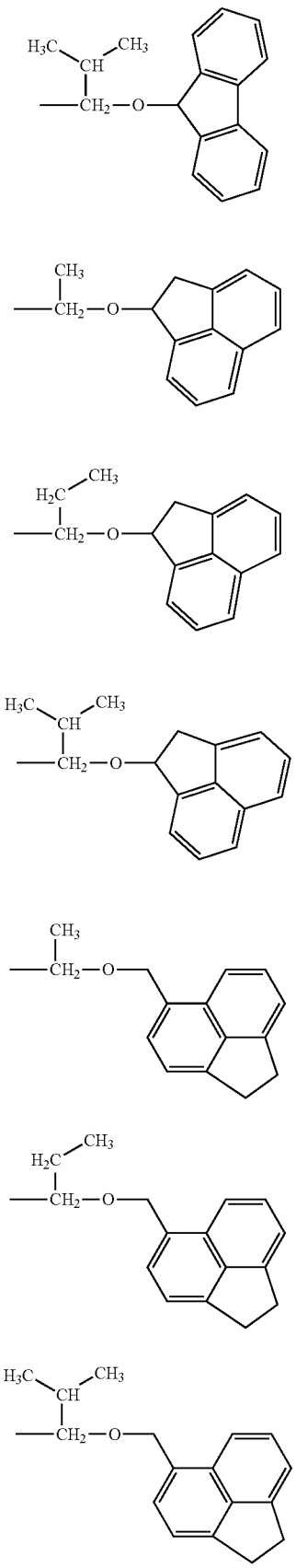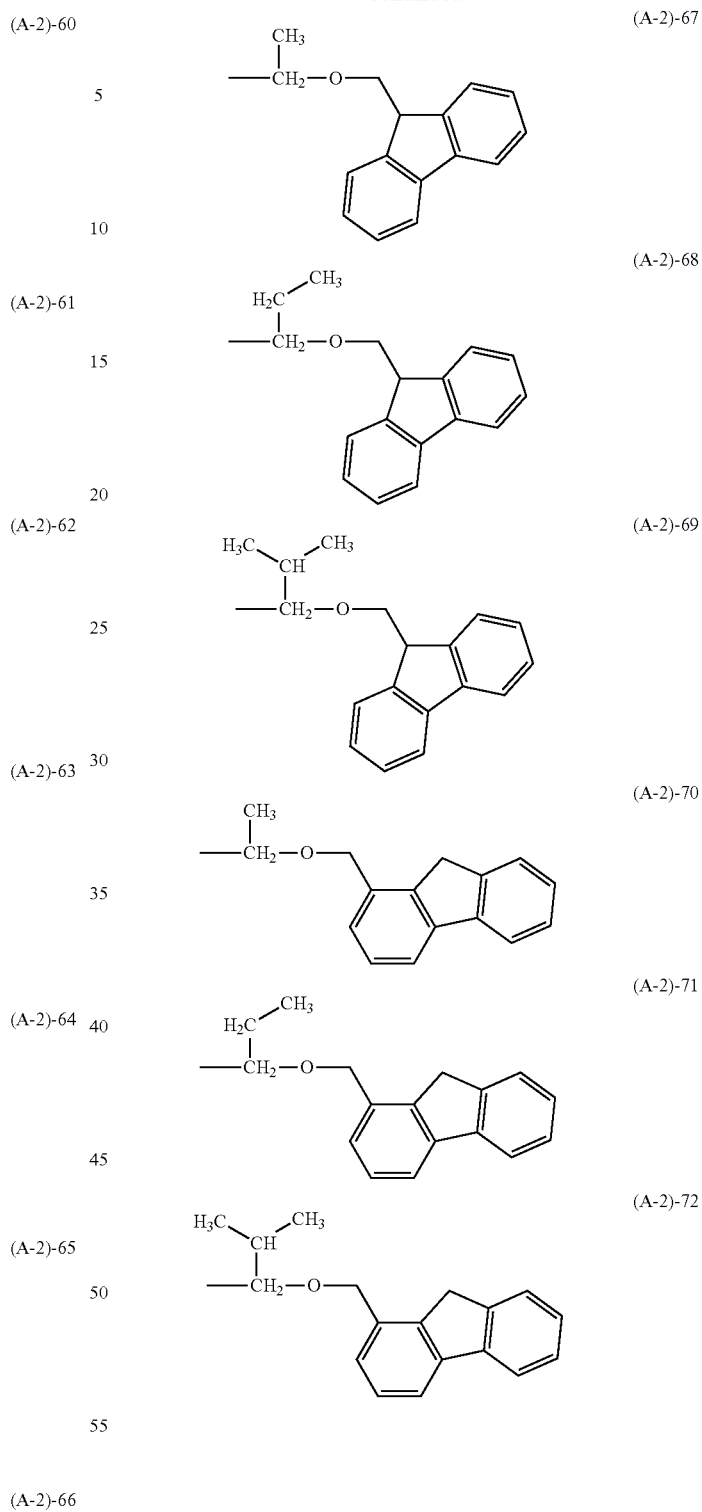

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer may be crosslinked within the molecule or between molecules with these acid labile groups.

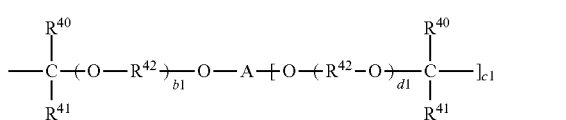
(A-2a)

(A-2)-100

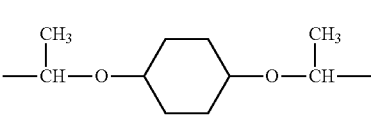
(A-2)-101

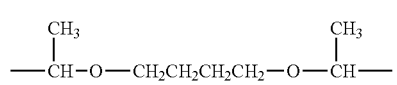
(A-2)-102

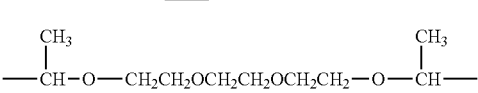
(A-2)-103

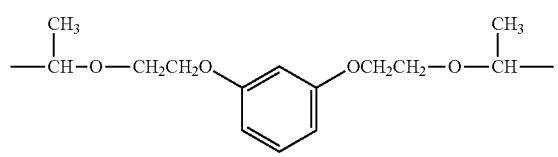
(A-2)-104

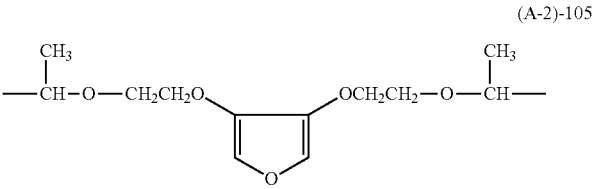
(A-2)-105

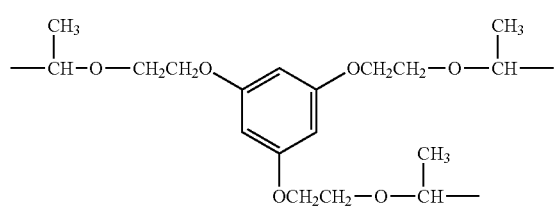
(A-2)-106

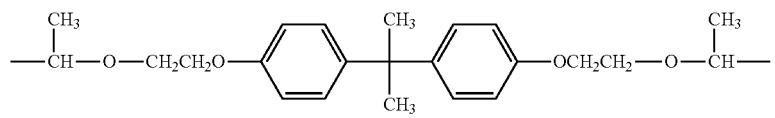
(A-2)-107

-continued

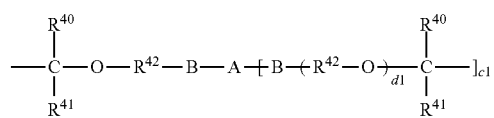
(A-2b)

Herein $R^{40}$ and $R^{41}$ each are hydrogen or a straight, branched or cyclic $C_1$-$C_8$ alkyl group, or $R^{40}$ and $R^{41}$, taken together, may form a ring with the carbon atom to which they are attached, and $R^{40}$ and $R^{41}$ are straight or branched $C_1$-$C_8$ alkylene groups when they form a ring. $R^{42}$ is a straight, branched or cyclic $C_1$-$C_{10}$ alkylene group. Each of b1 and d1 is 0 or an integer of 1 to 10, preferably 0 or an integer of 1 to 5, and c1 is an integer of 1 to 7. "A" is a (c1+1)-valent aliphatic or alicyclic saturated hydrocarbon group, aromatic hydrocarbon group or heterocyclic group having 1 to 50 carbon atoms, which may be separated by a heteroatom or in which some of the hydrogen atoms attached to carbon atoms may be substituted by hydroxyl, carboxyl, carbonyl radicals or fluorine atoms. "B" is —CO—O—, —NHCO—O— or —NH-CONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may contain a heteroatom or in which some of the hydrogen atoms attached to carbon atoms may be substituted by hydroxyl, carboxyl, acyl radicals or halogen atoms. The subscript c1 is preferably an integer of 1 to 3.

The crosslinking acetal groups of formulae (A-2a) and (A-2b) are exemplified by the following formulae (A-2)-100 through (A-2)-107.

In formula (A-3), $R^{34}$, $R^{35}$ and $R^{36}$ each are hydrogen, or a monovalent hydrocarbon group, typically a straight, branched or cyclic $C_1$-$C_{20}$ alkyl group, aryl group or alkenyl group, which may contain a heteroatom such as oxygen, sulfur, nitrogen or fluorine. A pair of $R^{34}$ and $R^{35}$, $R^{34}$ and $R^{36}$, or $R^{35}$ and $R^{36}$ may bond together to form a $C_3$-$C_{20}$ ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

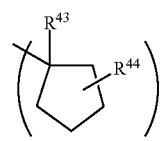
(A-3)-1

-continued
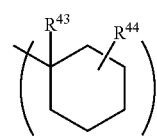
(A-3)-2
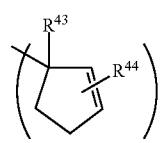
(A-3)-3
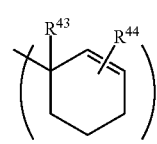
(A-3)-4
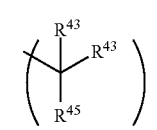
(A-3)-5
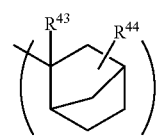
(A-3)-6
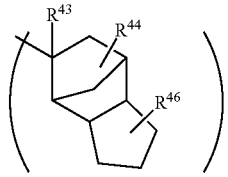
(A-3)-7
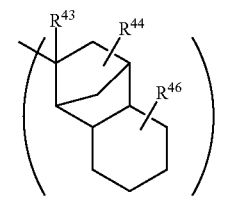
(A-3)-8
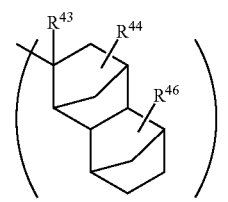
(A-3)-9
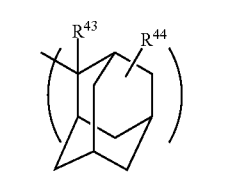
(A-3)-10
-continued
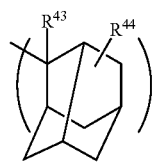
(A-3)-11
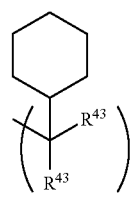
(A-3)-12
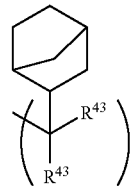
(A-3)-13
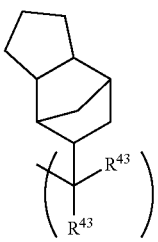
(A-3)-14
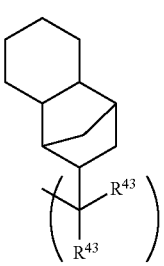
(A-3)-15
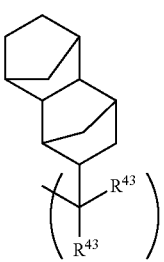
(A-3)-16
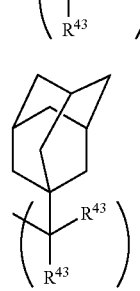
(A-3)-17

(A-3)-18

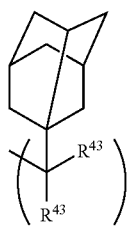

Herein $R^{43}$ is each independently a straight, branched or cyclic $C_1$-$C_8$ alkyl group or $C_6$-$C_{20}$ aryl group, typically phenyl or naphthyl. $R^{44}$ and $R^{46}$ each are hydrogen or a straight, branched or cyclic $C_1$-$C_{20}$ alkyl group. $R^{45}$ is a $C_6$-$C_{20}$ aryl group, typically phenyl.

The polymer may be crosslinked within the molecule or between molecules with groups having $R^{47}$ which is a di- or multi-valent alkylene or arylene group, as shown by the following formulae (A-3)-19 and (A-3)-20.

(A-3)-19

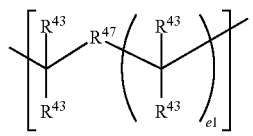

(A-3)-20

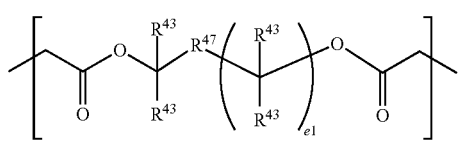

Herein $R^{43}$ is as defined above, $R^{47}$ is a straight, branched or cyclic $C_1$-$C_{20}$ alkylene group or arylene group, typically phenylene, which may contain a heteroatom such as oxygen, sulfur or nitrogen, and e1 is an integer of 1 to 3.

Examples of $R^{30}$, $R^{33}$ and $R^{36}$ in formulae (A-1), (A-2) and (A-3) include substituted or unsubstituted aryl groups such as phenyl, p-methylphenyl, p-ethylphenyl, and alkoxy-substituted phenyl groups, typically p-methoxyphenyl, and aralkyl groups such as benzyl and phenethyl, and modified forms of the foregoing groups in which an oxygen atom is introduced, and modified forms of alkyl groups in which a carbon-bonded hydrogen atom is replaced by a hydroxyl group, or two hydrogen atoms are replaced by an oxygen atom to form a carbonyl group, as represented by the following formulae, and oxoalkyl groups.

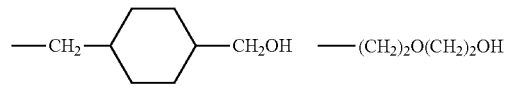
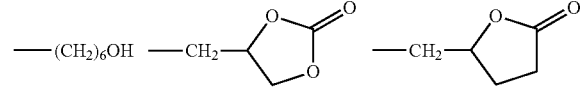

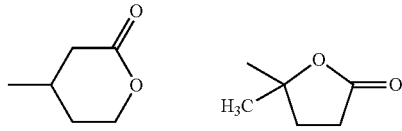

Of recurring units having acid labile groups of formula (A-3), recurring units of (meth)acrylate having an exo-form structure represented by the formula (A-3)-21 are preferred.

(A-3)-21

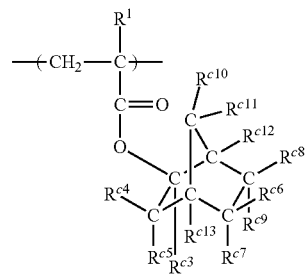

Herein, $R^1$ is as defined above; $R^{c3}$ is a straight, branched or cyclic $C_1$-$C_8$ alkyl group or an optionally substituted $C_6$-$C_{20}$ aryl group; $R^{c4}$ to $R^{c9}$, $R^{c12}$ and $R^{c13}$ are each independently hydrogen or a monovalent $C_1$-$C_{15}$ hydrocarbon group which may contain a heteroatom; and $R^{c10}$ and $R^{c11}$ are hydrogen. Alternatively, a pair of $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$, taken together, may form a non-aromatic ring with the carbon atom to which they are attached, and in that event, each ring-forming R is a divalent $C_1$-$C_{15}$ hydrocarbon group, typically alkylene which may contain a heteroatom. Also, a pair of $R^{c4}$ and $R^{c13}$, $R^{c10}$ and $R^{c13}$, or $R^{c6}$ and $R^{c8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

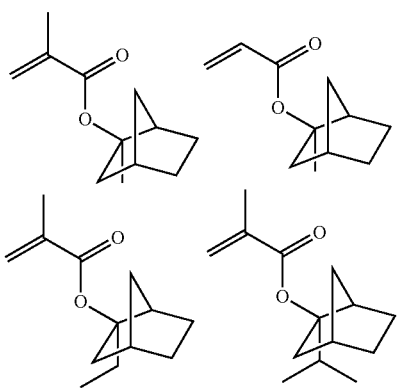

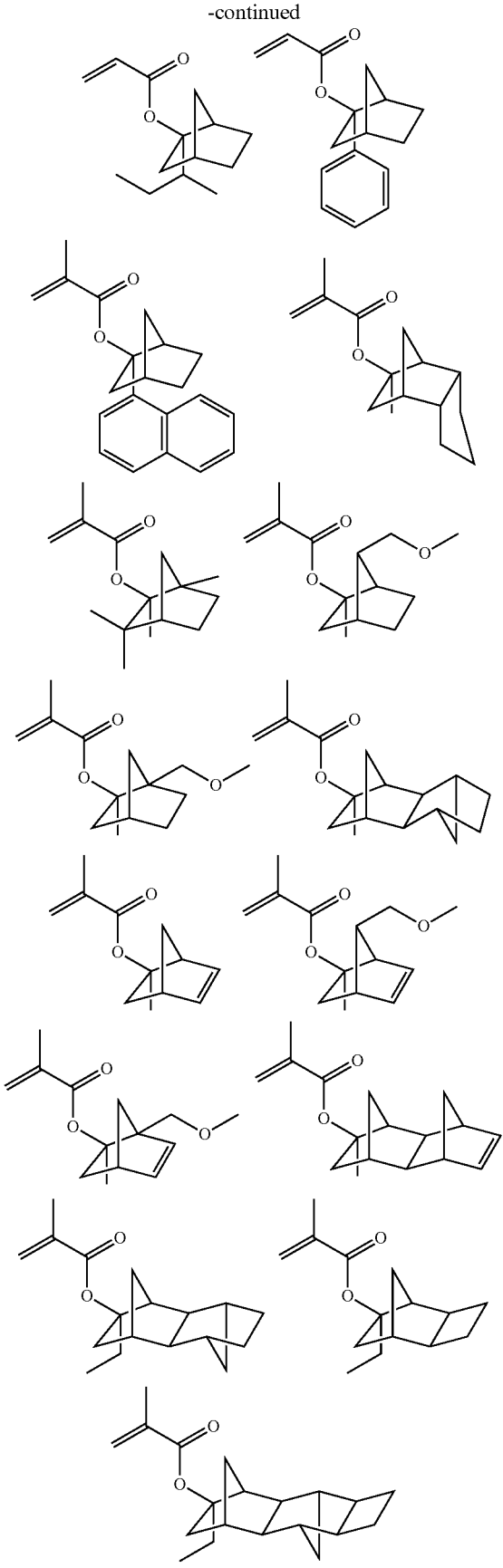

Also included in the acid labile groups of formula (A-3) are acid labile groups of (meth)acrylate having furandiyl, tetrahydrofurandiyl or oxanorbornanediyl as represented by the following formula (A-3)-22.

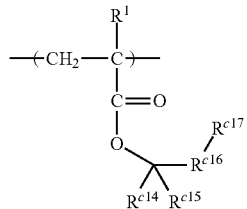

(A-3)-22

Herein, $R^1$ is as defined above. $R^{c14}$ and $R^{c15}$ are each independently a monovalent, straight, branched or cyclic $C_1$-$C_{10}$ hydrocarbon group, or $R^{c14}$ and $R^{c15}$, taken together, may form an aliphatic hydrocarbon ring with the carbon atom to which they are attached. $R^{c16}$ is a divalent group selected from furandiyl, tetrahydrofurandiyl and oxanorbornanediyl. $R^{c17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

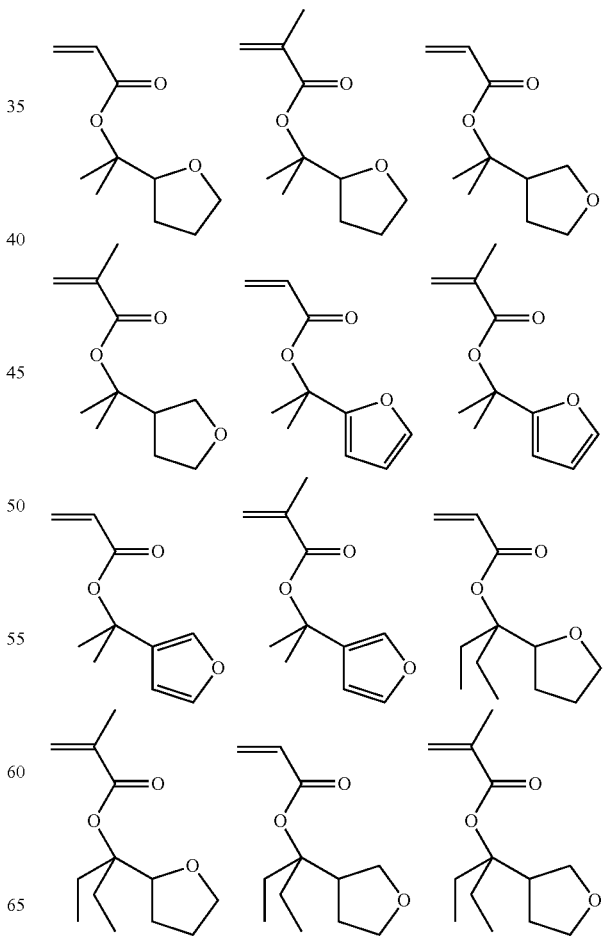

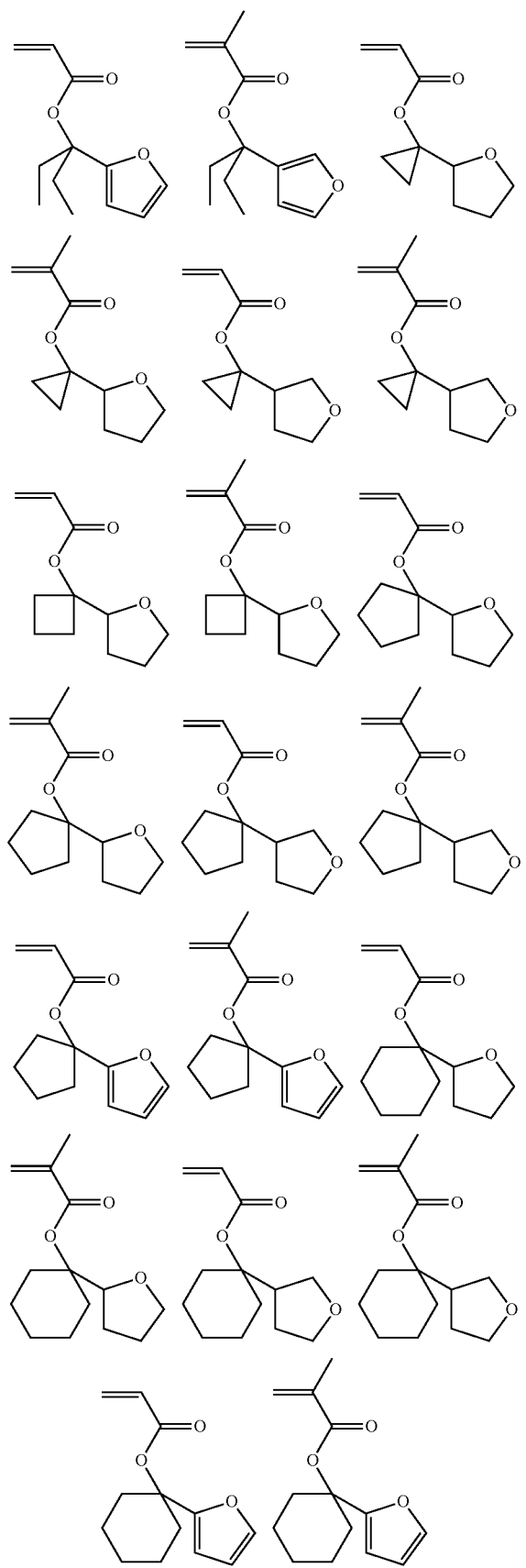
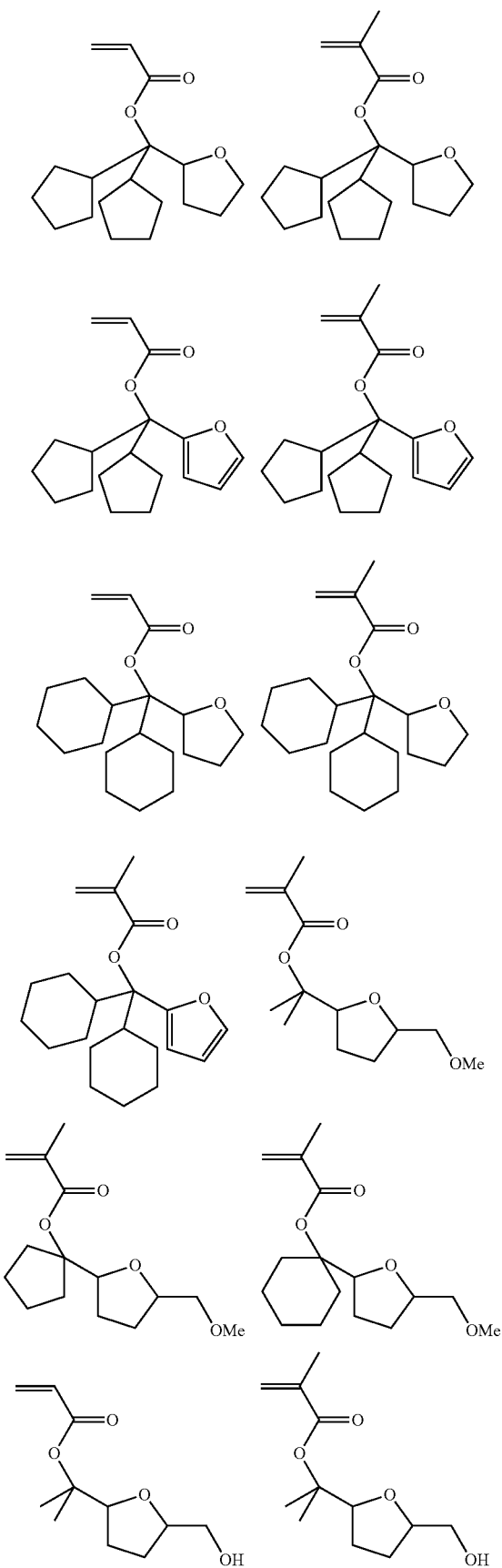

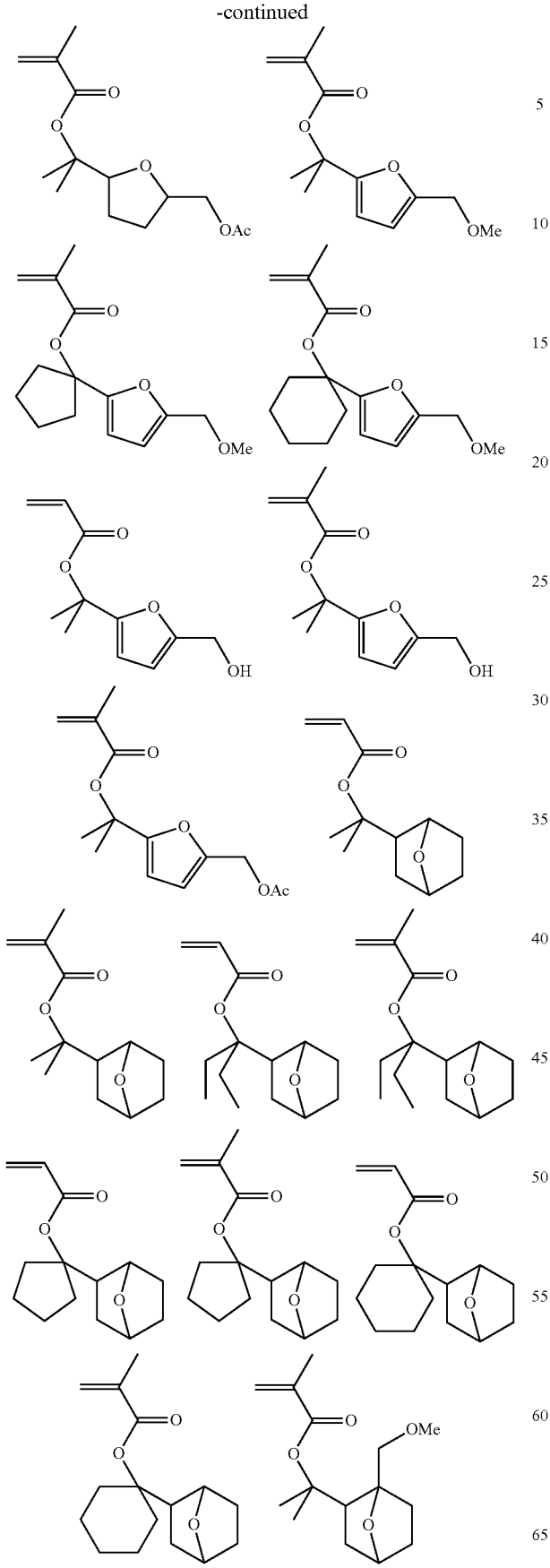
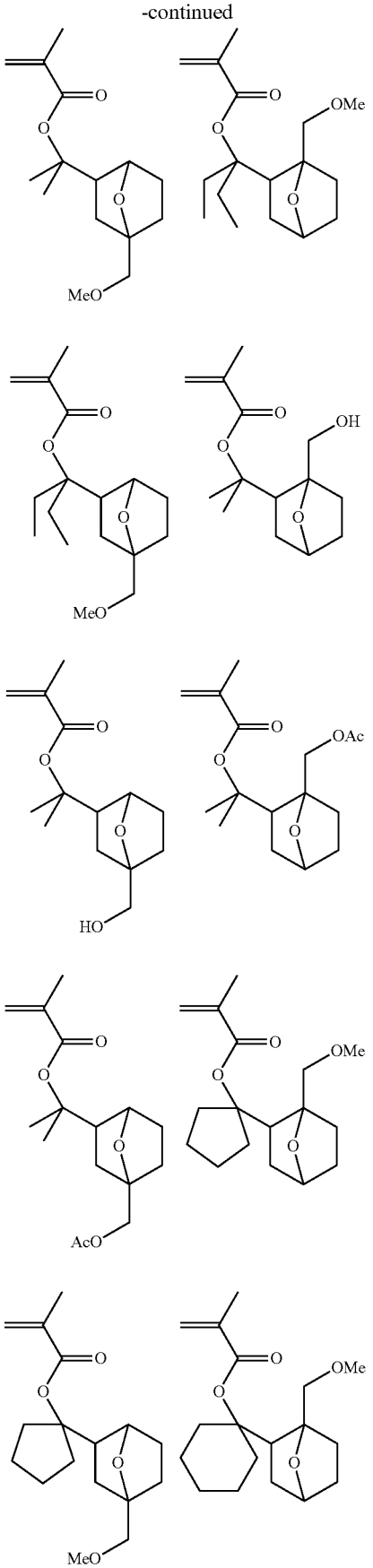

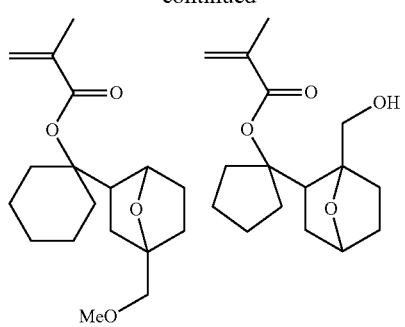
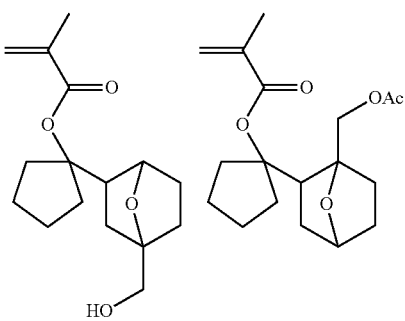
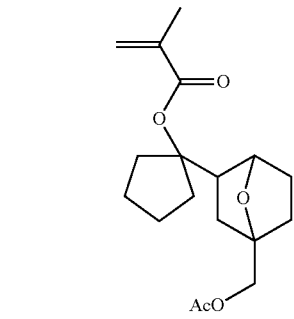
As the recurring units having an acid labile group, recurring units having a secondary acid labile group may also be copolymerized. Examples of suitable monomers from which units having a secondary acid labile group are derived are given below.
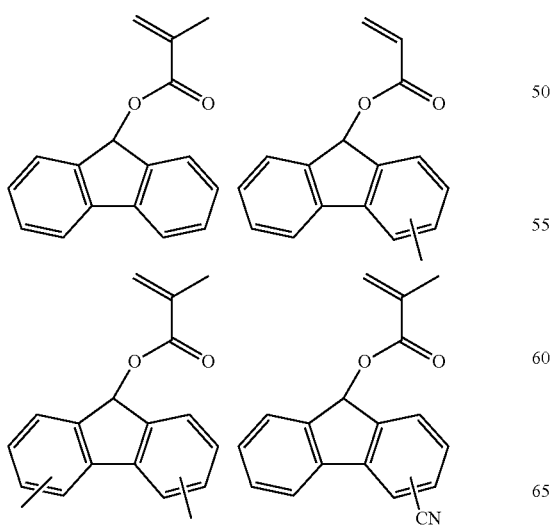
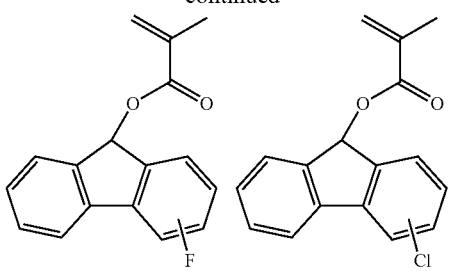
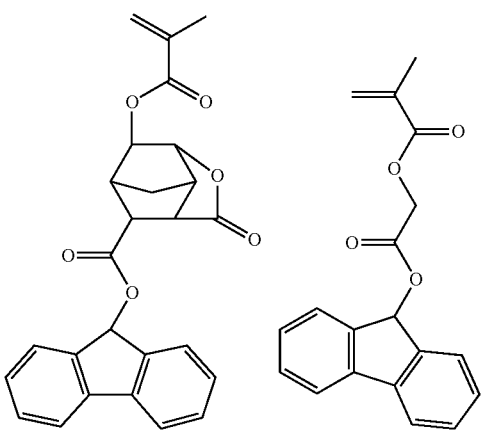
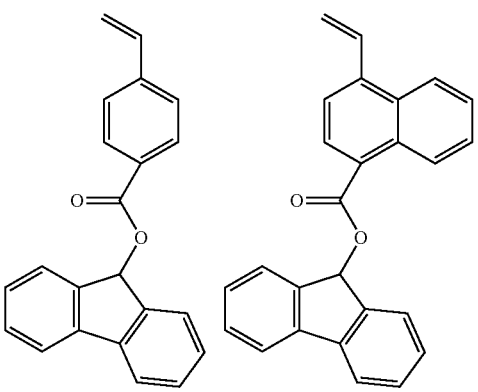
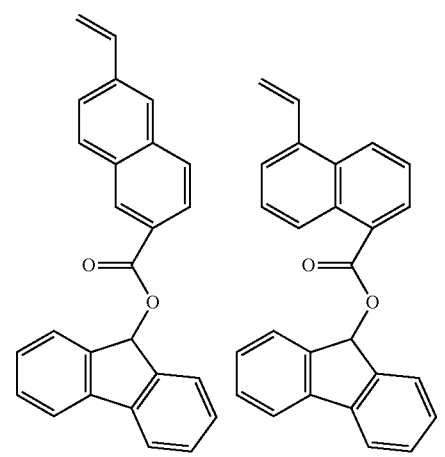

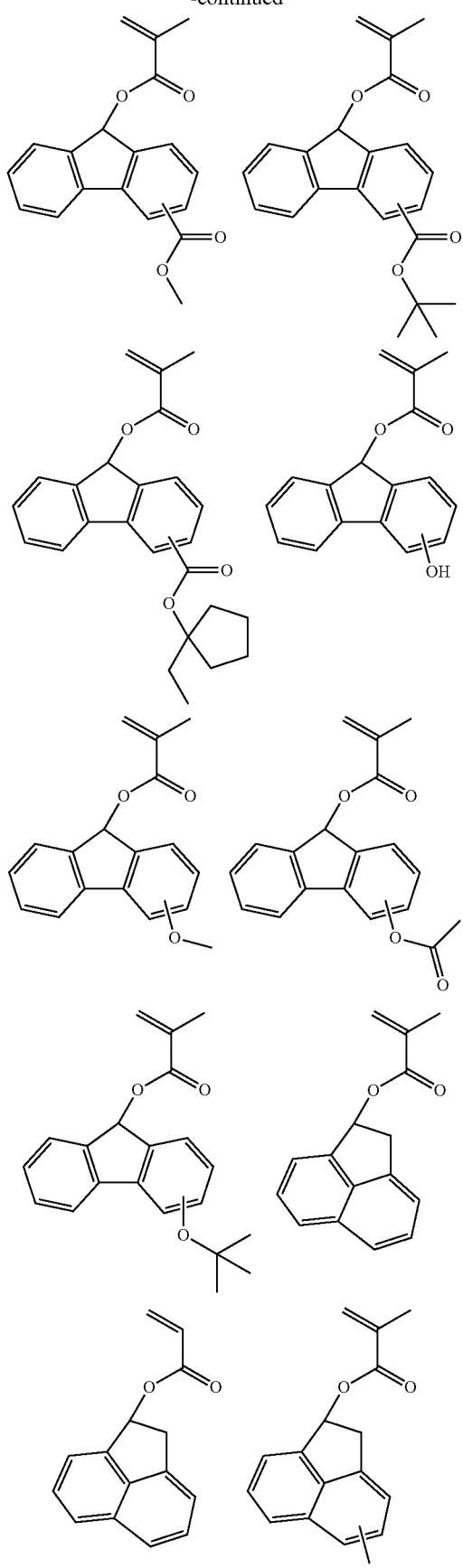
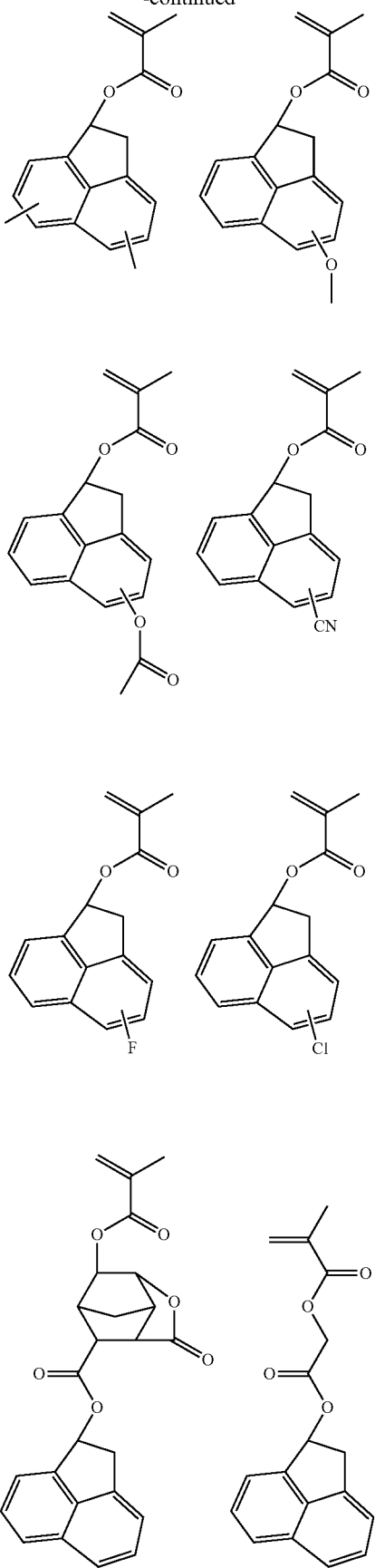

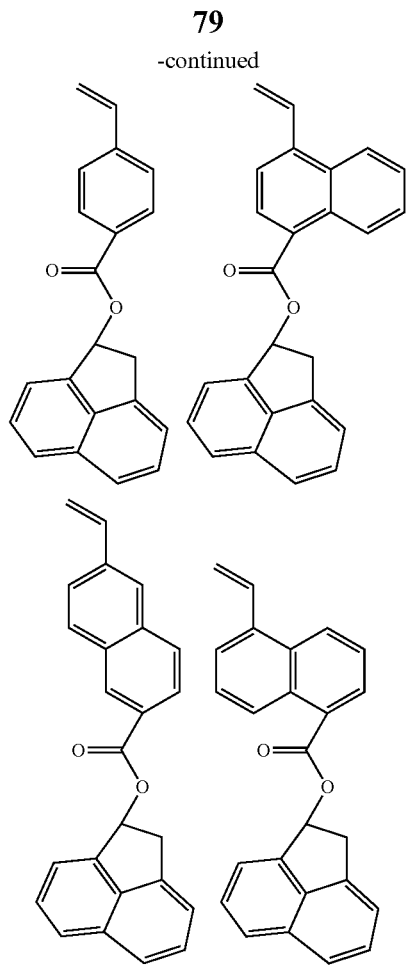

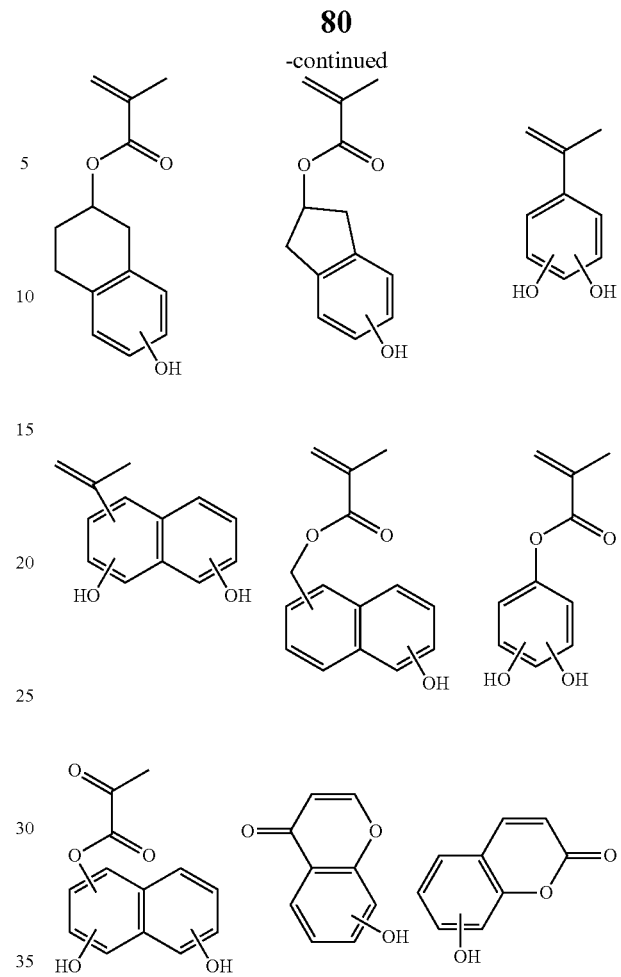

In addition to recurring units (a1) of (meth)acrylate, styrenecarboxylic acid and vinylnaphthalenecarboxylic acid having an acid labile group substituted thereon, and recurring units (a2) of hydroxystyrene having an acid labile group substituted thereon, the base polymer in the chemically amplified positive resist composition may have further copolymerized therein recurring units (b) having a phenolic hydroxyl group as an adhesive group. Examples of suitable monomers from which recurring units (b) having a phenolic hydroxyl group are derived are given below.

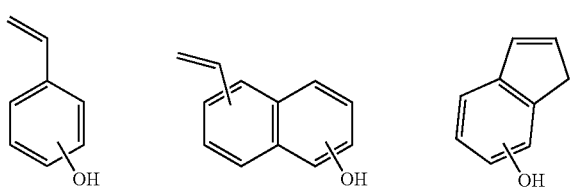

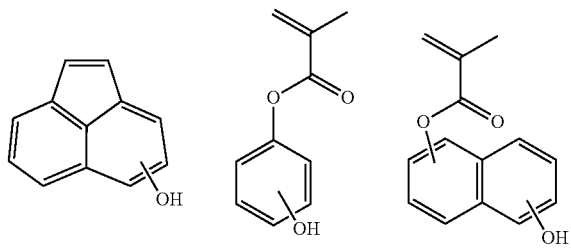

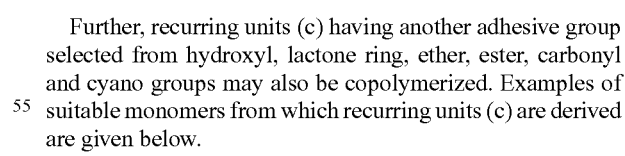

Further, recurring units (c) having another adhesive group selected from hydroxyl, lactone ring, ether, ester, carbonyl and cyano groups may also be copolymerized. Examples of suitable monomers from which recurring units (c) are derived are given below.

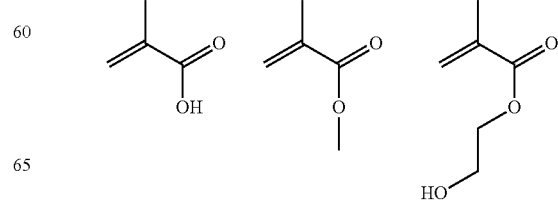

81
-continued
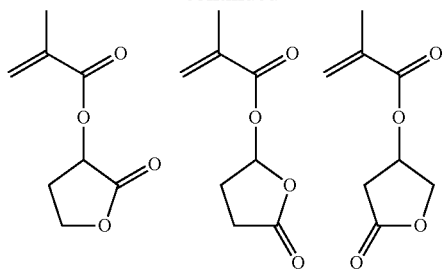
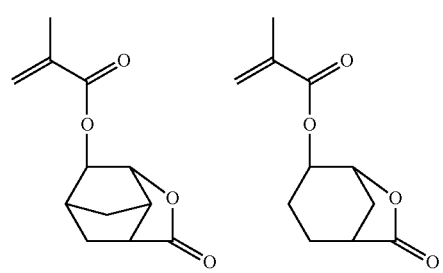
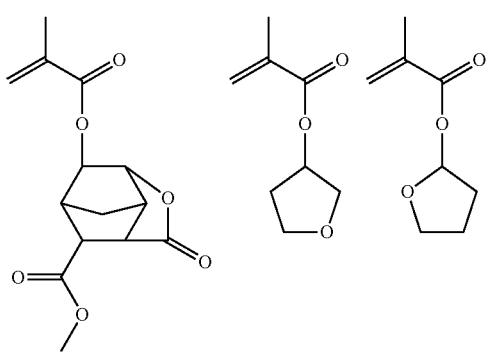
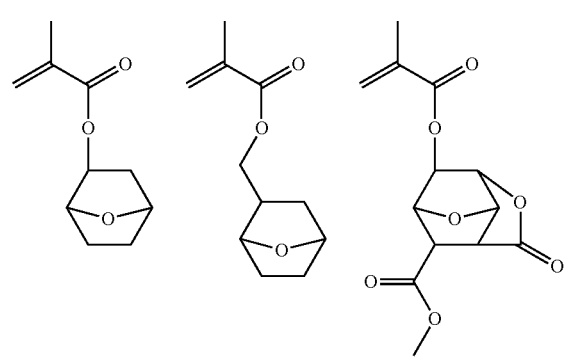
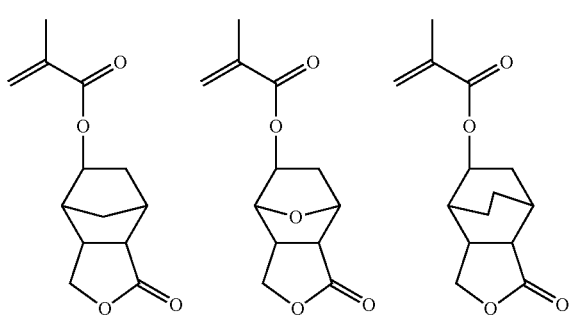
82
-continued
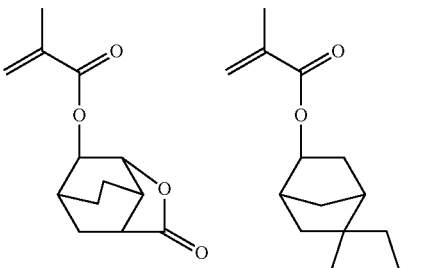
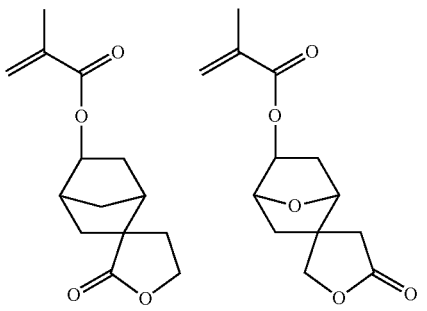
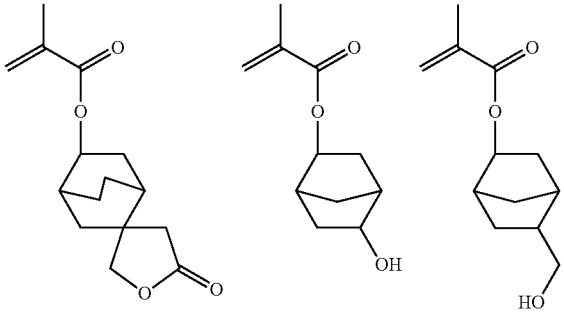
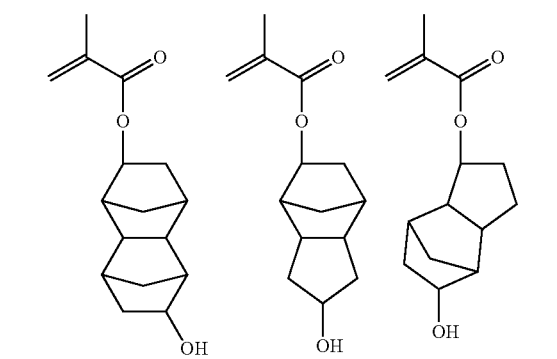
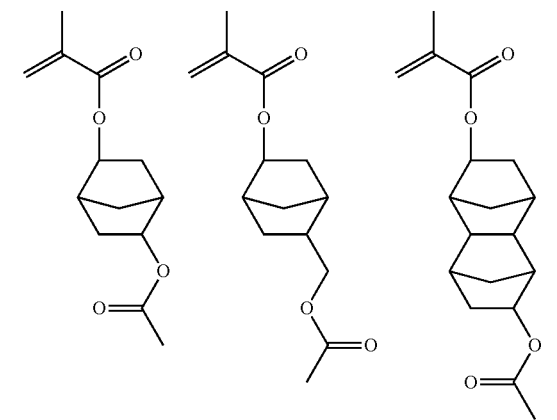

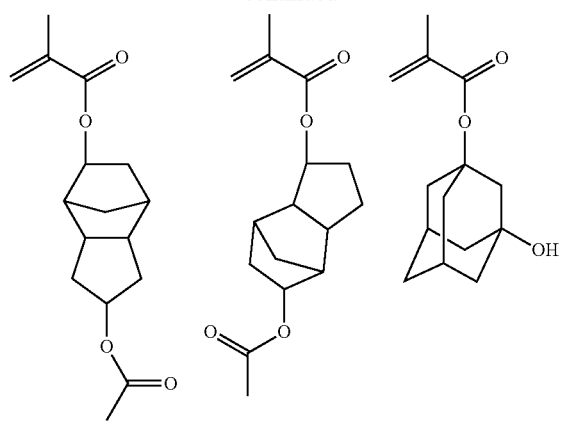
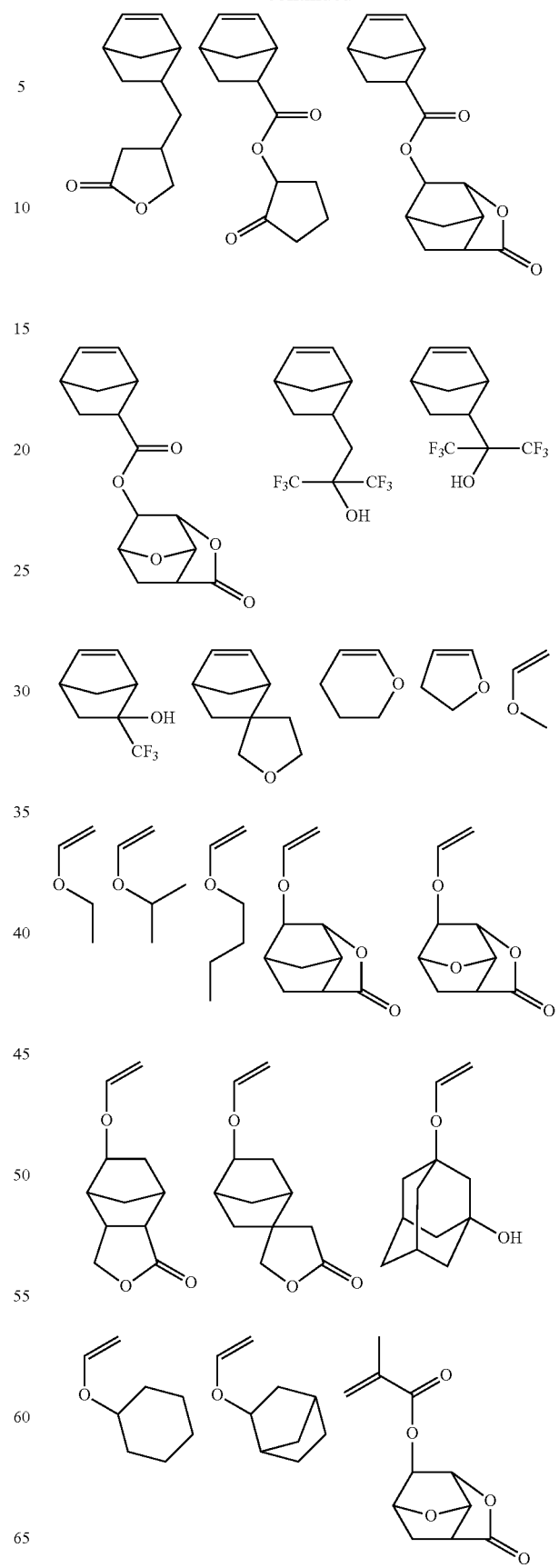

85
-continued
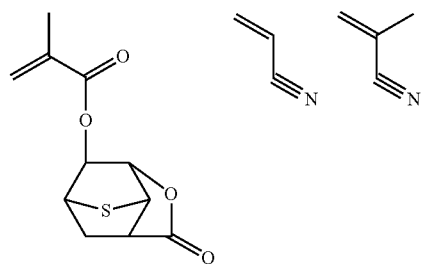
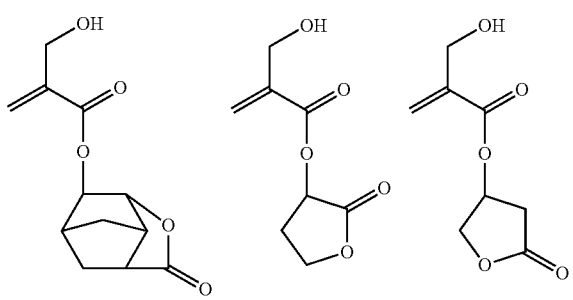
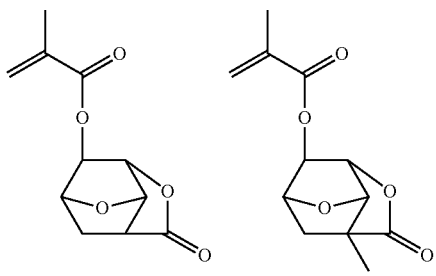
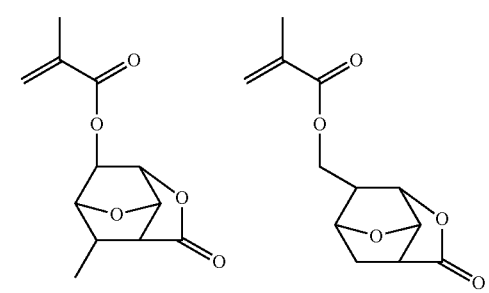
86
-continued
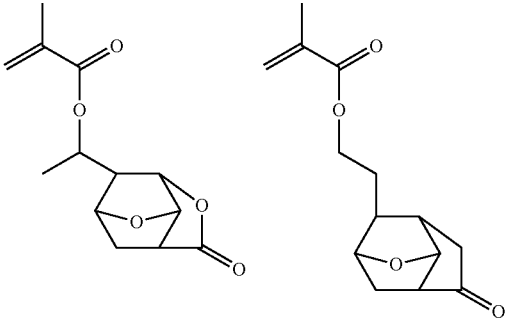
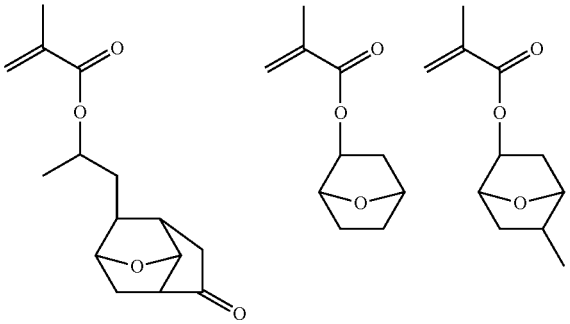
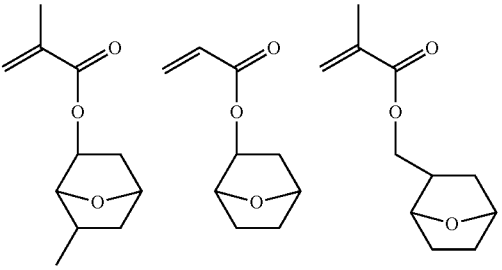
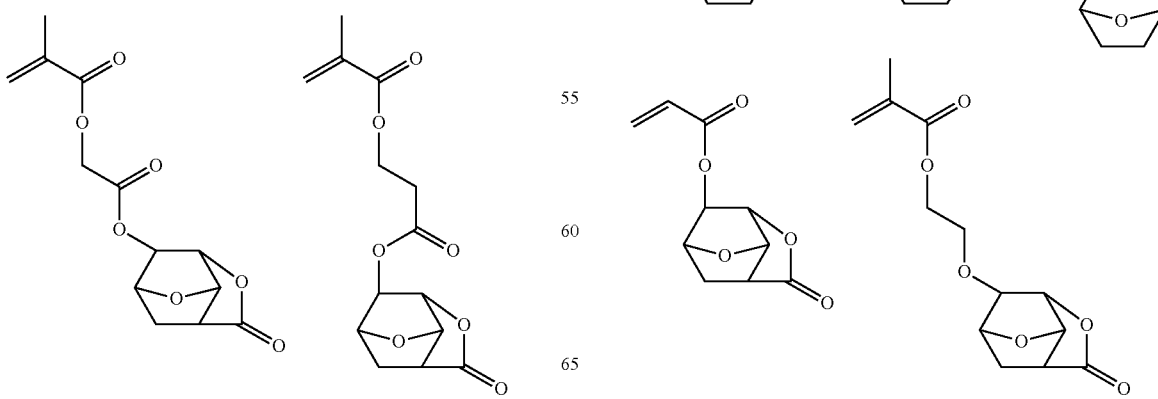

87
-continued
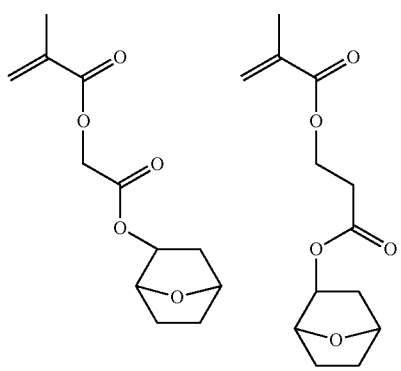
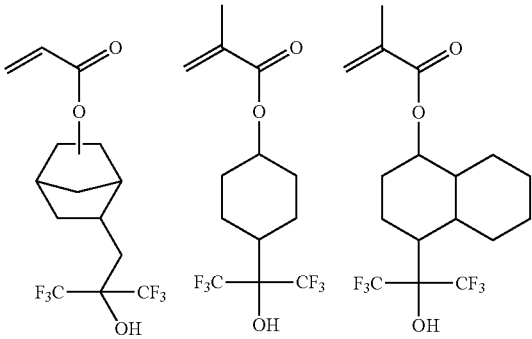
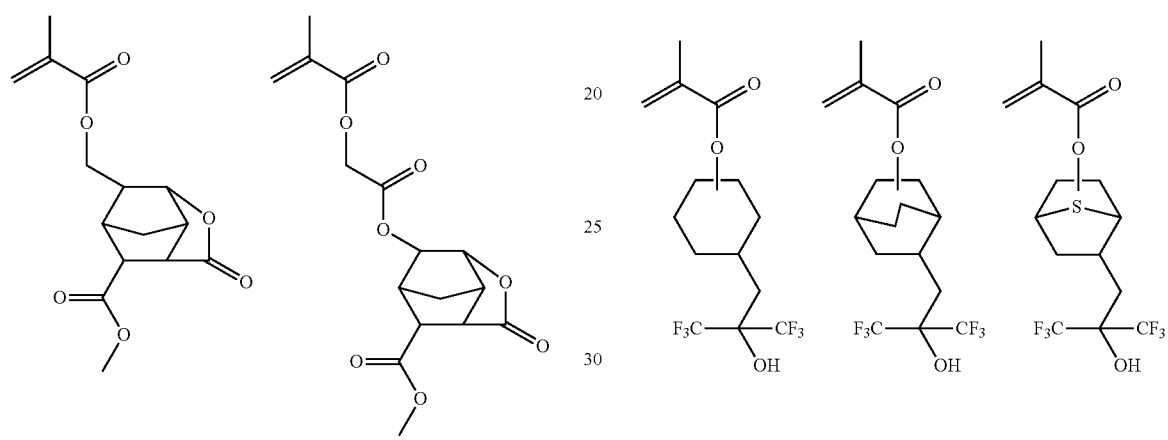
88
-continued
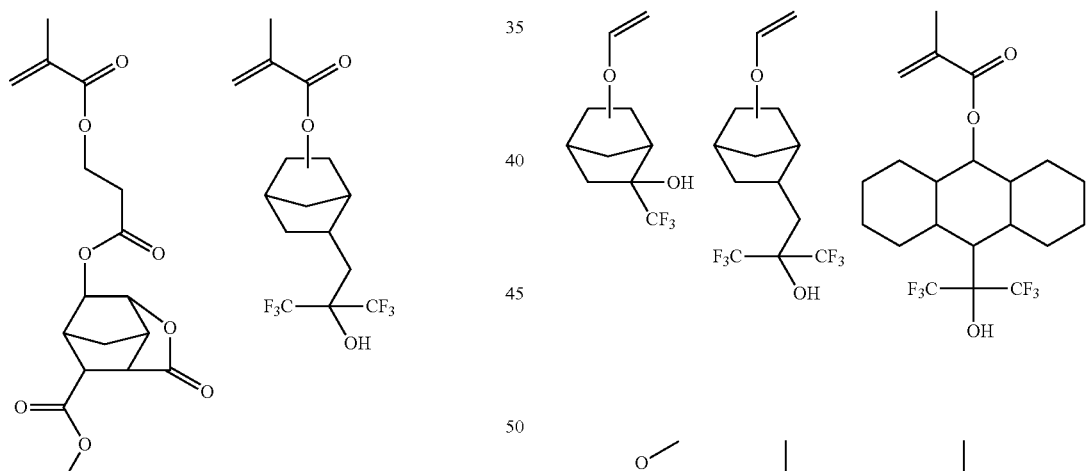
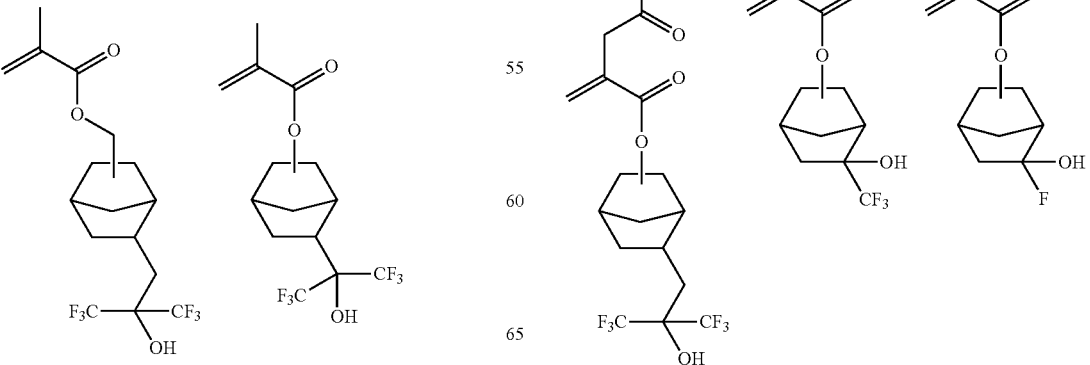

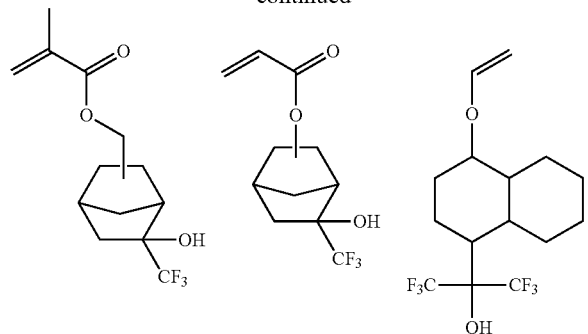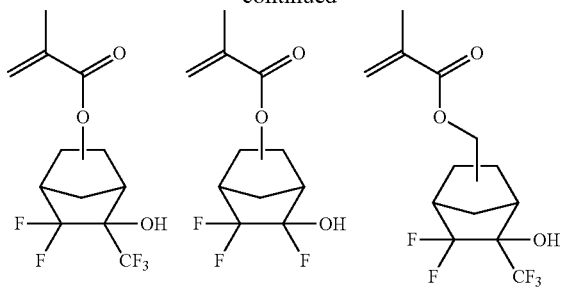

-continued
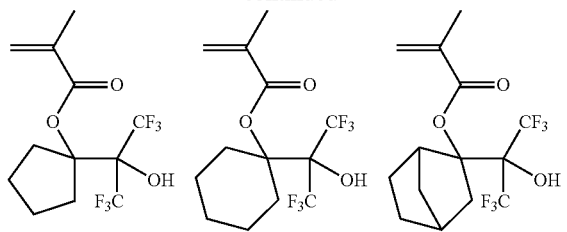
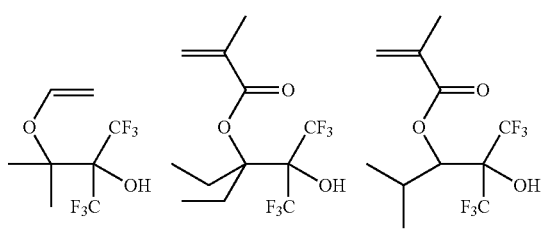
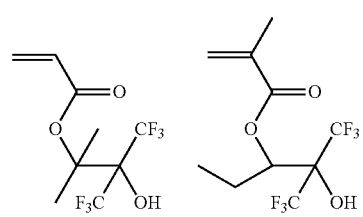
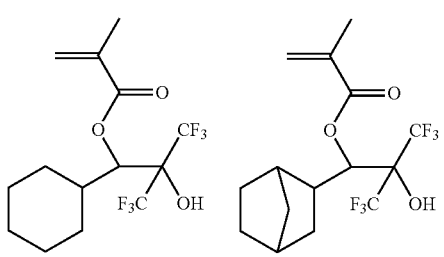
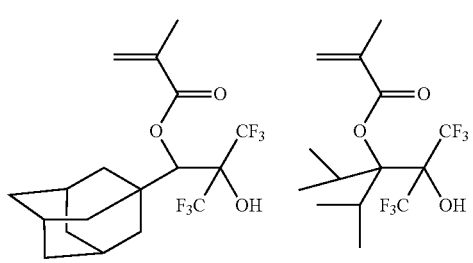
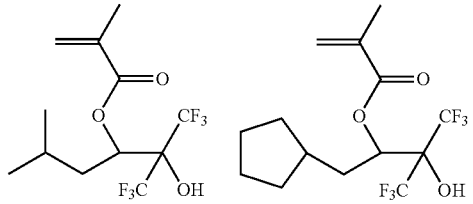
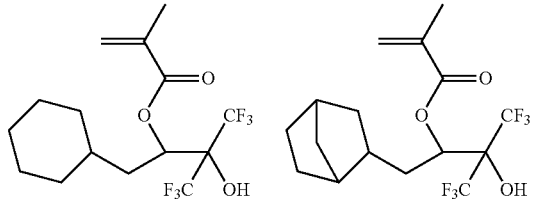
-continued
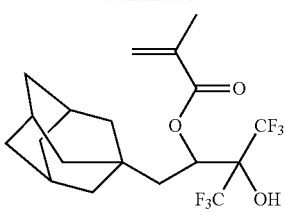
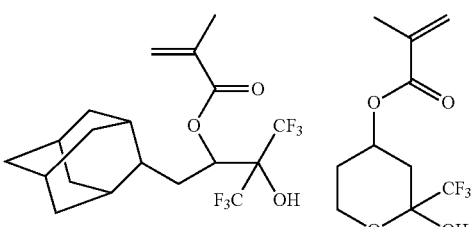
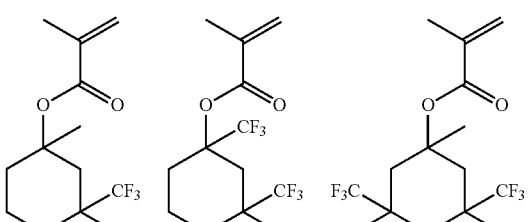
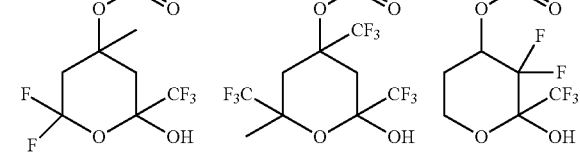
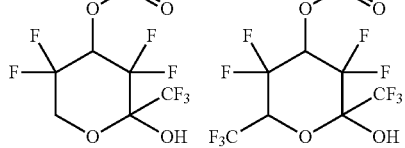
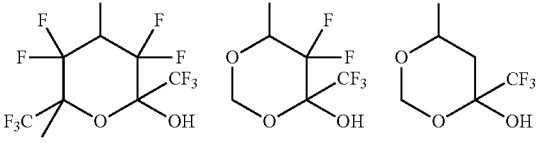
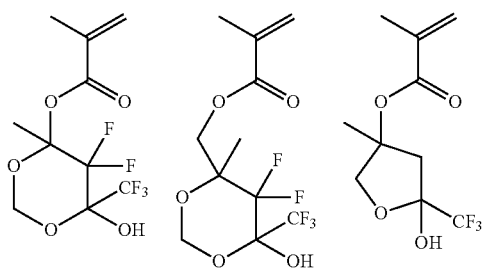

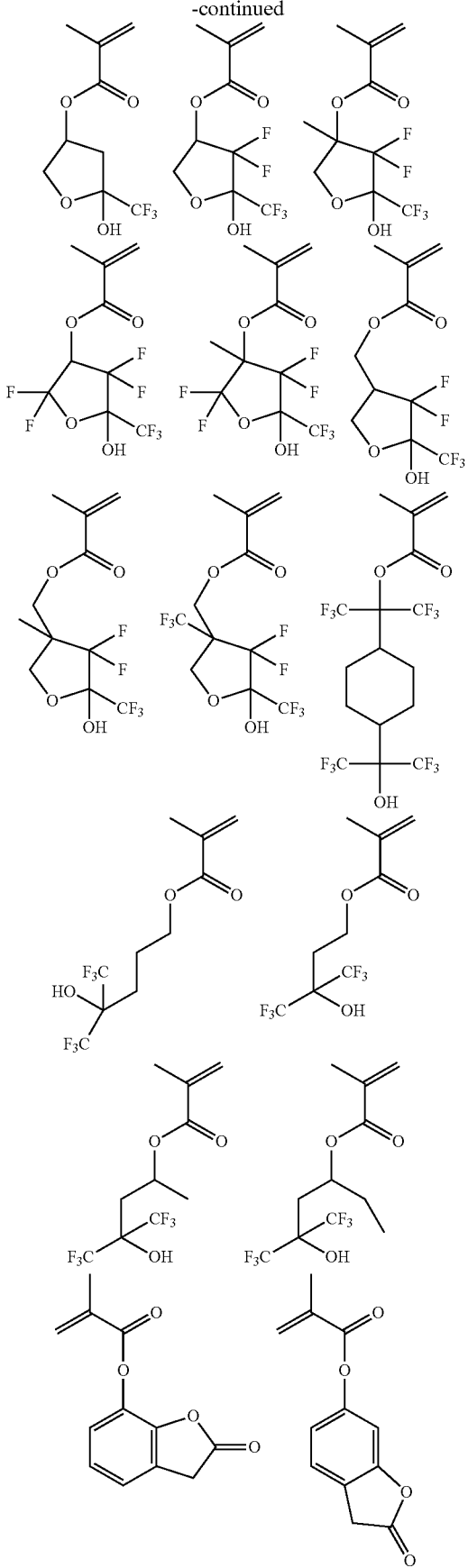
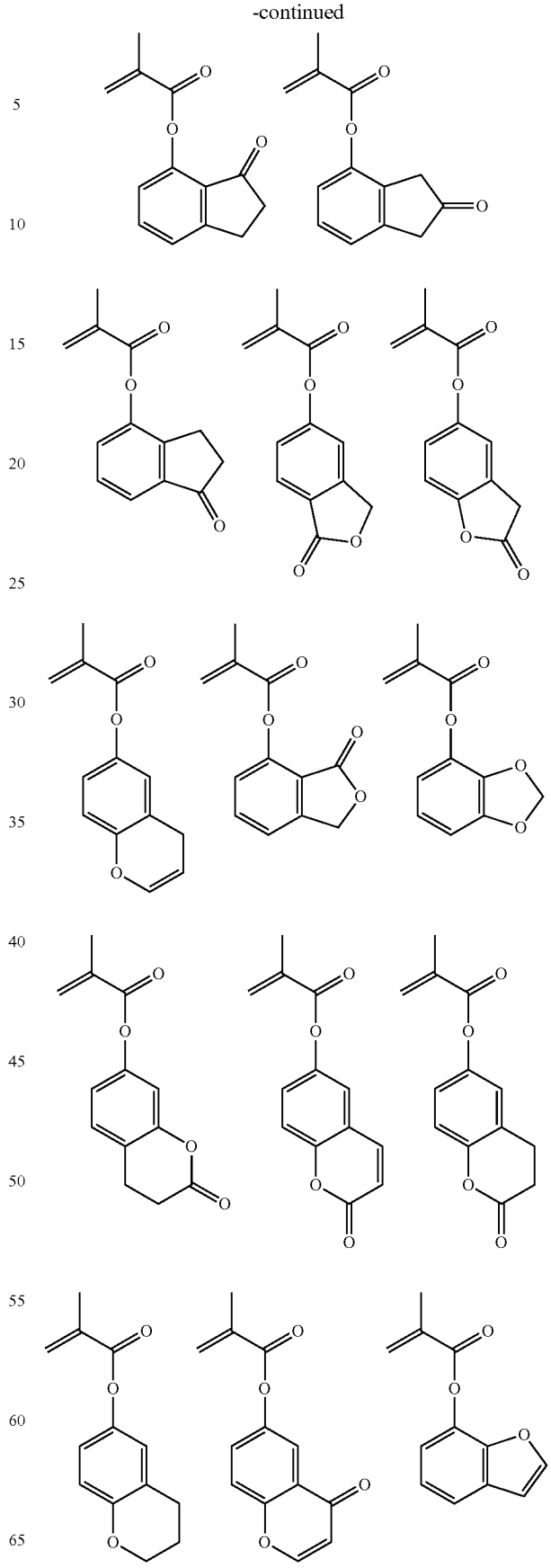

95
-continued
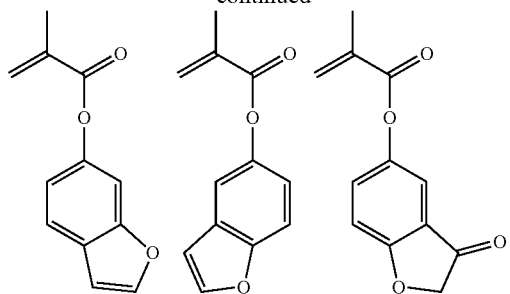
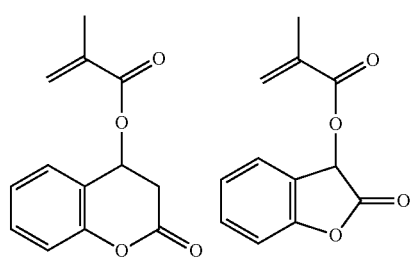
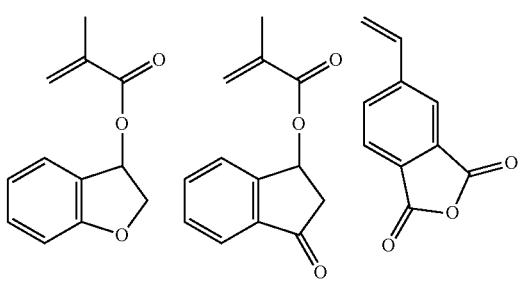
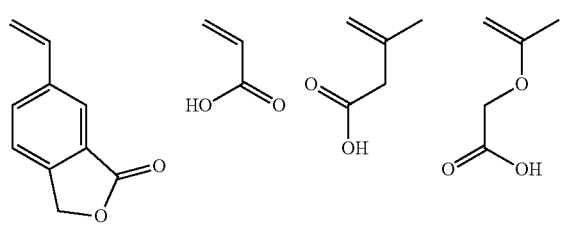
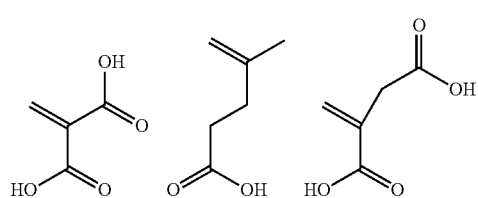
96
-continued
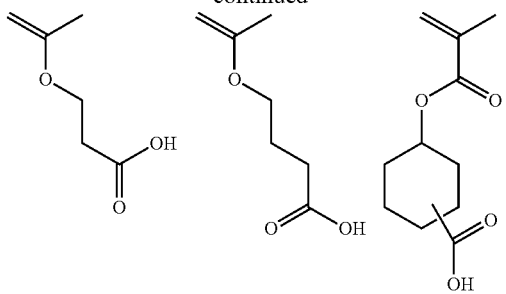

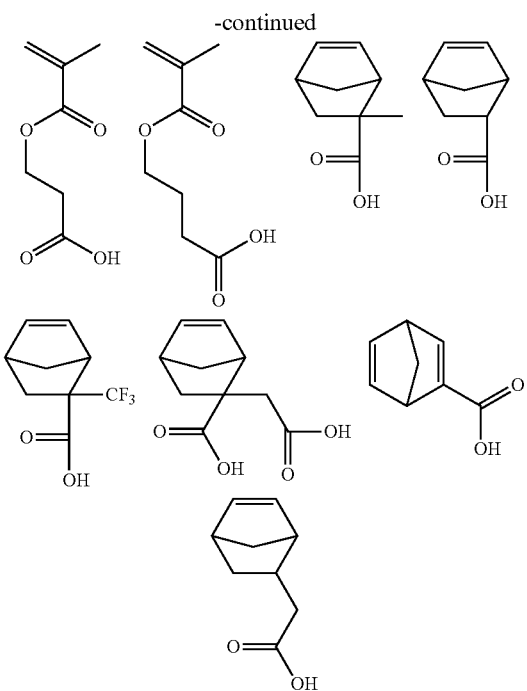

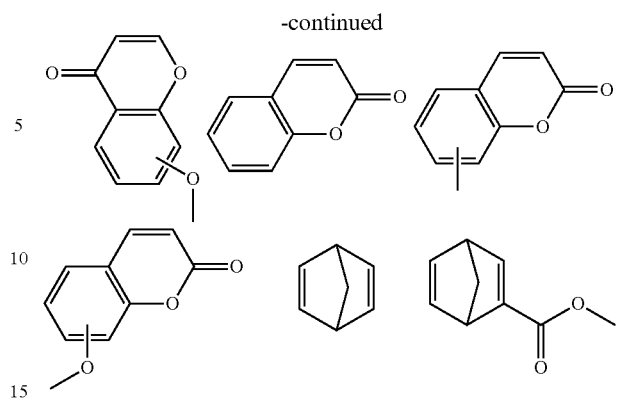

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxy group may be replaced by an acetyl, formyl, pivaloyl or similar group prior to polymerization, and the polymerization be followed by alkaline hydrolysis.

In another preferred embodiment, the copolymer may have further copolymerized therein recurring units (d) selected from units of indene, benzofuran, benzothiophene, acenaphthylene, chromone, coumarin, and norbornadiene, or derivatives thereof. Suitable monomers are exemplified below.

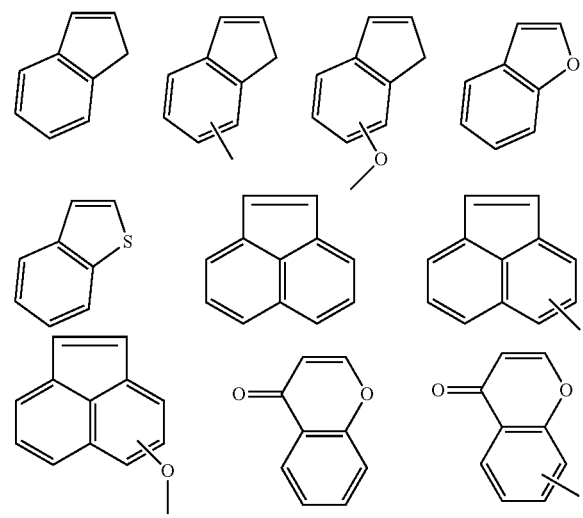

Besides the recurring units described above, further recurring units can be copolymerized, examples of which include styrene, vinylnaphthalene, vinyl anthracene, vinylpyrene, methyleneindene, vinylpyridine, and vinylcarbazole.

In a further embodiment, an acid generator (f) in the form of an onium salt having polymerizable olefin may be copolymerized with the foregoing monomers. JP-A H04-230645, JP-A 2005-084365, and JP-A 2006-045311 disclose sulfonium salts having polymerizable olefin capable of generating a sulfonic acid and similar iodonium salts. JP-A 2006-178317 discloses a sulfonium salt having sulfonic acid directly attached to the main chain.

In this embodiment, the copolymer may have further copolymerized therein recurring units having a sulfonium salt (f1) to (f3) represented by the general formula (3).

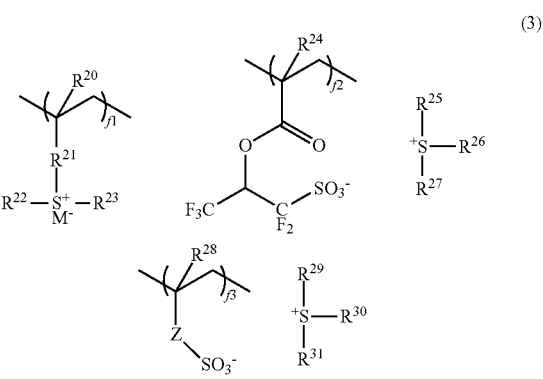

(3)

Herein $R^{20}$, $R^{24}$ and $R^{28}$ each are hydrogen or methyl. $R^{21}$ is a single bond, phenylene, —O—$R^{28}$—, or —C(=O)—Y—$R^{28}$— wherein Y is oxygen or NH and $R^{28}$ is a straight, branched or cyclic $C_1$-$C_6$ alkylene group, phenylene group or alkenylene group, which may contain a carbonyl (—CO—), ester (—COO—), ether (—O—) or hydroxyl radical. $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl group, $C_7$-$C_{20}$ aralkyl group, or thiophenyl group. Z is a single bond, methylene, ethylene, phenylene, fluorinated phenylene, —O—$R^{32}$—, or —C(=O)—$Z_1$—$R^{32}$— wherein $Z_1$ is oxygen or NH and $R^{32}$ is a straight, branched or cyclic $C_1$-$C_6$ alkylene group, phenylene group or alkenylene group, which may contain a carbonyl, ester, ether or hydroxyl radical.

$M^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluoroblenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; methidates such as tris(trifluoromethylsulfonyl)methide and tris(perfluoroethylsulfonyl)methide.

Also included are sulfonates having fluorine substituted at α-position as represented by the general formula (K-1) and sulfonates having fluorine substituted at α- and β-positions as represented by of the general formula (K-2).

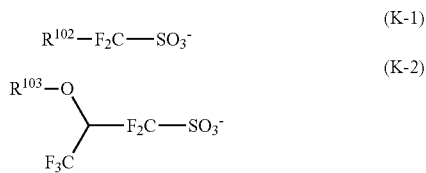

In formula (K-1), $R^{102}$ is hydrogen, or a straight, branched or cyclic $C_1$-$C_{20}$ alkyl group, $C_2$-$C_{20}$ alkenyl group, or $C_6$-$C_{20}$ aryl group, which may have an ether, ester, carbonyl radical, lactone ring, or fluorine atom. In formula (K-2), $R^{103}$ is hydrogen, or a straight, branched or cyclic $C_1$-$C_{30}$ alkyl or acyl group, $C_2$-$C_{20}$ alkenyl group, or $C_6$-$C_{20}$ aryl or aryloxy group, which may have an ether, ester, carbonyl radical or lactone ring.

Onium salts such as sulfonium salts, iodonium salts and ammonium salts of sulfonic acids which are not fluorinated at α-position as described in US 2008153030 (JP-A 2008-158339) and similar onium salts of carboxylic acid may also be used as the quencher. While an α-position fluorinated sulfonic acid, imidic acid, and methidic acid are necessary to deprotect the acid labile group of carboxylic acid ester, an α-position non-fluorinated sulfonic acid and a carboxylic acid are released by salt exchange with an onium salt which is not fluorinated at α-position. An α-position non-fluorinated sulfonic acid and a carboxylic acid function as a quencher because they do not induce deprotection reaction. In particular, since sulfonium salts and iodonium salts of an α-position non-fluorinated sulfonic acid and a carboxylic acid are photo-decomposable, those portions receiving a high light intensity are reduced in quenching capability and increased in the concentration of a α-position fluorinated sulfonic acid, imidic acid, or methidic acid. As a result, the exposed portions are improved in contrast. When a negative tone pattern is formed using an organic solvent, the improvement in the contrast of exposed portions leads to an improvement in the rectangularity of negative pattern. Onium salts including sulfonium salts, iodonium salts and ammonium salts of an α-position non-fluorinated sulfonic acid and a carboxylic acid are highly effective in controlling the diffusion of an α-position fluorinated sulfonic acid, imidic acid and methidic acid. This is because the onium salt resulting from salt exchange is less mobile due to a higher molecular weight. In the event that a hole pattern is formed by a negative tone phenomenon, since acid is generated in many regions, it is very important to control the diffusion of acid from the exposed area to the unexposed area. The addition of onium salts including sulfonium salts, iodonium salts and ammonium salts of an α-position non-fluorinated sulfonic acid and a carboxylic acid as well as the amine quencher defined herein is very important from the aspect of controlling acid diffusion.

The attachment of an acid generator to the polymer main chain is effective in restraining acid diffusion, thereby preventing a reduction of resolution due to blur by acid diffusion. Also roughness (LER or LWR) is improved since the acid generator is uniformly distributed.

The base polymer for formulating the positive resist composition comprises recurring units (a1) and/or (a2) having an acid labile group as essential components and additional recurring units (b), (c), (d), (e), (f1), (f2) and/or (f3) as optional components. A copolymerization proportion of units (a1), (a2), (b), (c), (d), (e), (f1), (f2) and (f3) is: $0 \leq a1 < 1.0$, $0 \leq a2 < 1.0$, $0 < a1+a2 < 1.0$, $0 \leq b \leq 0.9$, $0 \leq c \leq 0.9$, $0 \leq d \leq 0.8$, $0 \leq e \leq 0.8$, $0 \leq f1 \leq 0.5$, $0 \leq f2 \leq 0.5$, and $0 \leq f3 \leq 0.5$; preferably $0 \leq a1 \leq 0.9$, $0 \leq a2 \leq 0.9$, $0.1 \leq a1+a2 \leq 0.9$, $0 \leq b \leq 0.8$, $0 \leq c \leq 0.8$, $0 \leq d \leq 0.7$, $0 \leq e \leq 0.7$, $0 \leq f1 \leq 0.4$, $0 \leq f2 \leq 0.4$, and $0 \leq f3 \leq 0.4$; and more preferably $0 \leq a1 \leq 0.8$, $0 \leq a2 \leq 0.8$, $0.1 \leq a1+a2 \leq 0.8$, $0 \leq b \leq 0.75$, $0 \leq c \leq 0.75$, $0 \leq d \leq 0.6$, $0 \leq e \leq 0.6$, $0 \leq f1 \leq 0.3$, $0 \leq f2 \leq 0.3$, and $0 \leq f3 \leq 0.3$. Note $a1+a2+b+c+d+e+f1+f2+f3=1.0$.

For the base polymer for formulating the negative resist composition, an acid labile group is not necessarily essential. The base polymer comprises recurring units (b), (c), (d), (e), (f1), (f2) and (f3) in a copolymerization proportion: $0 < b \leq 1.0$, $0 \leq c \leq 1.0$, $0 \leq d \leq 0.8$, $0 \leq e \leq 0.8$, $0 \leq f1 \leq 0.5$, $0 \leq f2 \leq 0.5$, and $0 \leq f3 \leq 0.5$; preferably $0.2 \leq b \leq 1.0$, $0 \leq c \leq 0.8$, $0 \leq d \leq 0.7$, $0 \leq e \leq 0.7$, $0 \leq f1 \leq 0.4$, $0 \leq f2 \leq 0.4$, and $0 \leq f3 \leq 0.4$; and more preferably $0.3 \leq b \leq 1.0$, $0 \leq c \leq 0.75$, $0 \leq d \leq 0.6$, $0 \leq e \leq 0.6$, $0 \leq f1 \leq 0.3$, $0 \leq f2 \leq 0.3$, and $0 \leq f3 \leq 0.3$. Note $b+c+d+e+f1+f2+f3=1.0$.

These polymers may be synthesized by any desired methods, for example, by dissolving one or more monomers selected from the monomers to form the recurring units (a1), (a2), (b), (c), (d), (e), (f1), (f2) and (f3) in an organic solvent, adding a radical polymerization initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis as mentioned above, for thereby converting the polymer product to polyhydroxystyrene or hydroxypolyvinylnaphthalene. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

The polymer used in the resist composition should preferably have a weight average molecular weight (Mw) in the range of 1,000 to 500,000, and more preferably 2,000 to 30,000, as measured by gel permeation chromatography (GPC) versus polystyrene standards using tetrahydrofuran as a solvent. With too low a Mw, the resist composition may become less heat resistant. A polymer with too high a Mw may lose alkaline solubility and give rise to a footing phenomenon after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The basic compound of formula (1) is advantageously used in a chemically amplified positive or negative resist composition having an acid generator added thereto. Specifically, the basic compound is added to the polymer serving as a base resin, which may be further combined with any desired components including an organic solvent, dissolution inhibitor, surfactant, crosslinker and the like to formulate a positive or negative resist composition. This positive or negative resist composition has a very high sensitivity in that the dissolution rate in developer of the polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs or photomasks. Particularly when an acid generator is incorporated to formulate a chemically amplified positive resist composition capable of utilizing acid catalyzed reaction, the composition has a higher sensitivity and is further improved in the properties described above.

In the case of positive resist compositions, inclusion of a dissolution inhibitor may lead to an increased difference in dissolution rate between exposed and unexposed areas and a further improvement in resolution. In the case of negative resist compositions, a negative pattern may be formed by adding a crosslinker to reduce the dissolution rate of exposed area.

Any conventional basic compounds may be added along with the basic compound of formula (1) for thereby suppressing the diffusion rate of acid in the resist film or correcting the pattern profile. Addition of a surfactant may improve or control the coating characteristics of the resist composition.

The positive or negative resist composition may include an acid generator in order for the composition to function as a chemically amplified positive or negative resist composition in the pattern forming process defined herein. Typical of the acid generator used herein is a photoacid generator (PAG) capable of generating an acid in response to actinic light or radiation. It is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in U.S. Pat. No. 7,537,880 (JP-A 2008-111103, paragraphs [0122] to [0142]).

While the resist composition of the invention should comprise the base polymer, the basic compound, and the acid generator, described above, it may further comprise an organic solvent, dissolution inhibitor, crosslinker, surfactant, acetylene alcohol, and conventional basic compound, alone or in combination.

Examples of the organic solvent used herein are described in JP-A 2008-111103, paragraphs [0144] to [0145] (U.S. Pat. No. 7,537,880). Exemplary solvents include ketones such as cyclohexanone, cyclopentanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture. Conventional basic compounds are described in JP-A 2008-111103, in paragraphs [0146] to [0164], and exemplary surfactants in paragraphs [0165] to [0166]. Exemplary dissolution inhibitors are described in JP-A 2008-122932 (US 2008090172), paragraphs [0155] to [0178], and exemplary acetylene alcohols in paragraphs [0179] to [0182]. Exemplary crosslinkers are described in JP-A 2008-249951, in paragraphs [0062] to [0066]. Also useful are quenchers of polymer type as described in JP-A 2008-239918. The polymeric quencher segregates at the resist surface after coating and thus enhances the rectangularity of resist pattern. When a protective film is applied as is often the case in the immersion lithography, the polymeric quencher is also effective for preventing slimming of resist pattern or rounding of pattern top.

In a preferred embodiment, the respective components are used in the following amounts, provided that all amounts are expressed in parts by weight relative to 100 parts by weight of the base polymer. An amount of the PAG used is 0.1 to 50 parts, and more preferably 1 to 40 parts. An amount of the organic solvent used is 100 to 10,000 parts, and more preferably 200 to 8,000 parts. In positive resist compositions, an amount of the dissolution inhibitor blended is 0 to 50 parts, and more preferably 5 to 40 parts. In negative resist compositions, an amount of the crosslinker blended is 0.1 to 50 parts, and more preferably 1 to 40 parts. An amount of the surfactant blended is 0.0001 to 10 parts. An amount of the acetylene alcohol blended is 0 to 5 parts. An amount of the conventional basic compound other than the basic compound of formula (1) is 0 to 5 parts, and more preferably 0 to 4 parts. An amount of the polymeric quencher is 0 to 5 parts, and more preferably 0 to 4 parts.

Process

The positive resist composition, typically chemically amplified positive resist composition comprising a base polymer, a basic compound of formula (1), and an acid generator in an organic solvent is used in the fabrication of various integrated circuits. Pattern formation using the resist composition may be performed by well-known lithography processes. The process generally involves coating, heat treatment (or prebaking), exposure, heat treatment (post-exposure baking, PEB), and development. If necessary, any additional steps may be added.

The positive resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, MoSi, or $SiO_2$) by a suitable coating technique such as spin coating, roll coating, flow coating, dipping, spraying or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 μm thick.

The resist film is then exposed to a desired pattern of high-energy radiation such as UV, deep-UV, electron beam, x-ray, excimer laser light, γ-ray, synchrotron radiation or EUV (soft x-ray), directly or through a mask. The exposure dose is preferably about 1 to 200 mJ/cm$^2$, more preferably about 10 to 100 mJ/cm$^2$, or 0.1 to 100 μC/cm$^2$, more preferably 0.5 to 50 μC/cm$^2$. The resist film is further baked on a hot plate at 60 to 150° C. for 10 seconds to 30 minutes, preferably 80 to 120° C. for 30 seconds to 20 minutes (post-exposure baking=PEB).

Thereafter the resist film is developed with a developer in the form of an aqueous base solution for 3 seconds to 3 minutes, preferably 5 seconds to 2 minutes by conventional techniques such as dip, puddle and spray techniques. A typical developer is a 0.1 to 5 wt %, preferably 2 to 3 wt % aqueous solution of tetramethylammonium hydroxide (TMAH). The resist film in the exposed area is dissolved in the developer whereas the resist film in the unexposed area is not dissolved. In this way, the desired positive pattern is formed on the substrate. It is appreciated that the resist composition of the invention is best suited for micro-patterning using such high-energy radiation as EB, EUV (soft x-ray), x-ray, γ-ray and synchrotron radiation among others.

From the chemically amplified negative resist composition, a pattern may be formed by well-known lithography processes.

EXAMPLE

Examples and Comparative Examples are given below for further illustrating the invention, but they should not be construed as limiting the invention thereto. Mw is a weight average molecular weight as measured by gel permeation chromatography (GPC) versus polystyrene standards, and Mw/Mn designates molecular weight distribution or dispersity. All parts (pbw and ppm) are by weight.

Polymers to be added to resist compositions were prepared by combining suitable monomers, effecting copolymerization reaction thereof in tetrahydrofuran solvent, pouring the reaction solution into methanol for precipitation, repeatedly washing with hexane, isolation, and drying. For the resulting polymers, designated Polymers 1 to 11, their composition was analyzed by $^1$H-NMR, and their Mw and Mw/Mn by GPC.

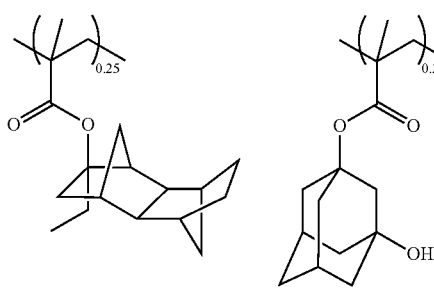

Polymer 1

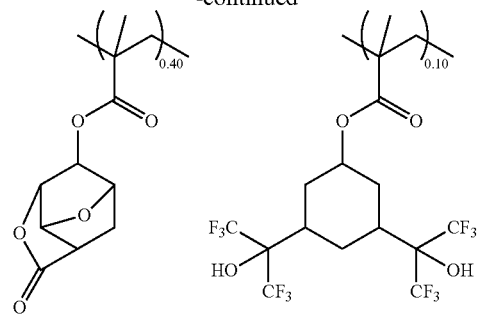

Mw: 8,500
Mw/Mn: 1.78

Polymer 2

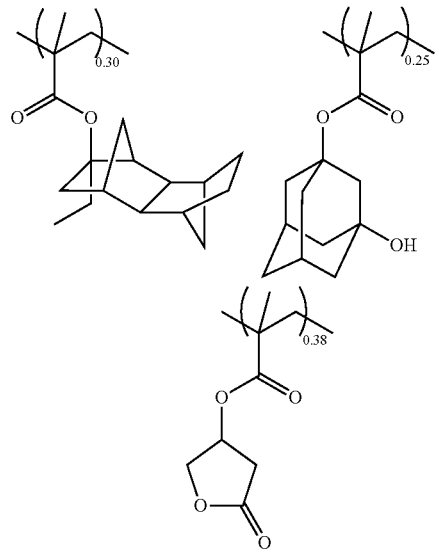

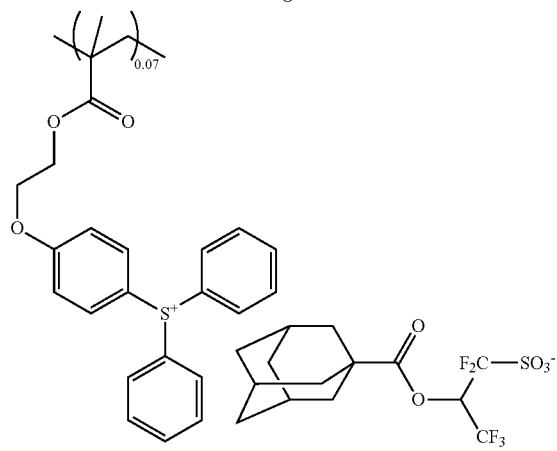

Mw: 8,700
Mw/Mn: 1.89

Polymer 3

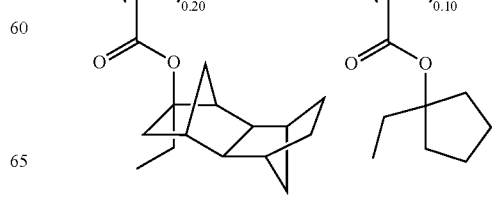

105
-continued
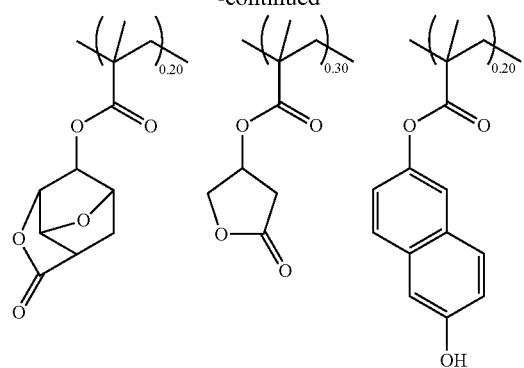
Mw: 7,600
Mw/Mn: 1.69
106
-continued
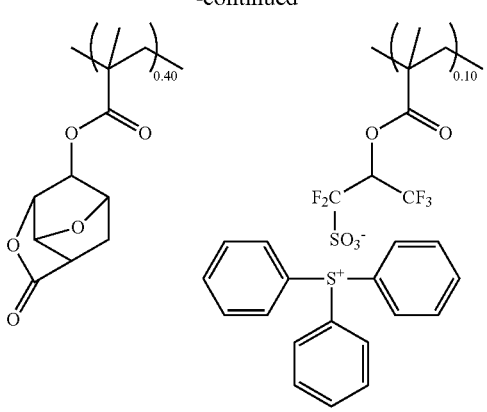
Mw: 7,600
Mw/Mn: 1.73
Polymer 4
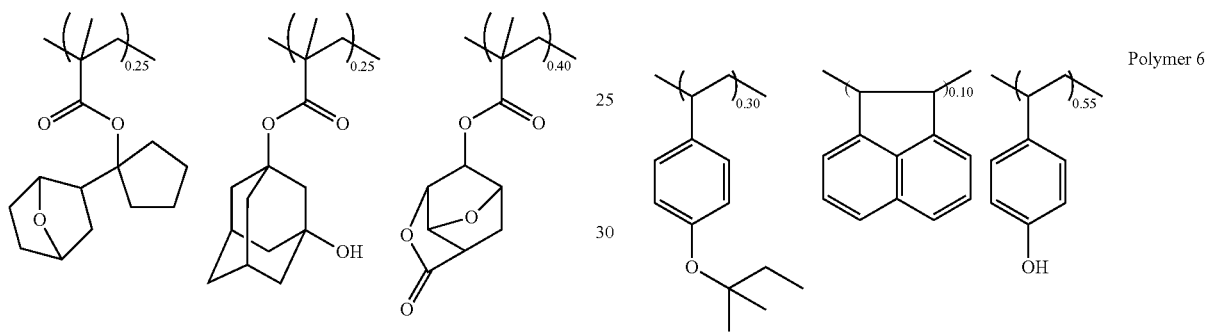
Polymer 6
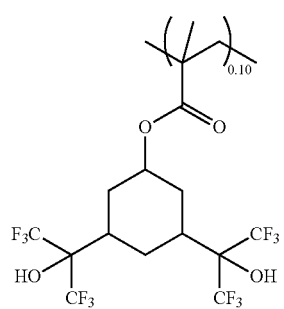
Mw: 8,900
Mw/Mn: 1.72
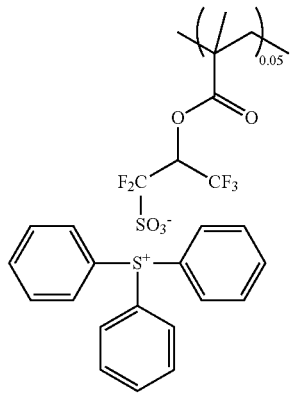
Mw: 5,500
Mw/Mn: 1.76
Polymer 5
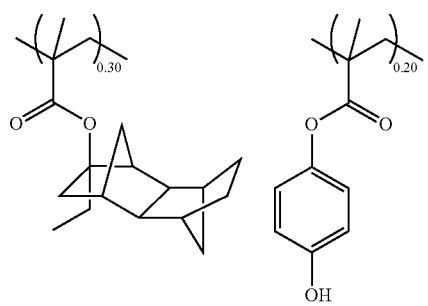
Polymer 7
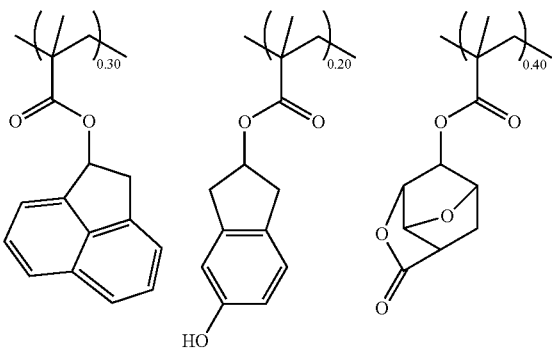

-continued
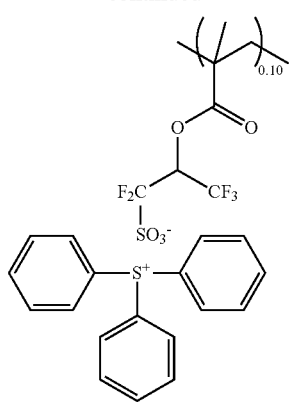
Mw: 7,300
Mw/Mn: 1.88
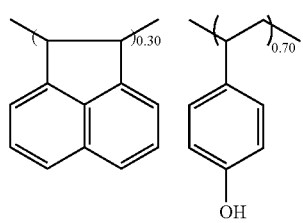
Mw: 4,500
Mw/Mn: 1.61
Polymer 9
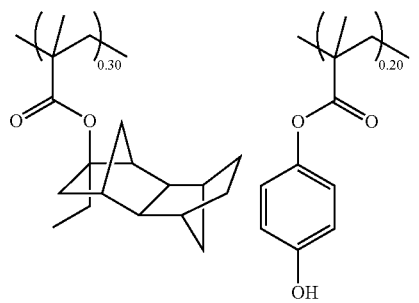
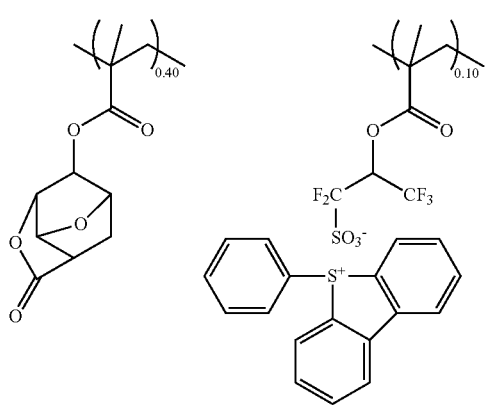
Mw: 7,500
Mw/Mn: 1.73
-continued
Polymer 10
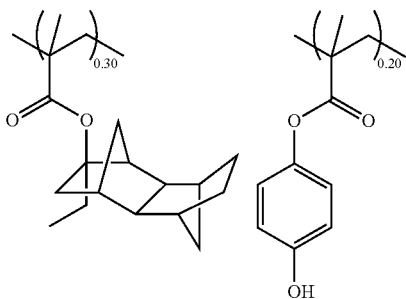
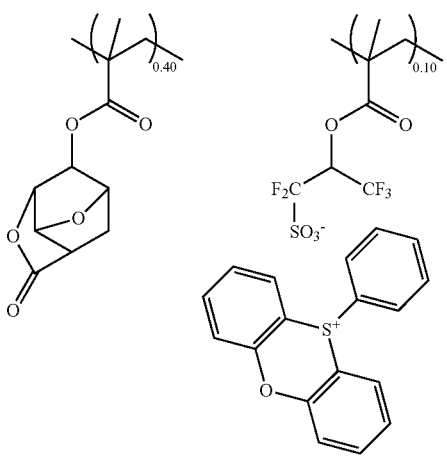
Mw: 7,100
Mw/Mn: 1.79
Polymer 11
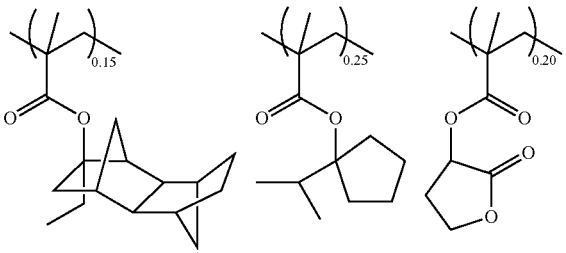
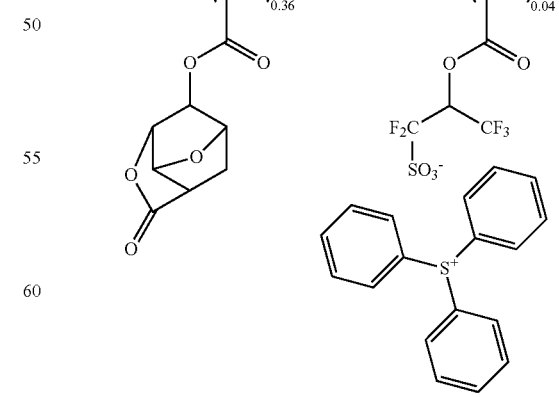
Mw: 7,800
Mw/Mn: 1.98

Examples and Comparative Examples

Positive or negative resist compositions were prepared by dissolving each of the polymers synthesized above and selected components in a solvent in accordance with the recipe shown in Tables 1 to 7, and filtering through a filter having a pore size of 0.2 μm. The solvent contained 100 ppm of a surfactant FC-4430 (3M).

The components in Tables 1 to 7 are as identified below.

| | |
|---|---|
| Polymers: | Polymers 1 to 11 as identified above |
| Organic solvents: | propylene glycol monoMethyl ether acetate (PGMEA) |
| | cyclohexanone (CyH) |
| | propylene glycol monomethyl ether (PGME) |
| | cyclopentanone (Cyp) |
| Acid generators: | PAG1 and PAG2 |

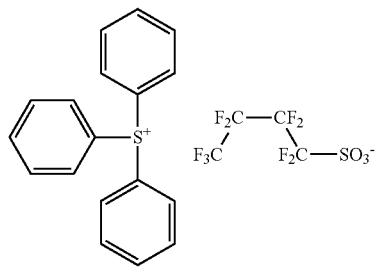

PAG 1

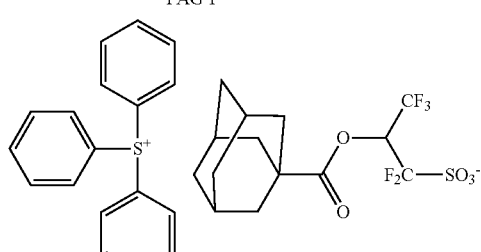

PAG 2

Basic compounds: Amines 1 to 42, Comparative Amines 1 to 4, and Sulfonium Salt Quencher

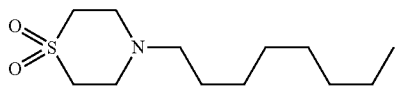

Amine 1

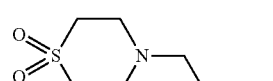

Amine 2

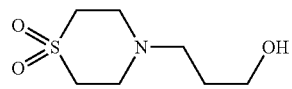

Amine 3

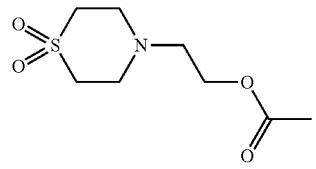

Amine 4

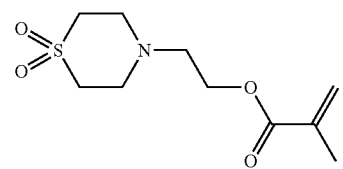

Amine 5

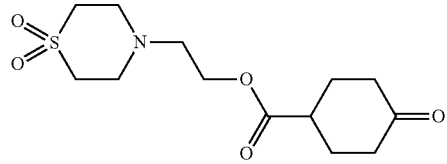

Amine 6

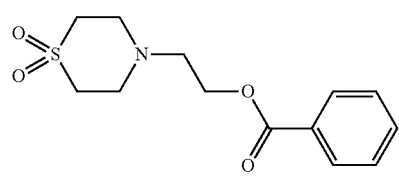

Amine 7

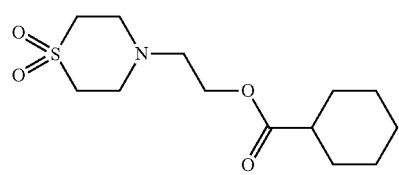

Amine 8

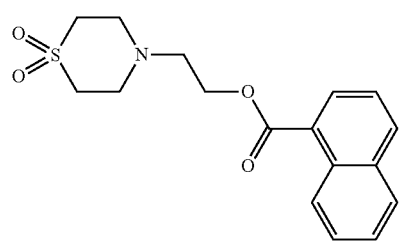

Amine 9

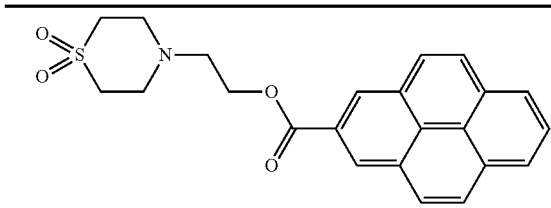
Amine 10
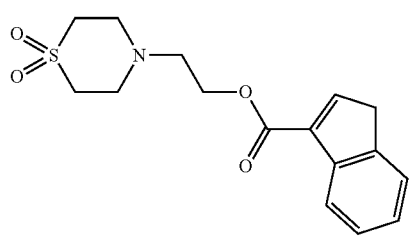
Amine 11
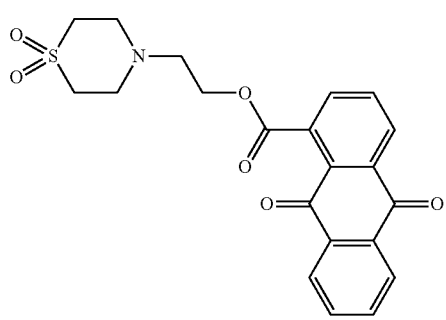
Amine 12
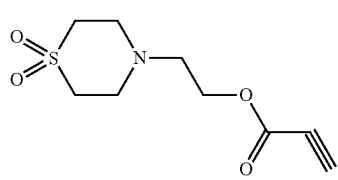
Amine 13
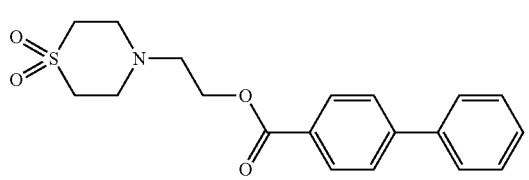
Amine 14
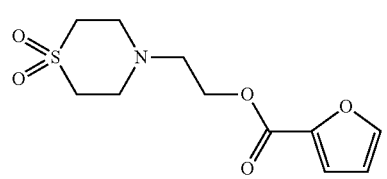
Amine 15
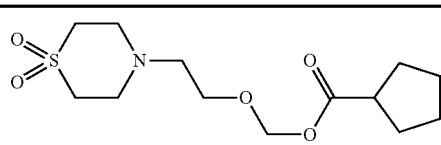
Amine 16
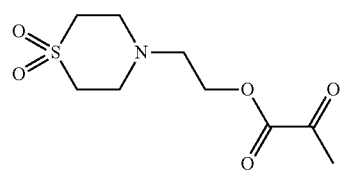
Amine 17
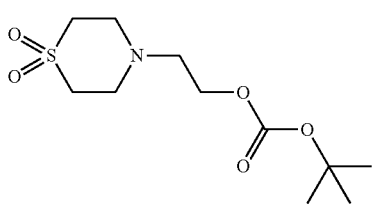
Amine 18
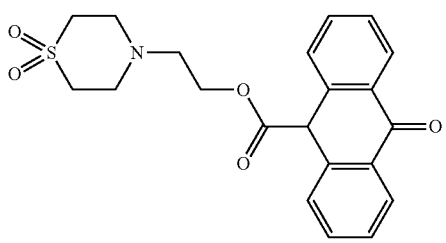
Amine 19
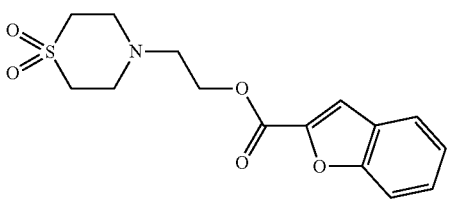
Amine 20
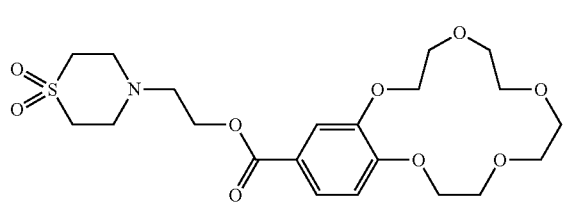
Amine 21

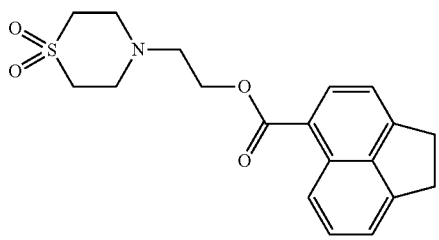
Amine 22
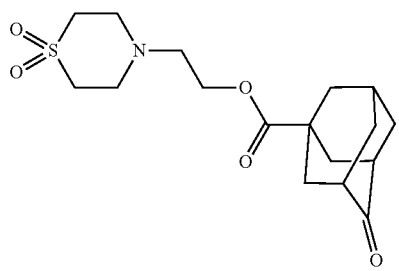
Amine 23
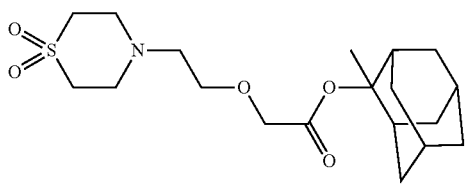
Amine 24
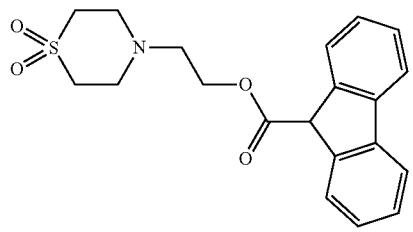
Amine 25
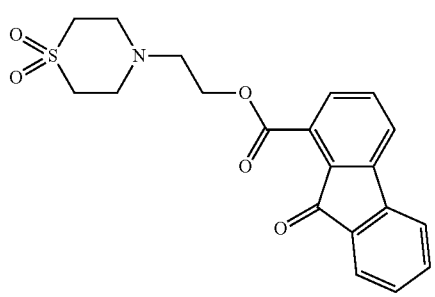
Amine 26
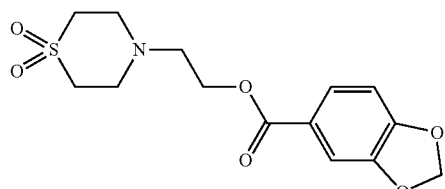
Amine 27
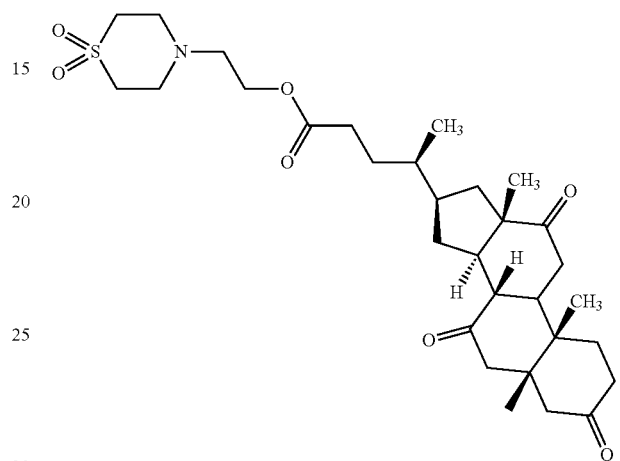
Amine 28
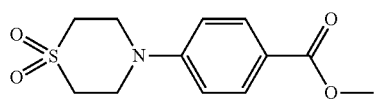
Amine 29
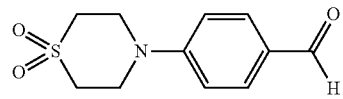
Amine 30
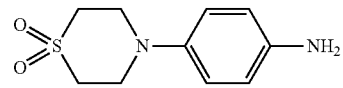
Amine 31
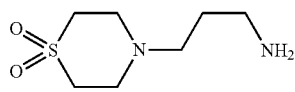
Amine 32
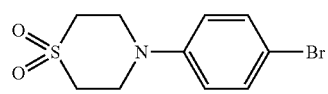
Amine 33

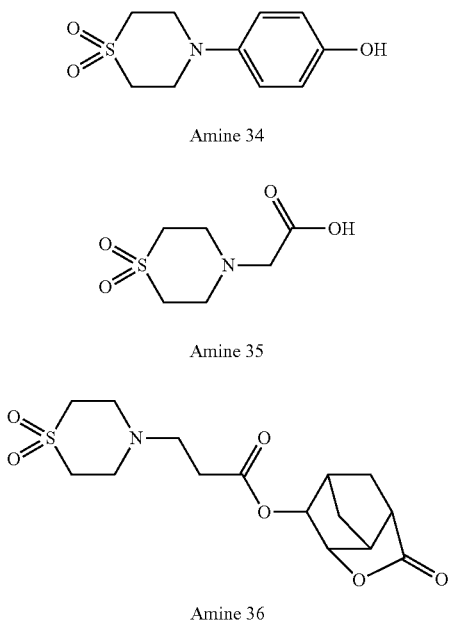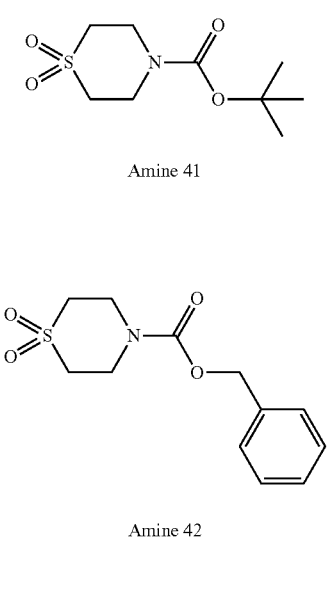

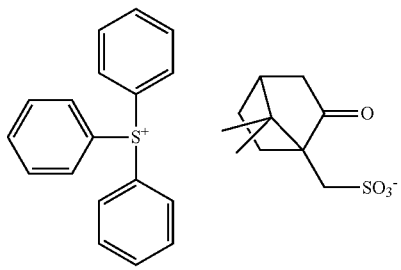

Sulfonium Salt Quencher

Water repellent polymer:

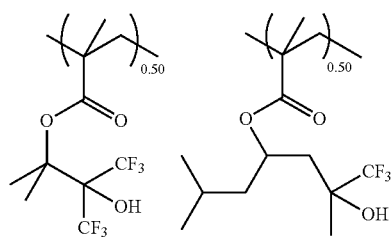

Water repellent polymer 1
Mw: 8,900
Mw/Mn: 1.96

Crosslinker:

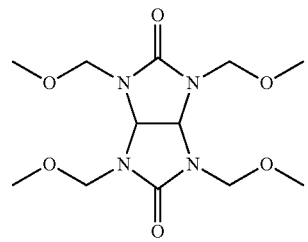

Crosslinker 1

ArF Dry Lithography Test

On a silicon wafer having a film of ARC-29A (Nissan Chemicals Industries, Ltd.) coated to a thickness of 80 nm, each of the resist compositions in Tables 1 to 3 was spin coated, then baked on a hot plate at 110° C. for 60 seconds to form a resist film of 160 nm thick. The resist film was exposed to a 80-nm line/160-nm pitch line-and-space pattern by means of an ArF excimer laser scanner model NSR-S307E (Nikon Corp., NA 0.85, σ 0.93/0.62, 35° cross-pole illumination, 6% halftone phase shift mask) while varying the exposure dose and focus. Thereafter, the resist film was baked (PEB) at 110° C. for 60 seconds and then developed for 30 seconds with a 2.38 wt % TMAH aqueous solution, obtaining a L/S pattern with a line size of 80 nm.

Sensitivity is the optimum exposure dose which produced a line size of 80 nm after development. A cross-sectional profile of the optimum dose pattern was observed, from which a focus margin (DOF) was determined. The criterion for evaluating DOF is that the optimum dose pattern experiences a film slimming of less than or equal to 10% and a size change of less than or equal to 20% when the focus is changed.

The results are shown in Tables 1 to 3.

TABLE 1

| | Polymer (pbw) | Acid generator (pbw) | Base (pbw) | Organic solvent (pbw) | Sensitivity (mJ/cm$^2$) | Pattern profile | DOF (μm) |
| --- | --- | --- | --- | --- | --- | --- | --- |
| Example 1-1 | Polymer 1 (100) | PAG1 (6.54) | Amine 1 (1.25) | PGMEA(1,200) CyH(300) | 28 | rectangular | 0.40 |
| Example 1-2 | Polymer 1 (100) | PAG1 (6.54) | Amine 2 (0.91) | PGMEA(1,200) CyH(300) | 33 | rectangular | 0.45 |
| Example 1-3 | Polymer 1 (100) | PAG1 (6.54) | Amine 3 (0.98) | PGMEA(1,200) CyH(300) | 33 | rectangular | 0.45 |
| Example 1-4 | Polymer 1 (100) | PAG1 (6.54) | Amine 4 (1.12) | PGMEA(1,200) CyH(300) | 32 | rectangular | 0.45 |
| Example 1-5 | Polymer 1 (100) | PAG1 (6.54) | Amine 5 (1.25) | PGMEA(1,200) CyH(300) | 35 | rectangular | 0.45 |
| Example 1-6 | Polymer 1 (100) | PAG1 (6.54) | Amine 6 (1.53) | PGMEA(1,200) CyH(300) | 36 | rectangular | 0.50 |
| Example 1-7 | Polymer 1 (100) | PAG1 (6.54) | Amine 7 (1.43) | PGMEA(1,200) CyH(300) | 28 | rectangular | 0.45 |
| Example 1-8 | Polymer 1 (100) | PAG1 (6.54) | Amine 8 (1.46) | PGMEA(1,200) CyH(300) | 32 | rectangular | 0.50 |
| Example 1-9 | Polymer 1 (100) | PAG1 (6.54) | Amine 9 (1.68) | PGMEA(1,200) CyH(300) | 36 | rectangular | 0.45 |
| Example 1-10 | Polymer 1 (100) | PAG1 (6.54) | Amine 10 (2.06) | PGMEA(1,200) CyH(300) | 37 | rectangular | 0.40 |
| Example 1-11 | Polymer 1 (100) | PAG1 (6.54) | Amine 11 (1.62) | PGMEA(1,200) CyH(300) | 30 | rectangular | 0.45 |
| Example 1-12 | Polymer 1 (100) | PAG1 (6.54) | Amine 12 (2.10) | PGMEA(1,200) CyH(300) | 34 | rectangular | 0.40 |
| Example 1-13 | Polymer 1 (100) | PAG1 (6.54) | Amine 13 (1.17) | PGMEA(1,200) CyH(300) | 30 | rectangular | 0.40 |
| Example 1-14 | Polymer 1 (100) | PAG1 (6.54) | Amine 14 (1.82) | PGMEA(1,200) CyH(300) | 28 | rectangular | 0.40 |

TABLE 1-continued

| | Polymer (pbw) | Acid generator (pbw) | Base (pbw) | Organic solvent (pbw) | Sensitivity (mJ/cm²) | Pattern profile | DOF (μm) |
|---|---|---|---|---|---|---|---|
| Example 1-15 | Polymer 1 (100) | PAG1 (6.54) | Amine 15 (1.38) | PGMEA(1,200) CyH(300) | 29 | rectangular | 0.45 |
| Example 1-16 | Polymer 1 (100) | PAG1 (6.54) | Amine 16 (1.54) | PGMEA(1,200) CyH(300) | 30 | rectangular | 0.45 |
| Example 1-17 | Polymer 1 (100) | PAG1 (6.54) | Amine 17 (1.26) | PGMEA(1,200) CyH(300) | 30 | rectangular | 0.45 |
| Example 1-18 | Polymer 1 (100) | PAG1 (6.54) | Amine 18 (1.41) | PGMEA(1,200) CyH(300) | 26 | rectangular | 0.45 |
| Example 1-19 | Polymer 1 (100) | PAG1 (6.54) | Amine 19 (2.02) | PGMEA(1,200) CyH(300) | 36 | rectangular | 0.40 |
| Example 1-20 | Polymer 1 (100) | PAG1 (6.54) | Amine 20 (1.63) | PGMEA(1,200) CyH(300) | 29 | rectangular | 0.45 |
| Example 1-21 | Polymer 1 (100) | PAG1 (6.54) | Amine 21 (2.39) | PGMEA(1,200) CyH(300) | 29 | rectangular | 0.50 |
| Example 1-22 | Polymer 1 (100) | PAG1 (6.54) | Amine 22 (1.82) | PGMEA(1,200) CyH(300) | 34 | rectangular | 0.40 |
| Example 1-23 | Polymer 1 (100) | PAG1 (6.54) | Amine 23 (1.80) | PGMEA(1,200) CyH(300) | 34 | rectangular | 0.40 |
| Example 1-24 | Polymer 1 (100) | PAG1 (6.54) | Amine 24 (1.95) | PGMEA(1,200) CyH(300) | 29 | rectangular | 0.45 |
| Example 1-25 | Polymer 1 (100) | PAG1 (6.54) | Amine 25 (1.88) | PGMEA(1,200) CyH(300) | 30 | rectangular | 0.40 |

TABLE 2

| | Polymer (pbw) | Acid generator (pbw) | Base (pbw) | Organic solvent (pbw) | Sensitivity (mJ/cm²) | Pattern profile | DOF (μm) |
|---|---|---|---|---|---|---|---|
| Example 1-26 | Polymer 1 (100) | PAG1 (6.54) | Amine 26 (1.95) | PGMEA(1,200) CyH(300) | 29 | rectangular | 0.40 |
| Example 1-27 | Polymer 1 (100) | PAG1 (6.54) | Amine 27 (1.65) | PGMEA(1,200) CyH(300) | 29 | rectangular | 0.40 |
| Example 1-28 | Polymer 1 (100) | PAG1 (6.54) | Amine 28 (2.92) | PGMEA(1,200) CyH(300) | 38 | rectangular | 0.40 |
| Example 1-29 | Polymer 1 (100) | PAG1 (6.54) | Amine 29 (1.36) | PGMEA(1,200) CyH(300) | 26 | rectangular | 0.40 |
| Example 1-30 | Polymer 1 (100) | PAG1 (6.54) | Amine 30 (1.21) | PGMEA(1,200) CyH(300) | 25 | rectangular | 0.40 |
| Example 1-31 | Polymer 1 (100) | PAG1 (6.54) | Amine 31 (1.14) | PGMEA(1,200) CyH(300) | 42 | rectangular | 0.40 |
| Example 1-32 | Polymer 1 (100) | PAG1 (6.54) | Amine 32 (0.97) | PGMEA(1,200) CyH(300) | 46 | rectangular | 0.45 |
| Example 1-33 | Polymer 1 (100) | PAG1 (6.54) | Amine 33 (1.46) | PGMEA(1,200) CyH(300) | 26 | rectangular | 0.40 |
| Example 1-34 | Polymer 1 (100) | PAG1 (6.54) | Amine 34 (1.15) | PGMEA(1,200) CyH(300) | 24 | rectangular | 0.40 |
| Example 1-35 | Polymer 1 (100) | PAG1 (6.54) | Amine 35 (0.98) | PGMEA(1,200) CyH(300) | 26 | rectangular | 0.40 |
| Example 1-36 | Polymer 1 (100) | PAG1 (6.54) | Amine 36 (1.74) | PGMEA(1,200) CyH(300) | 35 | rectangular | 0.45 |
| Example 1-37 | Polymer 1 (100) | PAG1 (6.54) | Amine 37 (1.75) | PGMEA(1,200) CyH(300) | 36 | rectangular | 0.45 |
| Example 1-38 | Polymer 1 (100) | PAG1 (6.54) | Amine 38 (1.47) | PGMEA(1,200) CyH(300) | 30 | rectangular | 0.45 |
| Example 1-39 | Polymer 1 (100) | PAG1 (6.54) | Amine 39 (1.81) | PGMEA(1,200) CyH(300) | 37 | rectangular | 0.45 |
| Example 1-40 | Polymer 1 (100) | PAG1 (6.54) | Amine 40 (1.81) | PGMEA(1,200) CyH(300) | 39 | rectangular | 0.45 |
| Example 1-41 | Polymer 4 (100) | PAG1 (6.54) | Amine 1 (1.81) | PGMEA(1,200) CyH(300) | 45 | rectangular | 0.35 |
| Example 1-42 | Polymer 1 (100) | PAG1 (6.54) | Amine 41 (1.81) | PGMEA(1,200) CyH(300) | 39 | rectangular | 0.40 |
| Example 1-43 | Polymer 1 (100) | PAG1 (6.54) | Amine 42 (1.81) | PGMEA(1,200) CyH(300) | 41 | rectangular | 0.40 |
| Example 1-44 | Polymer 1 (100) | PAG1 (2.54) | Amine 7 (0.51) Sulfonium Salt Quencher (3.0) | PGMEA(1,200) CyH(300) | 46 | rectangular | 0.45 |
| Example 1-45 | Polymer 11 (100) | — | Amine 7 (0.51) | PGMEA(1,200) CyH(300) | 53 | rectangular | 0.45 |

TABLE 2-continued

|  | Polymer (pbw) | Acid generator (pbw) | Base (pbw) | Organic solvent (pbw) | Sensitivity (mJ/cm$^2$) | Pattern profile | DOF (μm) |
|---|---|---|---|---|---|---|---|
|  |  |  | Sulfonium Salt Quencher (3.0) |  |  |  |  |

TABLE 3

|  | Polymer (pbw) | Acid generator (pbw) | Base (pbw) | Organic solvent (pbw) | Sensitivity (mJ/cm$^2$) | Pattern profile | DOF (μm) |
|---|---|---|---|---|---|---|---|
| Comparative Example 1-1 | Polymer 1 (100) | PAG1 (6.54) | Comparative Amine 1 (0.66) | PGMEA(1,200) CyH(300) | 20 | slimmed | 0 |
| Comparative Example 1-2 | Polymer 1 (100) | PAG1 (6.54) | Comparative Amine 2 (0.88) | PGMEA(1,200) CyH(300) | 22 | tapered | 0.20 |
| Comparative Example 1-3 | Polymer 1 (100) | PAG1 (6.54) | Comparative Amine 3 (1.23) | PGMEA(1,200) CyH(300) | 28 | tapered | 0.30 |
| Comparative Example 1-4 | Polymer 1 (100) | PAG1 (6.54) | Comparative Amine 4 (0.87) | PGMEA(1,200) CyH(300) | 20 | slimmed | 0 |
| Comparative Example 1-5 | Polymer 4 (100) | PAG1 (6.54) | Comparative Amine 3 (1.23) | PGMEA(1,200) CyH(300) | 33 | tapered | 0 |

ArF Immersion Lithography Test

On a substrate (silicon wafer) having an antireflective coating (ARC-29A, Nissan Chemical Industries, Ltd.) of 80 nm thick, each of the resist compositions in Table 4 was spin coated, then baked on a hot plate at 100° C. for 60 seconds to form a resist film of 90 nm thick. By immersion lithography using an ArF excimer laser scanner model NSR-S610C (Nikon Corp., NA 1.30, σ 0.98/0.78, 35° dipole illumination, 6% halftone phase shift mask), the resist film was exposed to a 40-nm line/80-nm pitch line-and-space pattern. Thereafter, the resist film was baked (PEB) at 100° C. for 60 seconds and then developed for 30 seconds with a 2.38 wt % TMAH aqueous solution, obtaining a L/S pattern with a line size of 40 nm. The LWR of the 40-nm L/S pattern was measured by a measuring SEM S-9380 (Hitachi Hitechnologies, Ltd.).

The results are shown in Table 4.

TABLE 4

|  | Polymer (pbw) | Acid generator (pbw) | Base (pbw) | Water repellent polymer (pbw) | Organic solvent pbw) | Sensitivity (mJ/cm$^2$) | LWR (nm) |
|---|---|---|---|---|---|---|---|
| Example 2-1 | Polymer 1 (100) | PAG2 (14.0) | Amine 1 (2.30) | Water Repellent Polymer 1 (5.0) | PGMEA(2,000) CyH(500) | 35 | 4.3 |
| Example 2-2 | Polymer 2 (100) | — | Amine 1 (2.30) | Water Repellent Polymer 1 (5.0) | PGMEA(2,000) CyH(500) | 42 | 3.8 |
| Example 2-3 | Polymer 3 (100) | PAG2 (14.0) | Amine 1 (2.30) | Water Repellent Polymer 1 (5.0) | PGMEA(2,000) CyH(500) | 30 | 4.4 |
| Example 2-4 | Polymer 2 (100) | — | Amine 8 (2.69) | Water Repellent Polymer 1 (5.0) | PGMEA(2,000) CyH(500) | 42 | 3.5 |
| Example 2-5 | Polymer 2 (100) | — | Amine 17 (2.32) | Water Repellent Polymer 1 (5.0) | PGMEA(2,000) CyH(500) | 42 | 3.4 |
| Example 2-6 | Polymer 2 (100) | — | Amine 23 (3.30) | Water Repellent Polymer 1 (5.0) | PGMEA(2,000) CyH(500) | 42 | 3.6 |
| Example 2-7 | Polymer 11 (100) | — | Amine 7 (0.51) | Water Repellent | PGMEA(2,000) CyH(500) | 52 | 2.9 |

TABLE 4-continued

| | Polymer (pbw) | Acid generator (pbw) | Base (pbw) | Water repellent polymer (pbw) | Organic solvent pbw) | Sensitivity (mJ/cm$^2$) | LWR (nm) |
|---|---|---|---|---|---|---|---|
| Comparative Example 2-1 | Polymer 1 (100) | PAG2 (14.0) | Sulfonium Salt Quencher (6.0) Comparative Amine 3 (1.23) | Polymer 1 (5.0) Water Repellent Polymer 1 (5.0) | PGMEA(1,200) CyH(300) | 30 | 6.3 |

EB Writing Test

Each of the resist compositions in Tables 5 to 7 was spin coated onto a silicon substrate and pre-baked on a hot plate at 110° C. for 60 seconds to form a resist film of 80 nm thick. Using a system HL-800D (Hitachi Ltd.) at a HV voltage of 50 keV, the resist film was exposed imagewise to EB in a vacuum chamber.

Immediately after the image writing, the film was post-exposure baked (PEB) on a hot plate at 95° C. for 60 seconds and developed in a 2.38 wt % TMAH aqueous solution for 30 seconds to form a pattern.

Resolution is a minimum size at the exposure dose (sensitivity) that provides a 1:1 resolution of a 120-nm line-and-space pattern. The 120-nm line-and-space pattern was measured for LWR under SEM. It is noted that Examples 3-1 to 3-34 and Comparative Example 3-1 are positive resist compositions, and Example 3-35 and Comparative Example 3-2 are negative resist compositions.

The results are shown in Tables 5 to 7.

TABLE 5

| | Polymer (pbw) | Acid generator/ crosslinker (pbw) | Base (pbw) | Organic solvent (pbw) | Sensitivity (μC/cm$^2$) | Resolution (nm) | LWR (nm) |
|---|---|---|---|---|---|---|---|
| Example 3-1 | Polymer 5 (100) | — | Amine 2 (0.91) | PGMEA(400) CyH(2,000) PGME(100) | 30 | 80 | 5.3 |
| Example 3-2 | Polymer 5 (100) | — | Amine 3 (0.98) | PGMEA(400) CyH(2,000) PGME(100) | 32 | 80 | 5.2 |
| Example 3-3 | Polymer 5 (100) | — | Amine 6 (1.53) | PGMEA(400) CyH(2,000) PGME(100) | 33 | 75 | 5.0 |
| Example 3-4 | Polymer 5 (100) | — | Amine 7 (1.43) | PGMEA(400) CyH(2,000) PGME(100) | 32 | 75 | 4.9 |
| Example 3-5 | Polymer 5 (100) | — | Amine 9 (1.68) | PGMEA(400) CyH(2,000) PGME(100) | 33 | 80 | 5.3 |
| Example 3-6 | Polymer 5 (100) | — | Amine 10 (2.06) | PGMEA(400) CyH(2,000) PGME(100) | 35 | 80 | 5.6 |
| Example 3-7 | Polymer 5 (100) | — | Amine 11 (1.62) | PGMEA(400) CyH(2,000) PGME(100) | 33 | 80 | 5.3 |
| Example 3-8 | Polymer 5 (100) | — | Amine 12 (2.10) | PGMEA(400) CyH(2,000) PGME(100) | 36 | 75 | 5.8 |
| Example 3-9 | Polymer 5 (100) | — | Amine 13 (1.17) | PGMEA(400) CyH(2,000) PGME(100) | 33 | 75 | 5.2 |
| Example 3-10 | Polymer 5 (100) | — | Amine 14 (1.82) | PGMEA(400) CyH(2,000) PGME(100) | 32 | 80 | 5.6 |
| Example 3-11 | Polymer 5 (100) | — | Amine 15 (1.38) | PGMEA(400) CyH(2,000) PGME(100) | 30 | 75 | 5.1 |
| Example 3-12 | Polymer 5 (100) | — | Amine 18 (1.41) | PGMEA(400) CyH(2,000) PGME(100) | 28 | 80 | 5.3 |
| Example 3-13 | Polymer 5 (100) | — | Amine 19 (2.02) | PGMEA(400) CyH(2,000) PGME(100) | 38 | 80 | 5.8 |
| Example 3-14 | Polymer 5 (100) | — | Amine 20 (1.63) | PGMEA(400) CyH(2,000) PGME(100) | 36 | 75 | 5.2 |

TABLE 5-continued

|  | Polymer (pbw) | Acid generator/ crosslinker (pbw) | Base (pbw) | Organic solvent (pbw) | Sensitivity ($\mu C/cm^2$) | Resolution (nm) | LWR (nm) |
|---|---|---|---|---|---|---|---|
| Example 3-15 | Polymer 5 (100) | — | Amine 21 (2.39) | PGMEA(400) CyH(2,000) PGME(100) | 39 | 75 | 5.0 |
| Example 3-16 | Polymer 5 (100) | — | Amine 22 (1.82) | PGMEA(400) CyH(2,000) PGME(100) | 32 | 75 | 5.7 |
| Example 3-17 | Polymer 5 (100) | — | Amine 23 (1.80) | PGMEA(400) CyH(2,000) PGME(100) | 33 | 75 | 5.3 |
| Example 3-18 | Polymer 5 (100) | — | Amine 24 (1.95) | PGMEA(400) CyH(2,000) PGME(100) | 29 | 80 | 5.6 |

TABLE 6

|  | Polymer (pbw) | Acid generator/ crosslinker (pbw) | Base (pbw) | Organic solvent (pbw) | Sensitivity ($\mu C/cm^2$) | Resolution (nm) | LWR (nm) |
|---|---|---|---|---|---|---|---|
| Example 3-19 | Polymer 5 (100) | — | Amine 25 (1.88) | PGMEA(400) CyH(2,000) PGME(100) | 34 | 80 | 5.7 |
| Example 3-20 | Polymer 5 (100) | — | Amine 26 (1.95) | PGMEA(400) CyH(2,000) PGME(100) | 36 | 75 | 5.8 |
| Example 3-21 | Polymer 5 (100) | — | Amine 27 (1.65) | PGMEA(400) CyH(2,000) PGME(100) | 35 | 75 | 5.3 |
| Example 3-22 | Polymer 5 (100) | — | Amine 29 (1.36) | PGMEA(400) CyH(2,000) PGME(100) | 33 | 75 | 4.8 |
| Example 3-23 | Polymer 5 (100) | — | Amine 30 (1.21) | PGMEA(400) CyH(2,000) PGME(100) | 32 | 75 | 4.7 |
| Example 3-24 | Polymer 5 (100) | — | Amine 34 (1.15) | PGMEA(400) CyH(2,000) PGME(100) | 26 | 75 | 4.9 |
| Example 3-25 | Polymer 5 (100) | — | Amine 36 (1.74) | PGMEA(400) CyH(2,000) PGME(100) | 33 | 75 | 5.2 |
| Example 3-26 | Polymer 5 (100) | — | Amine 37 (1.75) | PGMEA(400) CyH(2,000) PGME(100) | 34 | 75 | 5.3 |
| Example 3-27 | Polymer 5 (100) | — | Amine 38 (1.47) | PGMEA(400) CyH(2,000) PGME(100) | 33 | 75 | 5.1 |
| Example 3-28 | Polymer 5 (100) | — | Amine 39 (1.81) | PGMEA(400) CyH(2,000) PGME(100) | 35 | 75 | 5.4 |
| Example 3-29 | Polymer 5 (100) | — | Amine 40 (1.81) | PGMEA(400) CyH(2,000) PGME(100) | 38 | 75 | 5.0 |
| Example 3-30 | Polymer 6 (100) | — | Amine 7 (1.43) | PGMEA(2,000) CyH(500) | 34 | 80 | 5.5 |
| Example 3-31 | Polymer 6 (100) | — | Amine 34 (1.15) | PGMEA(2,000) CyH(500) | 33 | 80 | 5.6 |
| Example 3-32 | Polymer 7 (100) | — | Amine 34 (1.15) | PGMEA(2,000) CyH(500) | 42 | 75 | 5.1 |
| Example 3-33 | Polymer 9 (100) | — | Amine 34 (1.15) | PGMEA(500) CyH(1,700) CyP(300) | 39 | 75 | 4.3 |
| Example 3-34 | Polymer 10 (100) | — | Amine 34 (1.15) | PGMEA(500) CyH(1,700) CyP(300) | 41 | 75 | 4.6 |
| Example 3-35 | Polymer 8 (100) | PAG1 (6.5) crosslinker 1 (8.1) | Amine 34 (1.15) | PGMEA(2,000) CyH(500) | 24 | 85 | 6.9 |

TABLE 7

| | Polymer (pbw) | Acid generator/ crosslinker (pbw) | Base (pbw) | Organic solvent (pbw) | Sensitivity ($\mu C/cm^2$) | Resolution (nm) | LWR (nm) |
|---|---|---|---|---|---|---|---|
| Comparative Example 3-1 | Polymer 5 (100) | — | Comparative Amine 3 (1.23) | PGMEA(400) CyH(2,000) PGME(100) | 26 | 100 | 7.3 |
| Comparative Example 3-2 | Polymer 8 (100) | PAG1 (6.5) crosslinker 1 (8.1) | Comparative Amine 3 (1.23) | PGMEA(2,000) CyH(500) | 22 | 110 | 8.9 |

It is demonstrated in Tables 1 to 7 that resist compositions comprising a specific amine compound form patterns of satisfactory profile having an improved resolution, roughness, and focus margin (DOF).

Japanese Patent Application No. 2009-274162 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified resist composition comprising a base polymer, an acid generator, an organic solvent, and a basic compound of the general formula (I):

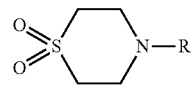

(1)

wherein R is hydrogen or a straight, branched or cyclic $C_1$-$C_{30}$ alkyl, $C_6$-$C_{30}$ aryl, $C_2$-$C_{30}$ alkenyl or $C_2$-$C_{10}$ alkylnyl group, which may have a hydroxyl, carboxyl, ether, thioether, ester, sulfonic acid ester, lactone, carbonyl, amino, cyano, nitro or halogen radical, or R is $C_1$-$C_8$ alkoxycarbonyl group, and wherein the composition is positive.

2. The resist composition of claim 1, further comprising a dissolution inhibitor.

3. The resist composition of claim 1, further comprising a surfactant.

4. A process for forming a pattern comprising the steps of applying the resist composition of claim 1 onto a substrate to form a resist coating, baking the coating, exposing the coating to high-energy radiation, and developing the exposed coating with a developer.

5. The process of claim 4 wherein the high-energy radiation is ArF excimer laser radiation of 193 nm wavelength or KrF excimer laser radiation of 248 nm wavelength.

6. The process of claim 4 wherein the high-energy radiation is electron beam or extreme ultraviolet radiation of 3 to 15 nm wavelength.

* * * * *